(12) United States Patent
Tran et al.

(10) Patent No.: US 11,409,352 B2
(45) Date of Patent: Aug. 9, 2022

(54) POWER MANAGEMENT FOR AN ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Vipin Tiwari, Dublin, CA (US); Mark Reiten, Alamo, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 252 days.

(21) Appl. No.: 16/354,040

(22) Filed: Mar. 14, 2019

(65) Prior Publication Data

US 2020/0233482 A1   Jul. 23, 2020

Related U.S. Application Data

(60) Provisional application No. 62/814,813, filed on Mar. 6, 2019, provisional application No. 62/794,492, filed on Jan. 18, 2019.

(51) Int. Cl.
| | |
|---|---|
| *G06F 1/26* | (2006.01) |
| *G06F 1/32* | (2019.01) |
| *G06F 1/3234* | (2019.01) |
| *G11C 16/04* | (2006.01) |
| *G06N 3/08* | (2006.01) |
| *G06F 17/16* | (2006.01) |

(Continued)

(52) U.S. Cl.
CPC .......... *G06F 1/3234* (2013.01); *G06F 17/16* (2013.01); *G06N 3/04* (2013.01); *G06N 3/08* (2013.01); *G11C 11/54* (2013.01); *G11C 16/0425* (2013.01); *G11C 16/0466* (2013.01)

(58) Field of Classification Search
CPC ...... G06F 1/3234; G06F 17/16; G06F 1/3203; G06N 3/04; G06N 3/08; G06N 3/0635; G11C 16/0466; G11C 16/0425; G11C 11/54
See application file for complete search history.

(56) References Cited

U.S. PATENT DOCUMENTS

| | | | |
|---|---|---|---|
| 4,810,910 | A | 3/1989 | Schoellikopf |
| 4,904,881 | A | 2/1990 | Castro |

(Continued)

FOREIGN PATENT DOCUMENTS

| | | |
|---|---|---|
| CN | 102567784 | 7/2012 |
| CN | 102906767 | 1/2013 |

(Continued)

OTHER PUBLICATIONS

U.S. Appl. No. 16/382,034 entitled "Neural Network Classifier Using Array Of Four-Gate Non-volatile Memory Cells," Tran, et al, filed Apr. 11, 2019.

(Continued)

*Primary Examiner* — Xuxing Chen
(74) *Attorney, Agent, or Firm* — DLA Piper LLP US

(57) ABSTRACT

Numerous embodiments of power management techniques are disclosed for various operations involving one or more vector-by-matrix multiplication (VMM) arrays within an artificial neural network.

13 Claims, 61 Drawing Sheets

(51) Int. Cl.
  *G11C 11/54* (2006.01)
  *G06N 3/04* (2006.01)

(56) References Cited

U.S. PATENT DOCUMENTS

| | | |
|---|---|---|
| 4,950,917 A | 8/1990 | Holler |
| 4,961,002 A | 10/1990 | Tam |
| 5,028,810 A | 7/1991 | Castro |
| 5,029,130 A | 7/1991 | Yeh |
| 5,055,897 A | 10/1991 | Canepa |
| 5,097,441 A | 3/1992 | Cho |
| 5,138,576 A | 8/1992 | Madurawe |
| 5,146,602 A | 9/1992 | Holler |
| 5,150,450 A | 9/1992 | Swenson |
| 5,242,848 A | 9/1993 | Yeh |
| 5,256,911 A | 10/1993 | Holler |
| 5,264,734 A | 11/1993 | Holler |
| 5,298,796 A | 3/1994 | Tawel |
| 5,336,936 A | 8/1994 | Allen et al. |
| 5,386,132 A | 1/1995 | Wong |
| 5,469,397 A | 11/1995 | Hoshino |
| 5,509,106 A | 4/1996 | Pechanek |
| 5,554,874 A | 9/1996 | Doluca |
| 5,621,336 A | 4/1997 | Shibata et al. |
| 5,643,814 A | 7/1997 | Chung |
| 5,721,702 A | 2/1998 | Briner |
| 5,748,534 A | 5/1998 | Dunlap |
| 5,914,894 A | 6/1999 | Diorio |
| 5,966,332 A | 10/1999 | Takano |
| 5,990,512 A | 11/1999 | Diorio |
| 6,222,777 B1 | 4/2001 | Khieu |
| 6,232,180 B1* | 5/2001 | Chen .............. H01L 27/115 438/257 |
| 6,282,119 B1 | 8/2001 | Tsen |
| 6,389,404 B1 | 5/2002 | Carson |
| 6,683,645 B1 | 1/2004 | Collins |
| 6,747,310 B2 | 6/2004 | Fan et al. |
| 6,829,598 B2 | 12/2004 | Milev |
| 7,315,056 B2 | 1/2008 | Klinger et al. |
| 7,868,375 B2 | 1/2011 | Liu et al. |
| 10,217,512 B1 | 2/2019 | Leobandung |
| 10,269,440 B2 | 4/2019 | Guo |
| 10,741,611 B1 | 8/2020 | Leobandung |
| 2002/0089014 A1 | 7/2002 | Chern |
| 2003/0034510 A1 | 2/2003 | Liu |
| 2003/0052360 A1 | 3/2003 | Guterman |
| 2003/0183871 A1 | 10/2003 | Dugger et al. |
| 2004/0095809 A1 | 5/2004 | Sakamoto |
| 2004/0125655 A1 | 7/2004 | Tsai |
| 2004/0156241 A1 | 7/2004 | Tsai |
| 2004/0150032 A1 | 8/2004 | Wu |
| 2004/0155234 A1 | 8/2004 | Ishimaru |
| 2004/0251949 A1 | 12/2004 | Shi |
| 2005/0087892 A1 | 4/2005 | Hsu |
| 2005/0122238 A1 | 6/2005 | Nomura |
| 2006/0104120 A1 | 5/2006 | Hemink |
| 2006/0170038 A1 | 8/2006 | Wong |
| 2007/0171756 A1 | 7/2007 | Lambrache |
| 2008/0304345 A1* | 12/2008 | Kwean .............. G11C 29/1201 365/201 |
| 2009/0103361 A1 | 4/2009 | Wang |
| 2009/0109760 A1 | 4/2009 | Nazarian |
| 2009/0154246 A1 | 6/2009 | Liu |
| 2009/0192958 A1 | 7/2009 | Todorokihara |
| 2010/0046299 A1 | 2/2010 | Roohparvar |
| 2010/0290292 A1 | 11/2010 | Tanizaki |
| 2011/0161625 A1 | 6/2011 | Pechanek |
| 2011/0235419 A1 | 9/2011 | Ishimaru |
| 2012/0068872 A1 | 3/2012 | Baker |
| 2012/0087188 A1 | 4/2012 | Hsieh et al. |
| 2012/0136913 A1 | 5/2012 | Duong |
| 2013/0044544 A1 | 2/2013 | Shiino |
| 2013/0100756 A1 | 4/2013 | Liao et al. |
| 2014/0054667 A1 | 2/2014 | Tkachev |
| 2014/0140132 A1 | 5/2014 | Gu |
| 2014/0269062 A1 | 9/2014 | Do |
| 2014/0310220 A1 | 10/2014 | Chang |
| 2015/0106315 A1 | 4/2015 | Birdwell |
| 2015/0138183 A1 | 5/2015 | Kishi |
| 2015/0178619 A1 | 6/2015 | Nishitani |
| 2015/0199963 A1 | 7/2015 | Maaninen |
| 2015/0213898 A1 | 7/2015 | Do |
| 2015/0262055 A1 | 9/2015 | Akopyan |
| 2015/0324691 A1 | 11/2015 | Dropps |
| 2016/0042790 A1 | 2/2016 | Tran |
| 2016/0048755 A1 | 2/2016 | Freyman |
| 2016/0093382 A1 | 3/2016 | Sakamoto |
| 2016/0133639 A1 | 5/2016 | Tran |
| 2016/0180945 A1 | 6/2016 | Ng |
| 2016/0254269 A1 | 9/2016 | Kim et al. |
| 2017/0330070 A1* | 11/2017 | Sengupta .............. G06F 7/48 |
| 2017/0337466 A1 | 11/2017 | Bayat et al. |
| 2017/0337971 A1 | 11/2017 | Tran et al. |
| 2017/0337980 A1 | 11/2017 | Guo et al. |
| 2018/0004708 A1 | 1/2018 | Muralimanohar |
| 2018/0095930 A1 | 4/2018 | Lu |
| 2018/0165573 A1* | 6/2018 | Hsu .................. G06N 3/0454 |
| 2018/0174034 A1 | 6/2018 | Obradovic |
| 2018/0268912 A1 | 9/2018 | Guo et al. |
| 2018/0293487 A1 | 10/2018 | Copel et al. |
| 2019/0019538 A1 | 1/2019 | Li |
| 2019/0019564 A1 | 1/2019 | Li |
| 2019/0042199 A1 | 2/2019 | Sumbul |
| 2019/0088325 A1 | 3/2019 | Tiwari et al. |
| 2019/0088329 A1 | 3/2019 | Tiwari |
| 2019/0095779 A1 | 3/2019 | Leobandung |
| 2019/0205729 A1 | 7/2019 | Tran |
| 2019/0213234 A1 | 7/2019 | Bayat |
| 2019/0237136 A1 | 8/2019 | Tran et al. |
| 2019/0278675 A1* | 9/2019 | Bolkhovitin ........ G06F 11/2094 |
| 2019/0294416 A1* | 9/2019 | Hu .................. G06F 7/5443 |
| 2020/0020393 A1 | 1/2020 | Al-Shamma |
| 2020/0201751 A1* | 6/2020 | Wei .................. G11C 7/1006 |
| 2021/0232893 A1 | 7/2021 | Bayat |

FOREIGN PATENT DOCUMENTS

| | | |
|---|---|---|
| CN | 104615909 | 5/2015 |
| EP | 0566739 A1 | 10/1993 |
| EP | 0562737 | 6/1998 |
| JP | 63-261784 | 10/1988 |
| JP | H03-018985 A | 1/1991 |
| TW | 2004 14549 | 8/2004 |
| TW | I 625843 | 6/2018 |
| TW | 2018 37759 A | 10/2018 |
| TW | 2019 01285 A | 1/2019 |
| WO | 2017 131653 A1 | 8/2017 |

OTHER PUBLICATIONS

U.S. Appl. No. 16/382,045 entitled "Neural Network Classifier Using Array Of Three-Gate Non-volatile Memory Cells," Tran, et al, filed Apr. 11, 2019.

U.S. Appl. No. 16/382,051 entitled "Neural Network Classifier Using Array Of Stacked Gate Non-volatile Memory Cells," Tran, et al, filed Apr. 11, 2019.

U.S. Appl. No. 16/382,060 entitled "Memory Device And Method For Varying Program State Separation Based Upon Frequency Of Use," Tran, et al, filed Apr. 11, 2019.

U.S. Appl. No. 15/826,345 entitled "High Precision And Highly Efficient Tuning Mechanisms . . . Network," Tran, et al., filed Nov. 29, 2017.

U.S. Appl. No. 16/271,673 entitled "Flash Memory Array With Individual Memory Cell Read, Program And Erase," Guo et al., filed Feb. 8, 2019.

U.S. Appl. No. 15/991,890 entitled "Decoders For Analog Neural Memory In Deep Learning Artificial Neural Network," Tran, et al., filed May 29, 2018.

U.S. Appl. No. 16/353,830 entitled "System For Converting Neuron Current Into Neuron Current-Based Time Pulses . . . Network," Tran et al., filed Mar. 14, 2019.

(56) References Cited

OTHER PUBLICATIONS

U.S. Appl. No. 16/503,355, filed Jul. 3, 2019, Tran et al.
U.S. Appl. No. 16/746,852, filed Jan. 18, 2020, Bayat et al.
Shafiee et al,"Isaac: A Convolutional Neural Network Accelerator With In-Situ Analog Arithmetic in Crossbars;" 2016 ACM/IEEE 43rd Annual International Symposium on Computer Architecture, Seoul, Oct. 2016. [URL:https://www.cs.utah.edu/-rajeev/pubs/isca16.pdf; pp. 1-4.].
Guo, et al., "Temperature-insensitive Analog Vector-by-Matrix Multiplier Based on 55 nm NOR Flash Memory Cells," IEEE Custom Integrated Circuits Conference, Apr. 30, 2017, pp. 1-14.
Lin, et al., "A Novel Voltage-Accumulation Vector-Matrix Multiplication Architecture Using Resistor-shunted Floating Gate Flash Memory Device for Low-power and High-density Neural Network Applications," IEEE International Electron Devices Meeting, Dec. 1, 2018, pp. 2.4.1-2.4.4.
Bavandpour, et al., "Energy-Efficient Time-Domain Vector-by-Matrix Multiplier for Neurocomputing and Beyond," retrieved from the Internet: url:https://arxiv.org/pdf/1711.10673.pdf, pp. 1-6.
Mehrotra, "Elements of Artificial Neural Networks," MIT Press, 1997.
U.S. Appl. No. 15/826,345, filed Nov. 29, 2017 entitled "High Precision And Highly Efficient Tuning Mechanisms . . . Networks," Tran, et al.; Applicant: Silicon Storage Technology, Inc.
U.S. Appl. No. 16/353,409, titled "Apparatus and Method for Combining Analog Neural Net With FPGA Routing in a Monolithic Integrated Circuit," filed Mar. 14, 2019.
U.S. Appl. No. 62/797,158, titled "Apparatus and Method for Combining Analog Neural Net With FPGA Routing in a Monolithic Integrated Circuit," filed Jan. 25, 2019.
"Realization of the CMOS Pulsewidth-Modulation (PWM) Neural Network with On-Chip Learning," Jenn-Chyou Bor, et al, IEEE Transactions on Circuits and Systems, Jan. 1998.
"Integrated Pulse Stream Neural Networks: Results, Issues, and Pointers," Alister Hamilton, et al., IEEE Transactions on Neural Networks, May 1992.
Chinese Office Action dated Oct. 9, 2021 corresponding to Chinese Patent Application No. 201780030390.9.
Bayat, "Memory Technologies for Neural Networks," IEEE, 2015.
European Examiner's Report dated Nov. 25, 2021 for the related European Patent Application No. 17 799 921.6.

\* cited by examiner

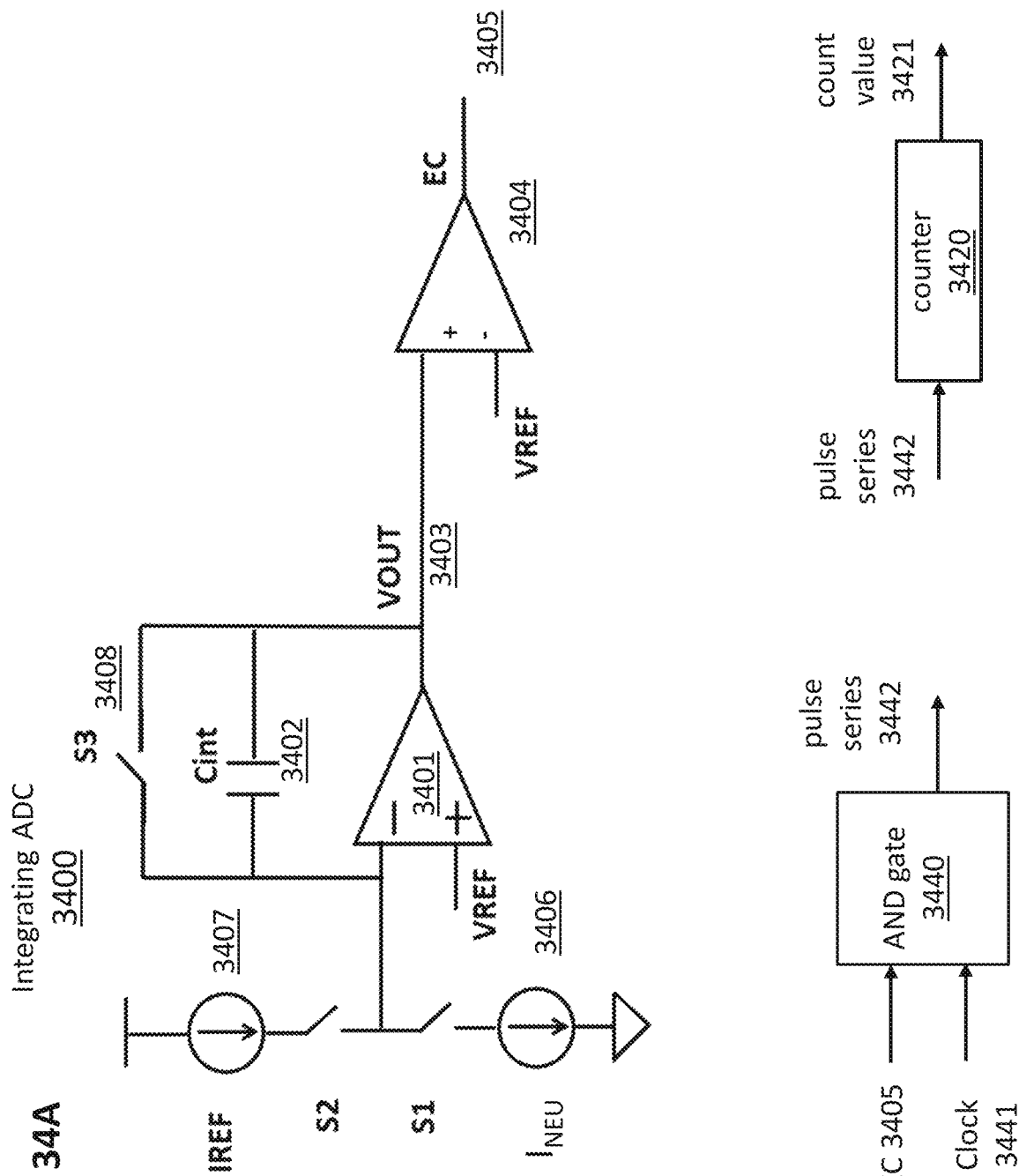

3600

3650

Digital-to-pulse row converter
5500

5520

POWER MANAGEMENT FOR AN ANALOG NEURAL MEMORY IN A DEEP LEARNING ARTIFICIAL NEURAL NETWORK

PRIORITY CLAIM

This application claims priority from U.S. Provisional Application No. 62/814,813 filed on Mar. 6, 2019, and titled "System for Converting Neuron Current Into Neuron Current-Based Time Pulses in an Analog Neural Memory in a Deep Learning Artificial Neural Network," and from U.S. Provisional Application No. 62/794,492 filed on Jan. 18, 2019, and titled "System for Converting Neuron Current Into Neuron Current-Based Time Pulses in an Analog Neural Memory in a Deep Learning Artificial Neural Network," both of which are incorporated by reference herein.

FIELD OF THE INVENTION

Numerous embodiments of power management techniques are disclosed for various operations involving one or more vector-by-matrix multiplication (VMM) arrays within an artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses required.

Applicant previously disclosed an artificial (analog) neural network that utilizes one or more non-volatile memory arrays as the synapses in U.S. patent application Ser. No. 15/594,439, published as US Patent Publication No. 2017/0337466, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge in systems utilizing VMM arrays is minimizing the amount of power that is consumed, which can be substantial, during the many programming, erasing, and reading operations that occur.

What is needed is are improved power management techniques for systems containing one or more VMM arrays.

SUMMARY OF THE INVENTION

Numerous embodiments of power management techniques are disclosed for various operations involving one or more vector-by-matrix multiplication (VMM) arrays within an artificial neural network.

BRIEF DESCRIPTION OF THE DRAWINGS

FIG. 34A depicts an integrating analog-to-digital converter.

DETAILED DESCRIPTION OF THE INVENTION

The artificial neural networks of the present invention utilize a combination of CMOS technology and non-volatile memory arrays.

Non-Volatile Memory Cells

Figure 1:
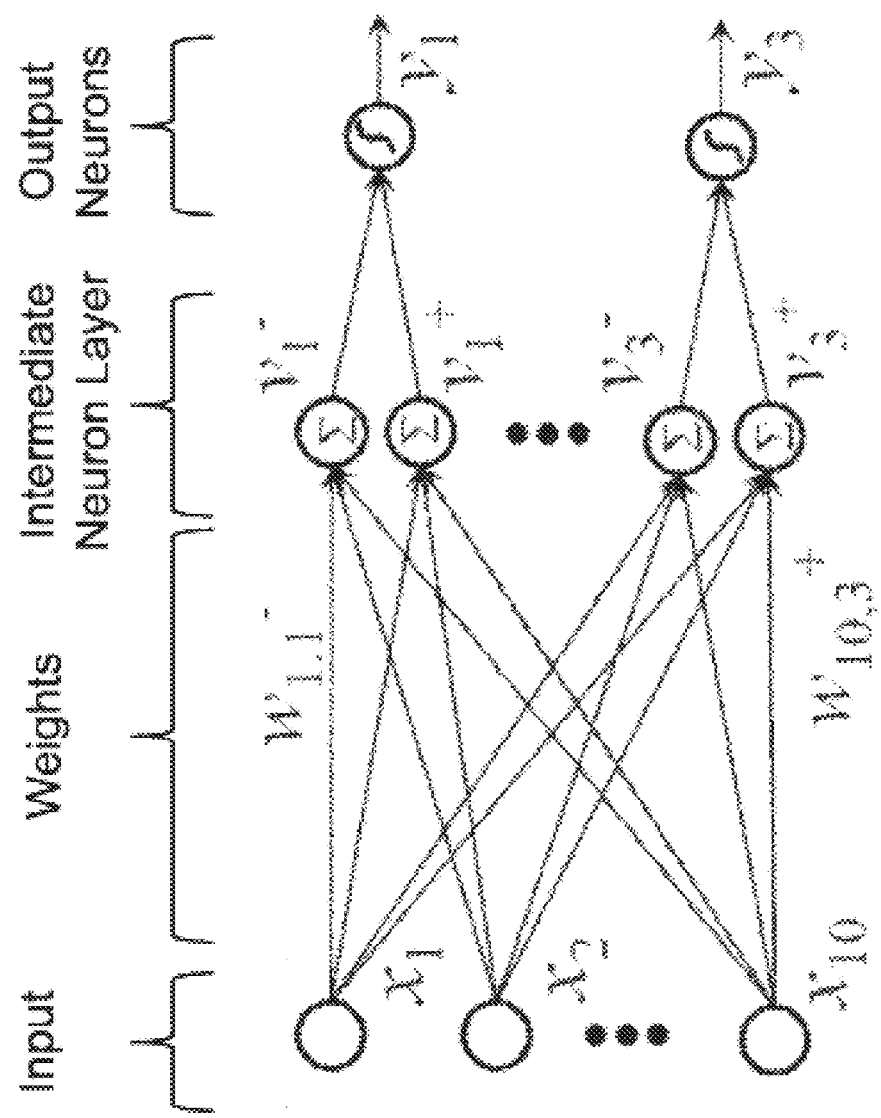
FIG. 1 is a diagram that illustrates a prior art artificial neural network.
Figure 2:
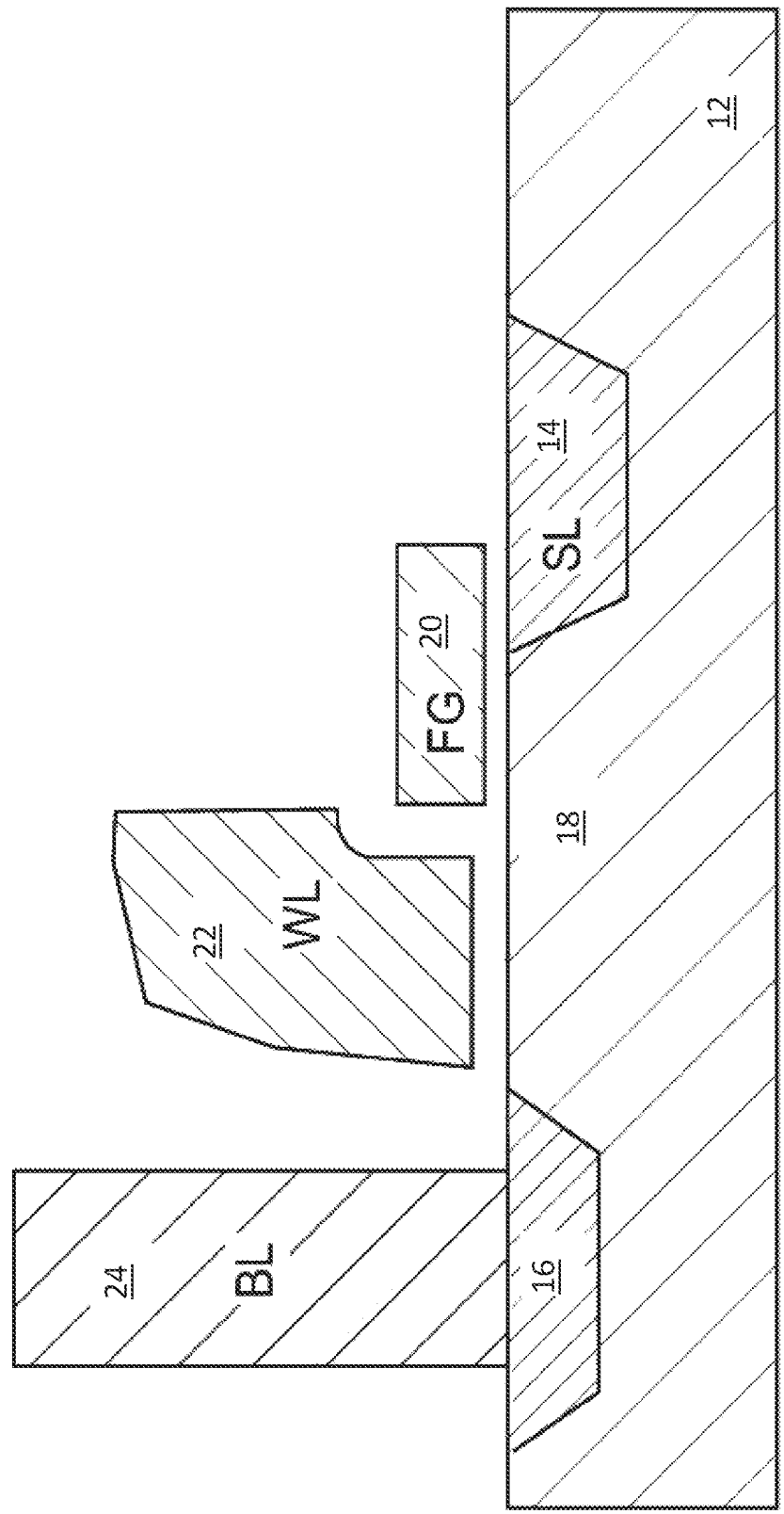
FIG. 2 depicts a prior art split gate flash memory cell

Digital non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state. Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 µA | 9-10 V |

Figure 3:
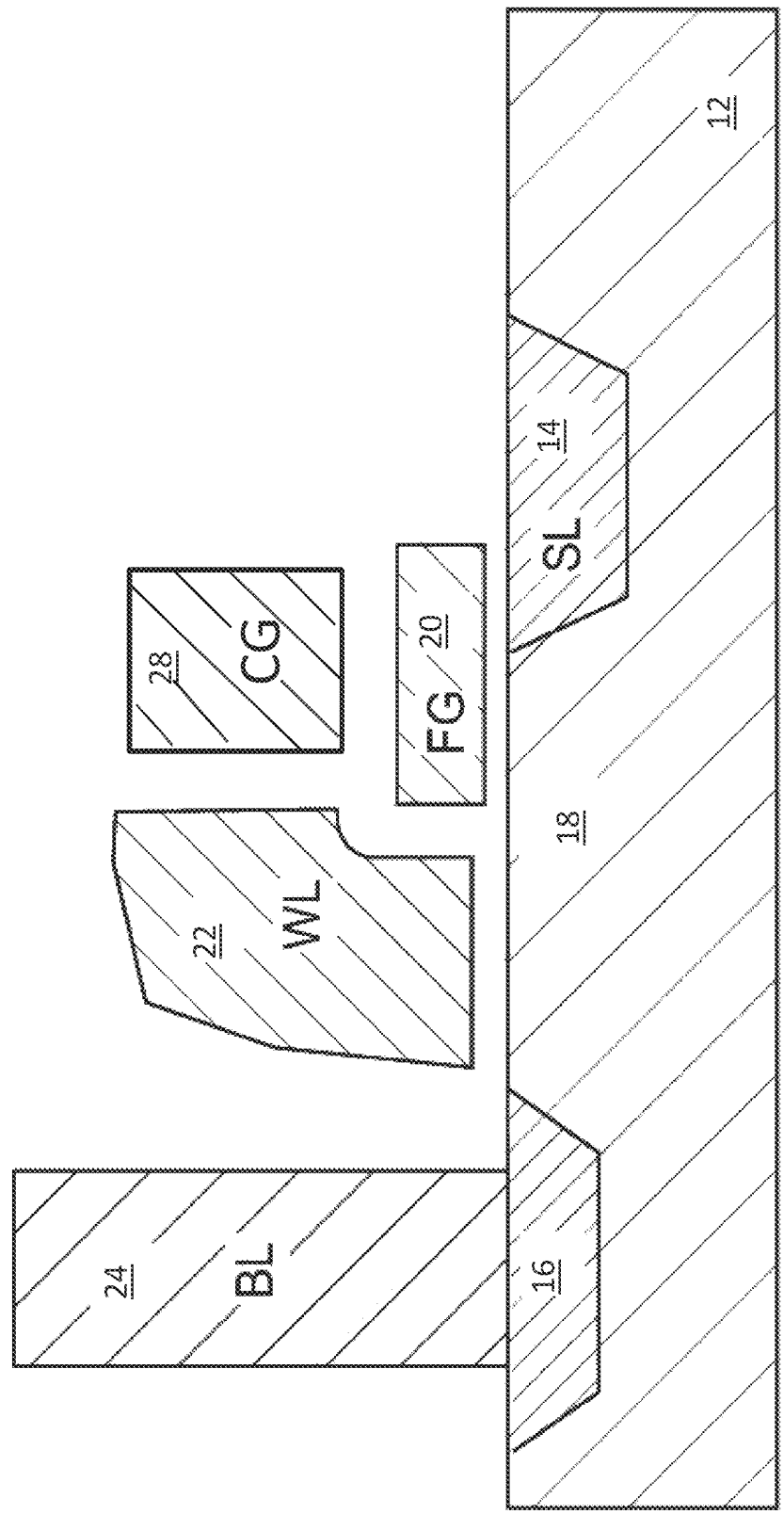
FIG. 3 depicts another prior art split gate flash memory cell

FIG. 3 shows memory cell 310, which is similar to memory cell 210 of FIG. 2 with the addition of control gate (CG) 28. Control gate 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

Figure 4:
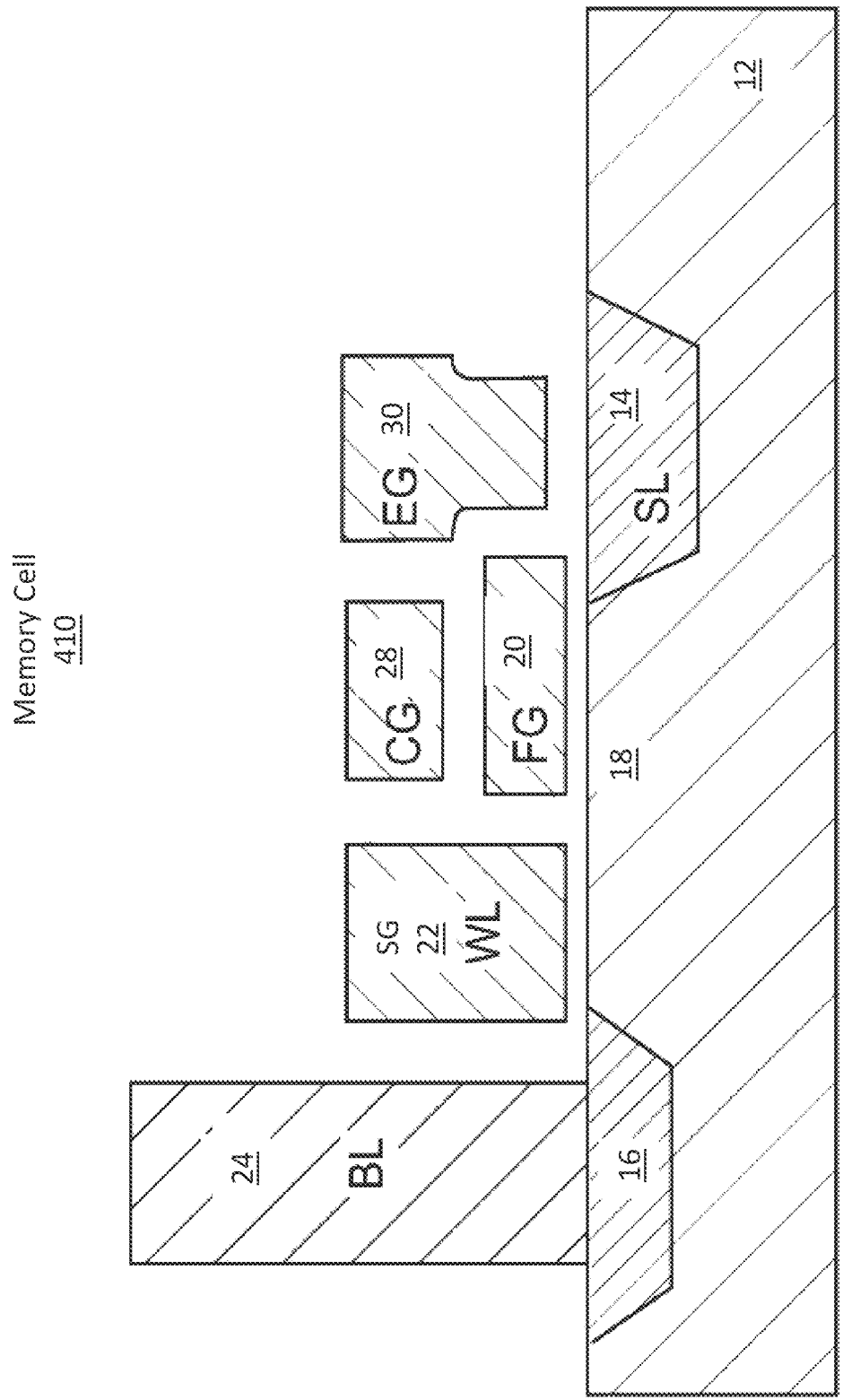
FIG. 4 depicts another prior art split gate flash memory cell.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE NO. 2

Operation of Flash Memory Cell 410 of FIG. 4

|  | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 5:
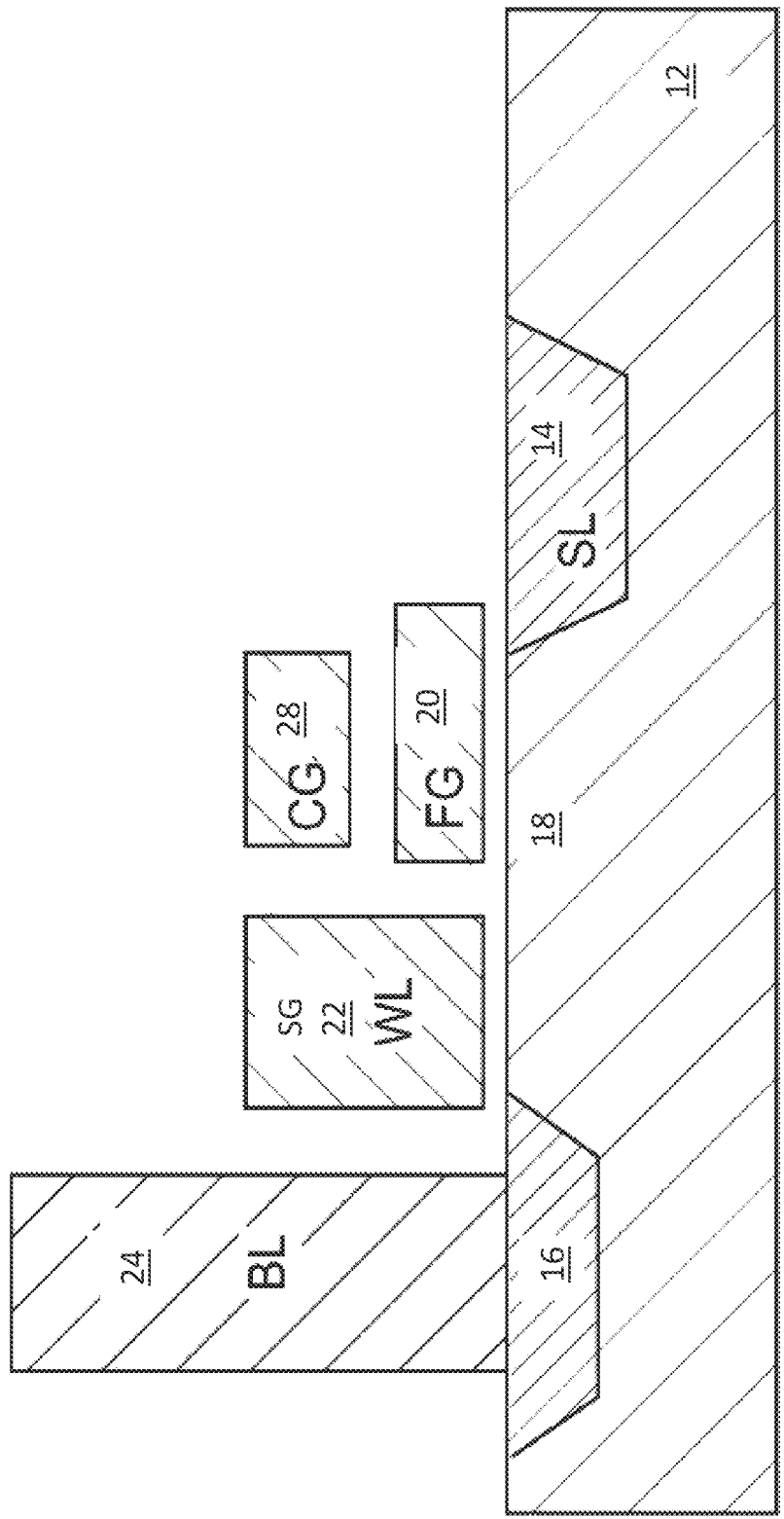
FIG. 5 depicts another prior art split gate flash memory cell

FIG. 5 shows memory cell 510, which is similar to memory cell 410 of FIG. 4 except that memory cell 510 does not contain an erase gate EG. An erase is performed by biasing the substrate 18 to a high voltage and biasing the control gate CG 28 to a low or negative voltage. Alternatively, an erase is performed by biasing word line 22 to a positive voltage and biasing control gate 28 to a negative voltage. Programming and reading is similar to that of FIG. 4.

Figure 6:
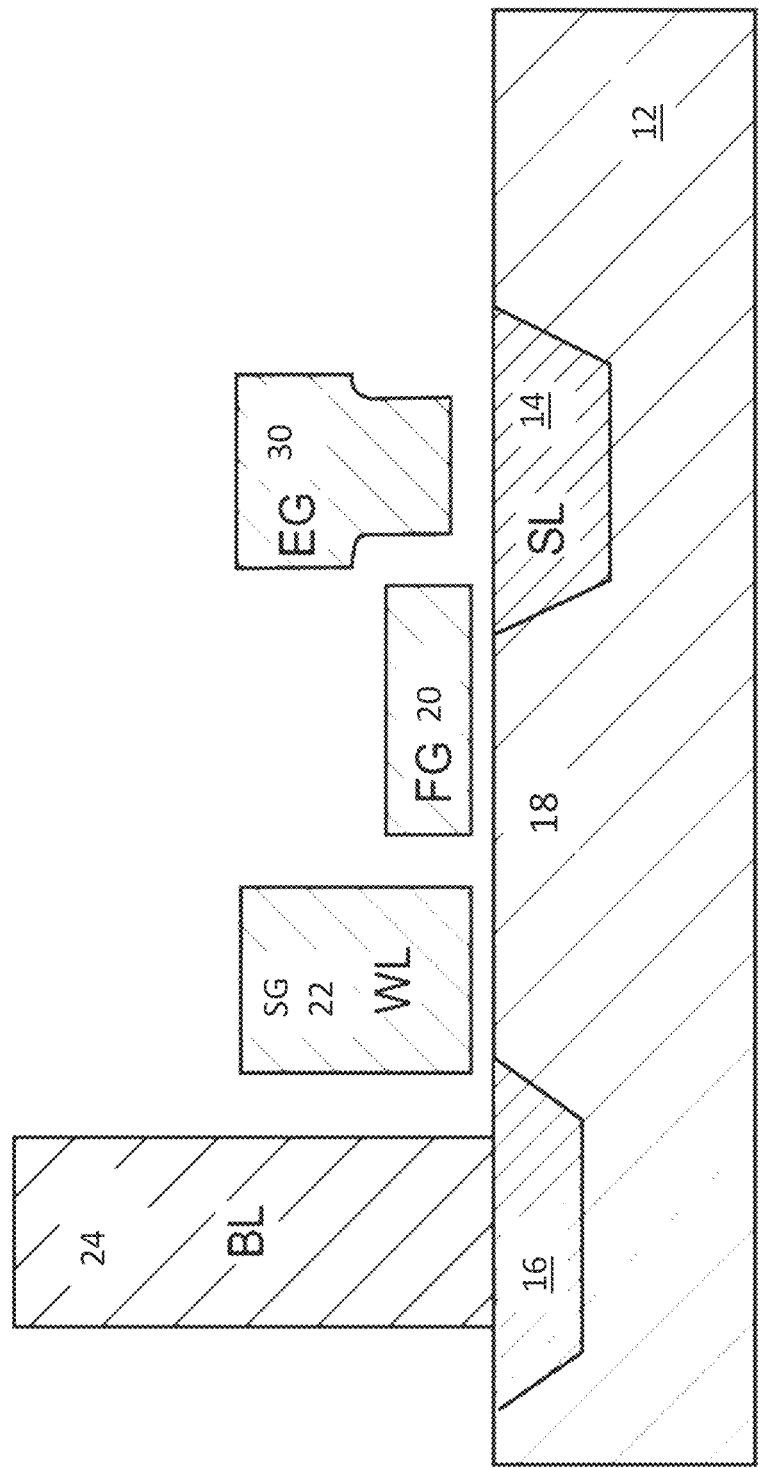
FIG. 6 depicts another prior art split gate flash memory cell.

FIG. 6 depicts a three-gate memory cell 610, which is another type of flash memory cell. Memory cell 610 is identical to the memory cell 410 of FIG. 4 except that memory cell 610 does not have a separate control gate. The erase operation (whereby erasing occurs through use of the erase gate) and read operation are similar to that of the FIG. 4 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 7:
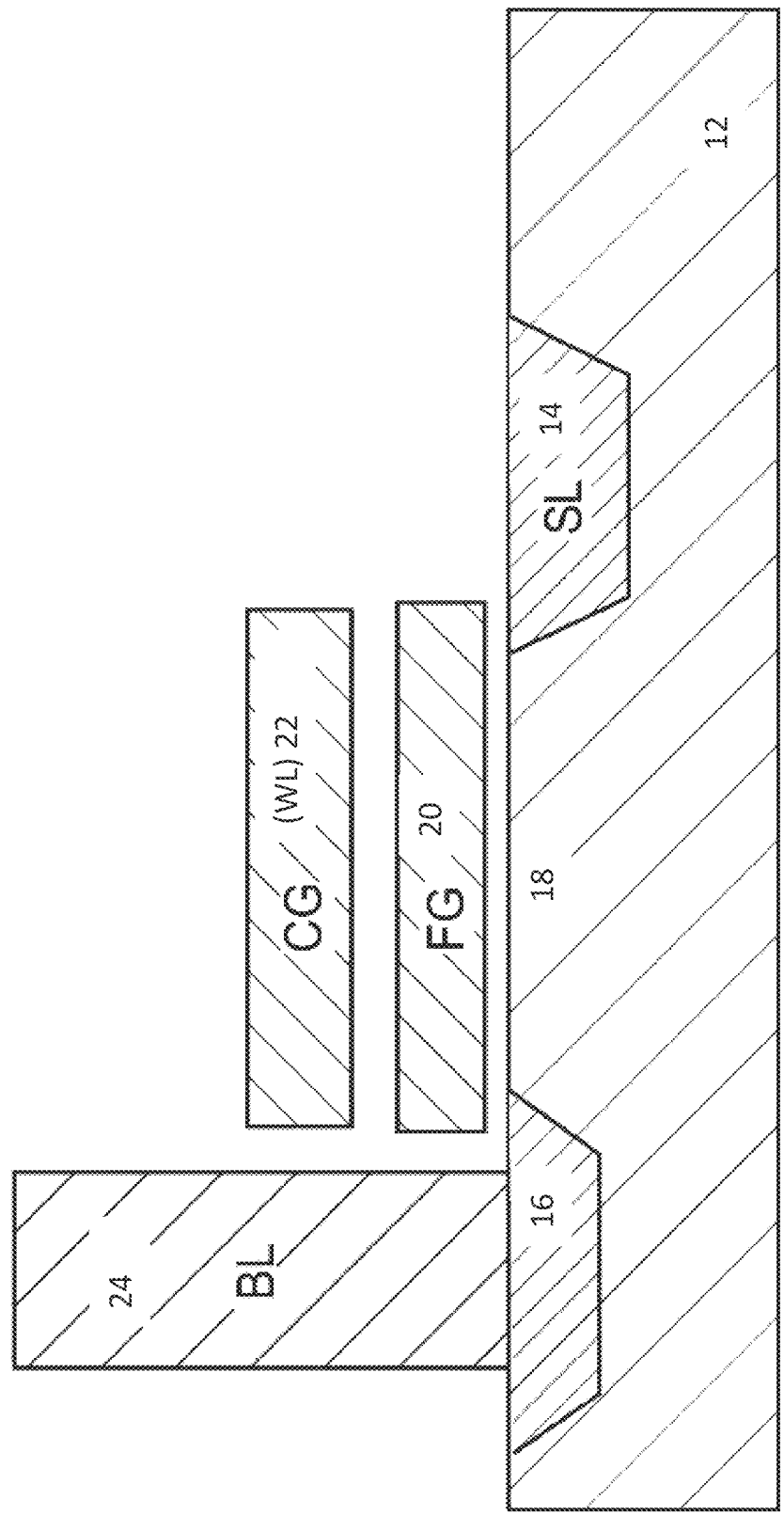
FIG. 7 depicts a prior art stacked gate flash memory cell.

FIG. 7 depicts stacked gate memory cell 710, which is another type of flash memory cell. Memory cell 710 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), CeRAM (correlated electron ram), etc. The methods and means described herein may apply to volatile memory technologies used for neural network such SRAM, DRAM, and/or volatile synapse cell, without limitation.

Neural Networks Employing Non-Volatile Memory Cell Arrays

Figure 8:
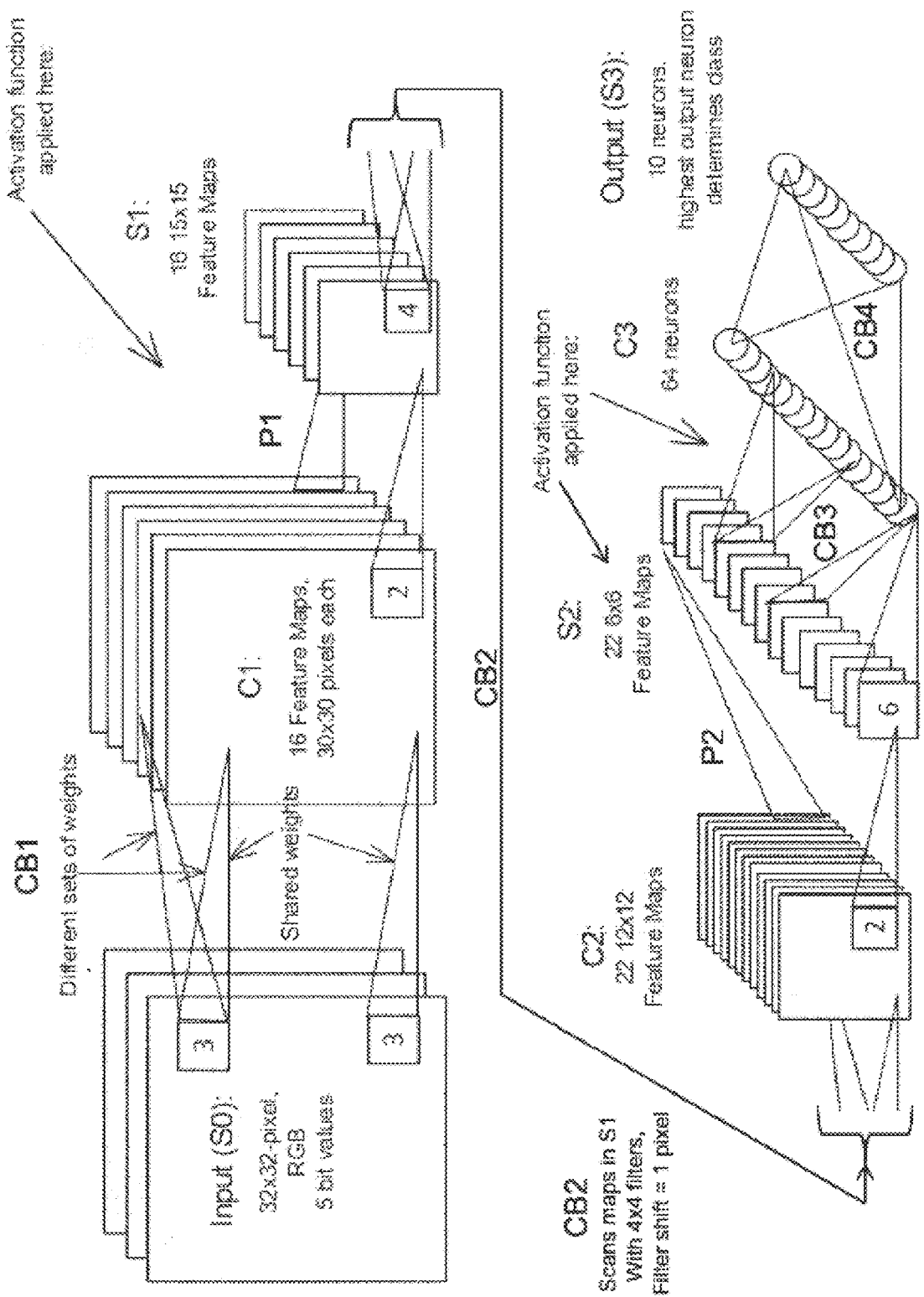
FIG. 8 is a diagram illustrating the different levels of an exemplary artificial neural network utilizing one or more non-volatile memory arrays.

FIG. 8 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 9:
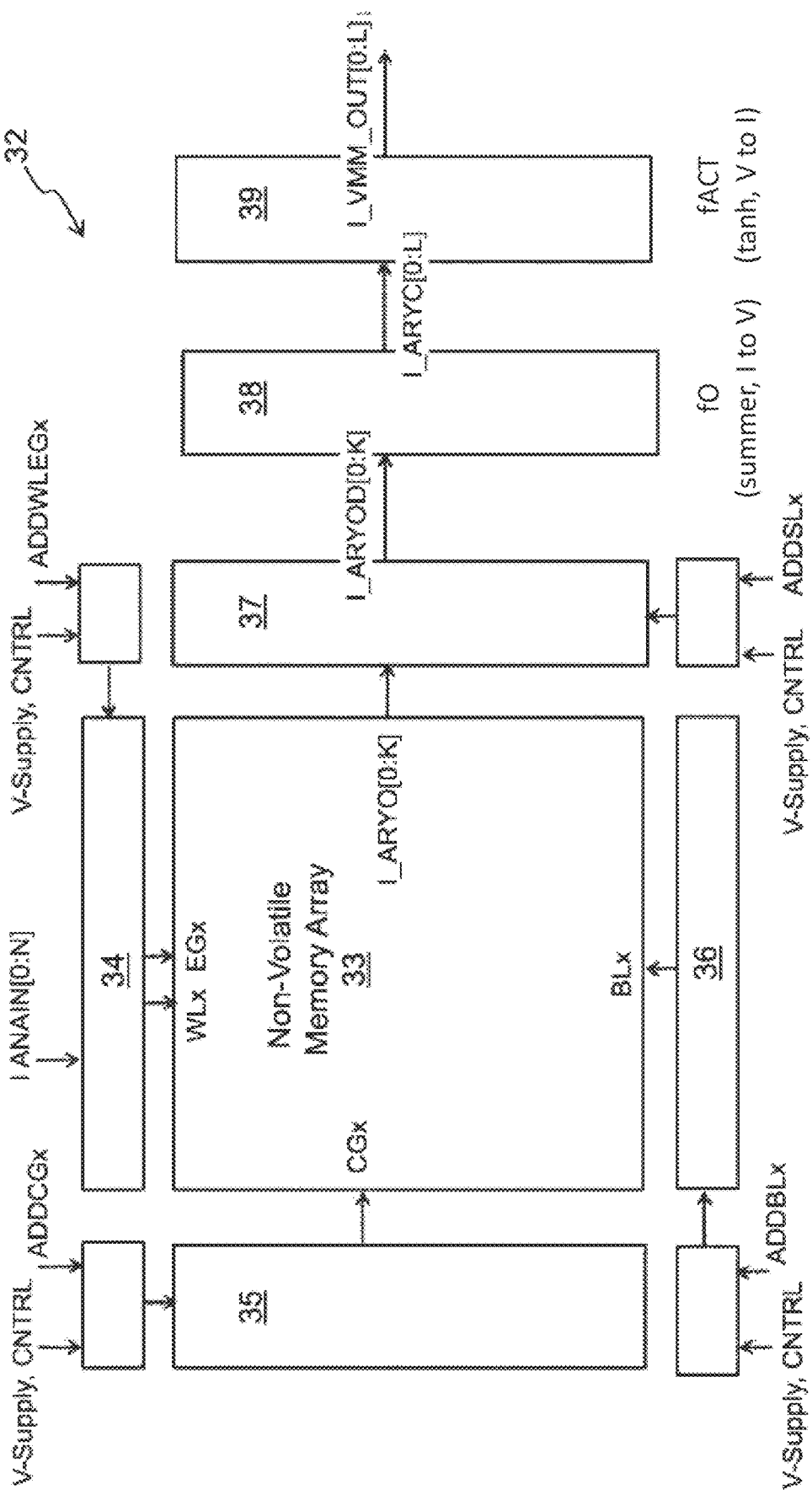
FIG. 9 is a block diagram illustrating a vector-by-matrix multiplication system.

FIG. 9 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tanh, or ReLU functions. The rectified output values of activation function circuit 39 become an element of a feature map of the next layer (e.g. C1 in FIG. 8), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summer 38 and activation function circuit 39 constitute a plurality of neurons.

The input to VMM array 32 in FIG. 9 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level, binary level, digital pulses, or digital bits (in which case an output ADC is provided to convert output analog level into digital bits).

Figure 10:
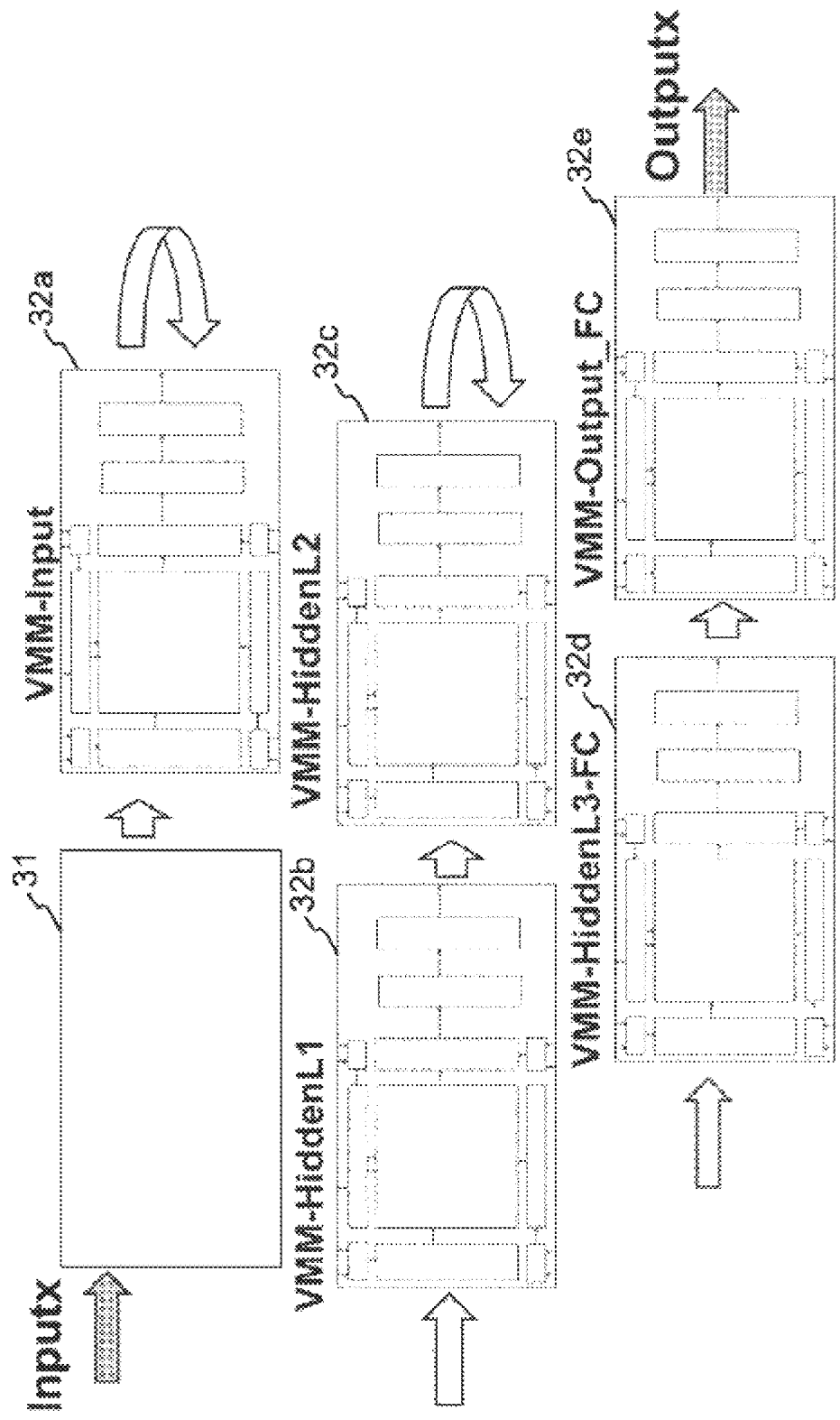
FIG. 10 is a block diagram illustrates an exemplary artificial neural network utilizing one or more a vector-by-matrix multiplication systems.

FIG. 10 is a block diagram depicting the usage of numerous layers of VMM arrays 32, here labeled as VMM arrays 32a, 32b, 32c, 32d, and 32e. As shown in FIG. 10, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a. The input conversion could also be done by a digital-to-digital pules (D/P) converter to convert an external digital input to a mapped digital pulse or pulses to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. Each VMM array 32a, 32b, 32c, 32d, and 32e can also be time multiplexed for various portion of its array or neurons. The example shown in FIG. 10 contains five layers (32a,32b, 32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 11:
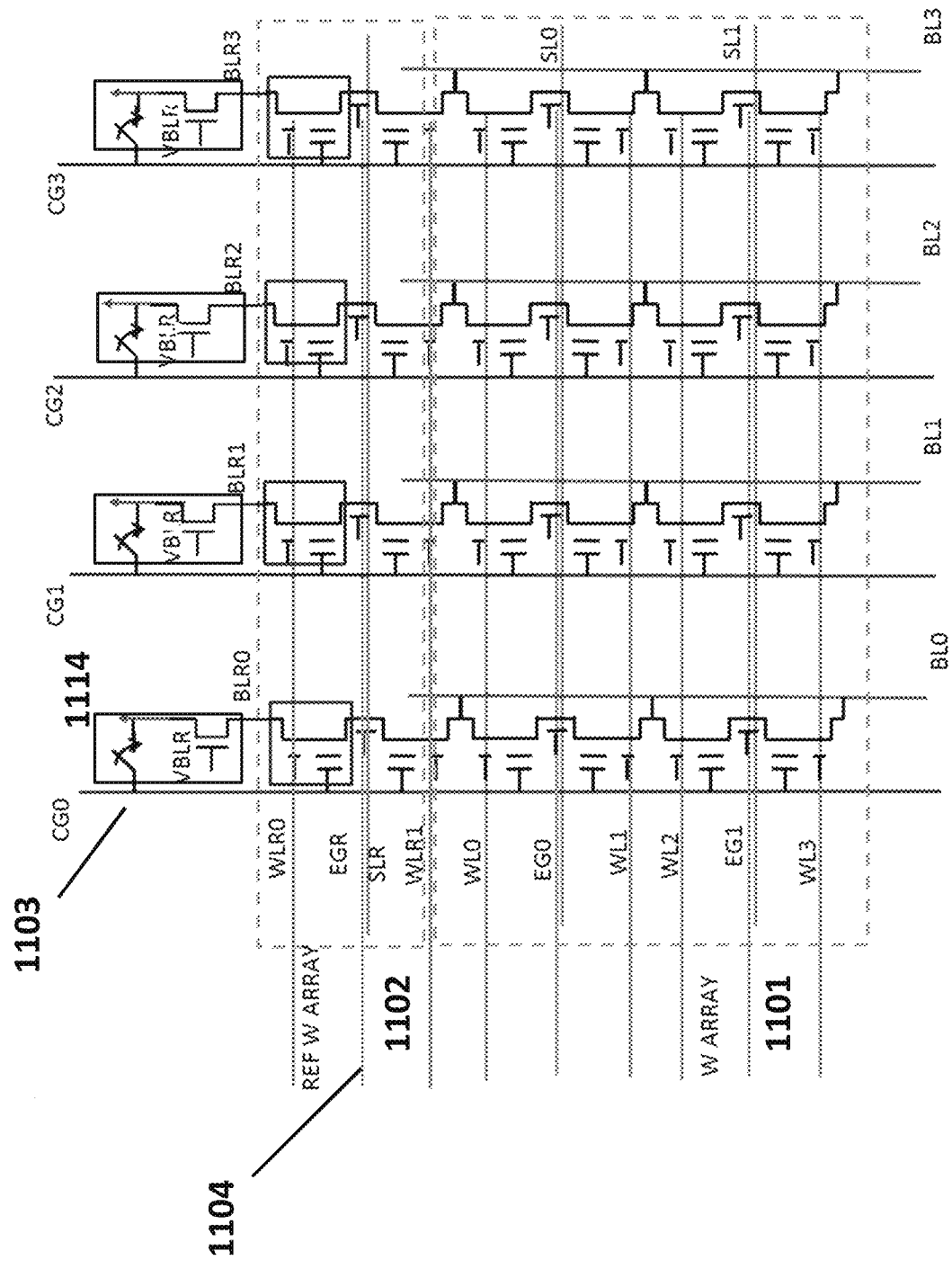
FIG. 11 depicts another embodiment of a vector-by-matrix multiplication system.

FIG. 11 depicts neuron VMM array 1100, which is particularly suited for memory cells 310 as shown in FIG. 3, and is utilized as the synapses and parts of neurons between an input layer and the next layer. VMM array 1100 comprises memory array 1101 of non-volatile memory cells and reference array 1102 (at the top of the array) of non-volatile reference memory cells. Alternatively, another reference array can be placed at the bottom.

In VMM array 1100, control gate lines, such as control gate line 1103, run in a vertical direction (hence reference array 1102 in the row direction is orthogonal to control gate line 1103), and erase gate lines, such as erase gate line 1104, run in a horizontal direction. Here, the inputs to VMM array 1100 are provided on the control gate lines (CG0, CG1, CG2, CG3), and the output of VMM array 1100 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1100, i.e. the flash memory of VMM array 1100, are preferably configured to operate in a sub-threshold region.

The non-volatile reference memory cells and the non-volatile memory cells described herein are biased in weak inversion:

$$Ids = Io * e^{(Vg-Vth)/kVt} = w * Io * e^{(Vg)/kVt},$$

where $w = e^{(-Vth)/kVt}$

For an I-to-V log converter using a memory cell (such as a reference memory cell or a peripheral memory cell) or a transistor to convert input current into an input voltage:

$$Vg = k * Vt * \log [Ids/wp * Io]$$

Here, wp is w of a reference or peripheral memory cell.

For a memory array used as a vector matrix multiplier VMM array, the output current is:

$$Iout = wa * Io * e^{(Vg)kVt}, \text{namely}$$

$$Iout = (wa/wp) * Iin = W * Iin$$

$$W = e^{(Vthp-Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = \text{beta} * (Vgs-Vth) * Vds; \text{beta} = u * Cox * W/L$$

$$W = \alpha(Vgs-Vth)$$

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Other embodiments for VMM array 32 of FIG. 9 are described in U.S. patent application Ser. No. 15/826,345, which is incorporated by reference herein. As described in that application, a sourceline or a bitline can be used as the neuron output (current summation output). Alternatively, the flash memory cells of VMM arrays described herein can be configured to operate in the saturation region:

$$Ids = \alpha \frac{1}{2} * \text{beta} * (Vgs-Vth)^2; \text{beta} = u * Cox * W/L$$

$$W = \alpha(Vgs-Vth)^2$$

A wordline, control gate, or erase gate can be used as the input for the memory cell operated in the saturation region. The bitline or sourceline can be used as the output for the output neuron.

Alternatively, the flash memory cells of VMM arrays described herein can be used in all regions or a combination thereof (sub threshold, linear, or saturation).

Figure 12:
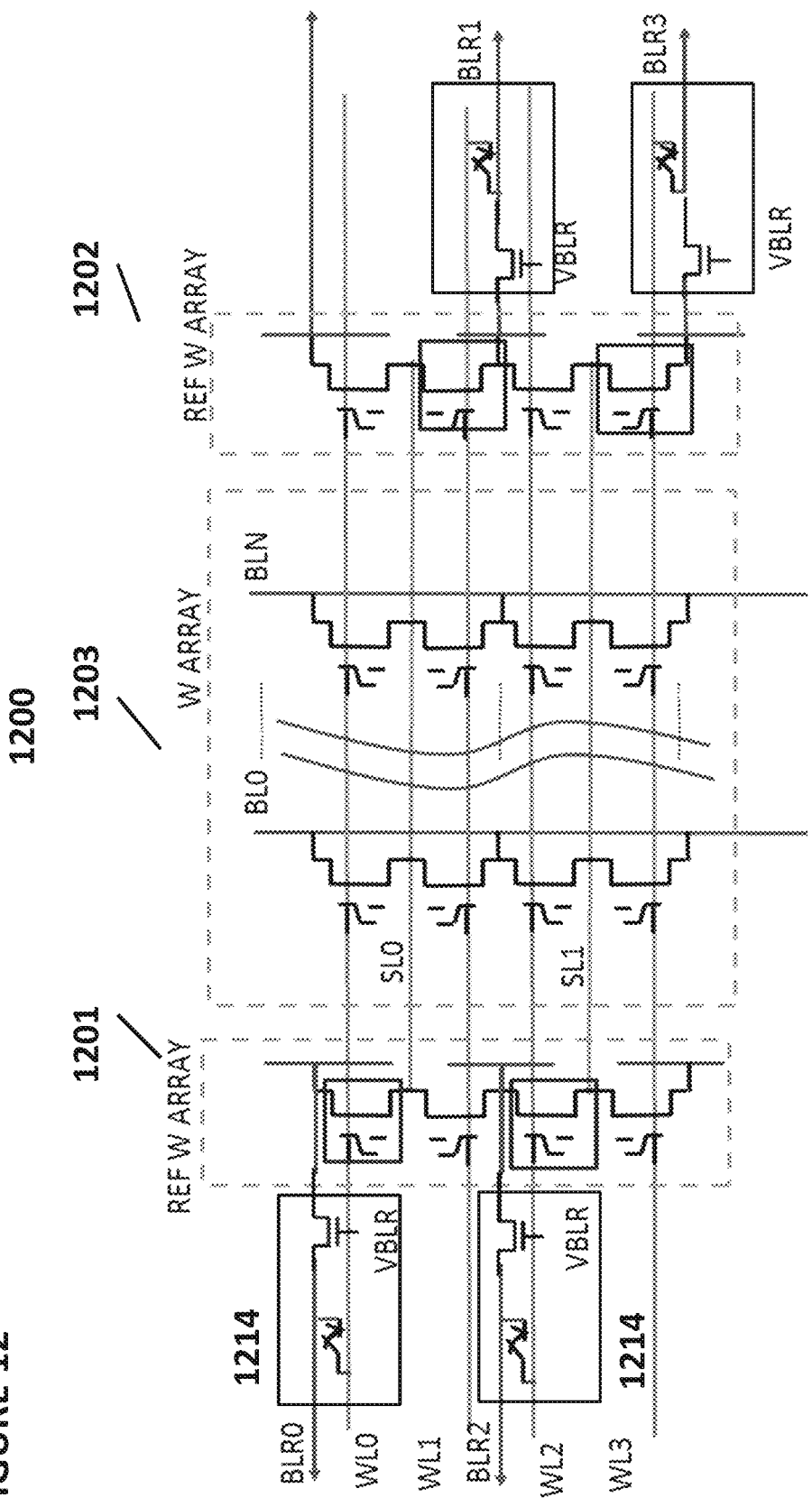
FIG. 12 depicts another embodiment of a vector-by-matrix multiplication system.

FIG. 12 depicts neuron VMM array 1200, which is particularly suited for memory cells 210 as shown in FIG. 2, and is utilized as the synapses between an input layer and the next layer. VMM array 1200 comprises a memory array 1203 of non-volatile memory cells, reference array 1201 of first non-volatile reference memory cells, and reference array 1202 of second non-volatile reference memory cells.

Reference arrays 1201 and 1202, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1214 (only partially depicted) with current inputs flowing into them. The reference cells are tuned (e.g., programmed) to target reference levels. The target reference levels are provided by a reference mini-array matrix (not shown).

Memory array 1203 serves two purposes. First, it stores the weights that will be used by the VMM array 1200 on respective memory cells thereof. Second, memory array 1203 effectively multiplies the inputs (i.e. current inputs provided in terminals BLR0, BLR1, BLR2, and BLR3, which reference arrays 1201 and 1202 convert into the input voltages to supply to wordlines WL0, WL1, WL2, and WL3) by the weights stored in the memory array 1203 and then adds all the results (memory cell currents) to produce the output on the respective bit lines (BL0-BLN), which will be the input to the next layer or input to the final layer. By performing the multiplication and addition function, memory array 1203 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1200 of FIG. 12: | | | | | | |
|---|---|---|---|---|---|---|
| | WL | WL -unsel | BL | BL -unsel | SL | SL -unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 13:
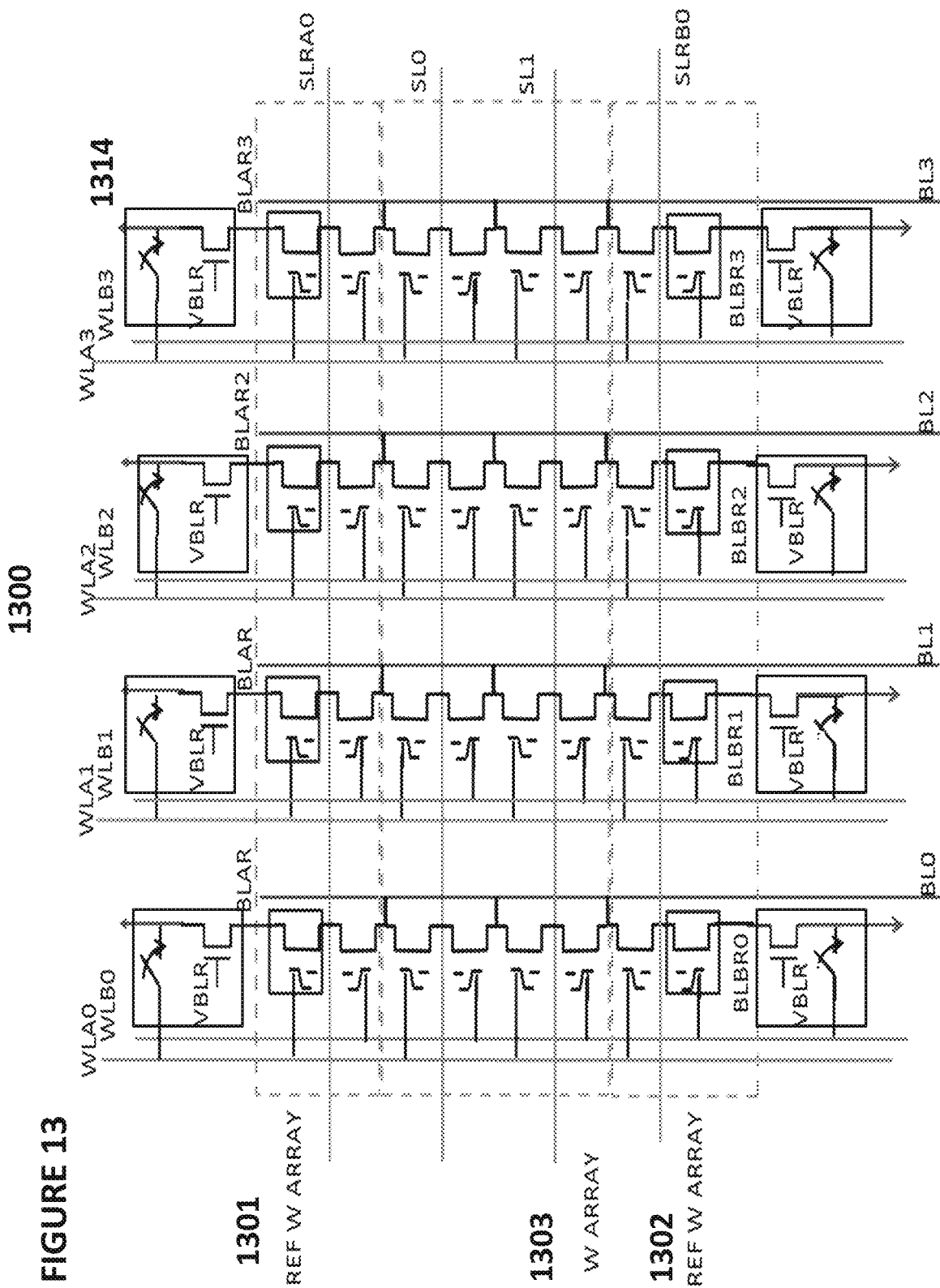
FIG. 13 depicts another embodiment of a vector-by-matrix multiplication system.

FIG. 13 depicts neuron VMM array 1300, which is particularly suited for memory cells 210 as shown in FIG. 2, and is utilized as the synapses and parts of neurons between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302 run in row direction of the VMM array 1300. VMM array is similar to VMM 1000 except that in VMM array 1300, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| Operation of VMM Array 1300 of FIG. 13 | | | | | | |
|---|---|---|---|---|---|---|
| | WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 14:
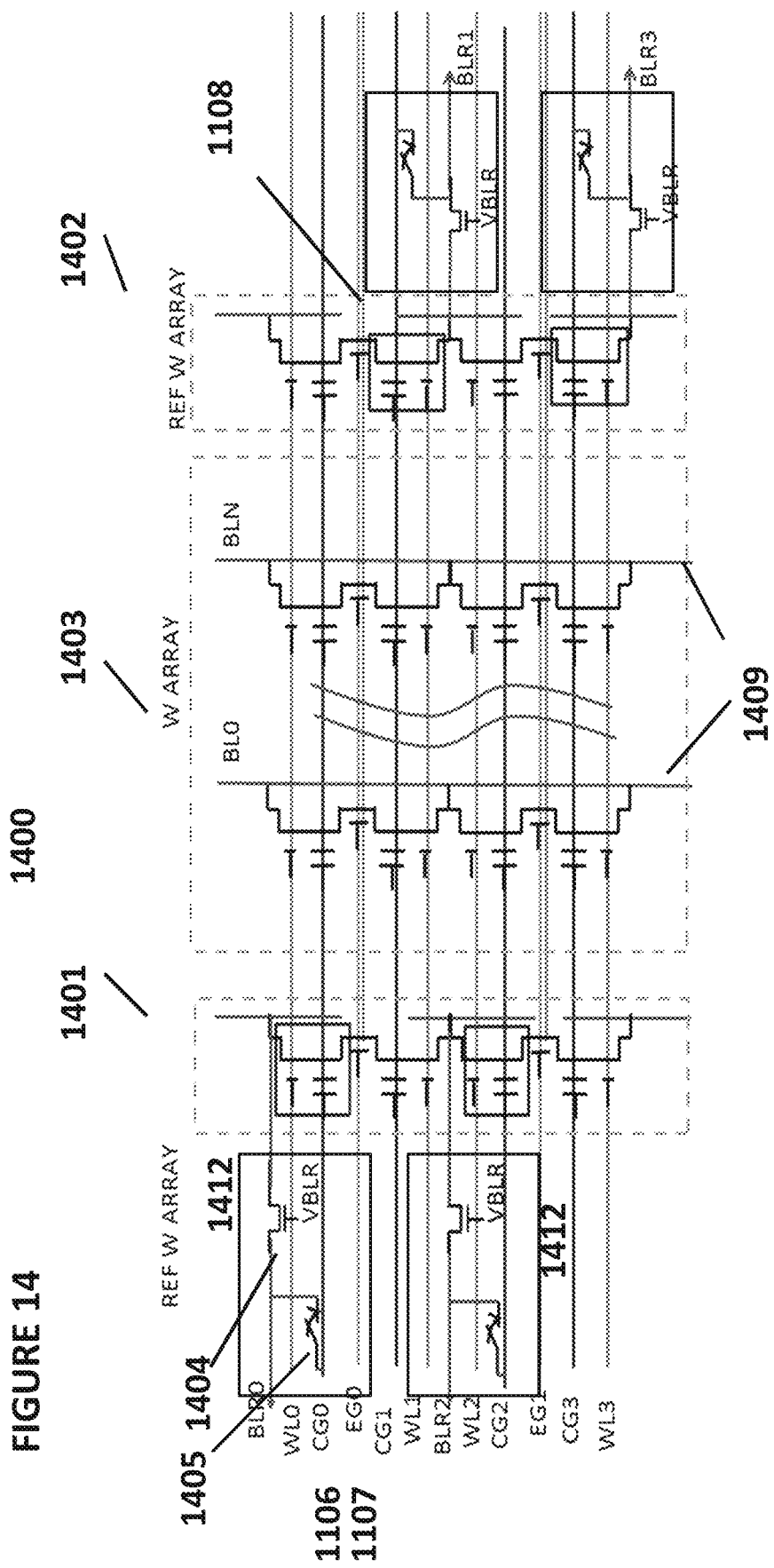
FIG. 14 depicts another embodiment of a vector-by-matrix multiplication system.

FIG. 14 depicts neuron VMM array 1400, which is particularly suited for memory cells 310 as shown in FIG. 3, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1412 (only partially shown) with current inputs flowing into them through BLR0, BLR1, BLR2, and BLR3. Multiplexors 1412 each include a respective multiplexor 1405 and a cascoding transistor 1404 to ensure a constant voltage on the bitline (such as BLR0) of each of the first and second non-volatile reference memory cells during a read operation. The reference cells are tuned to target reference levels.

Memory array 1403 serves two purposes. First, it stores the weights that will be used by the VMM array 1400. Second, memory array 1403 effectively multiplies the inputs (current inputs provided to terminals BLR0, BLR1, BLR2, and BLR3, for which reference arrays 1401 and 1402 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1400 implements uni-directional tuning for non-volatile memory cells in memory array 1403. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 15:
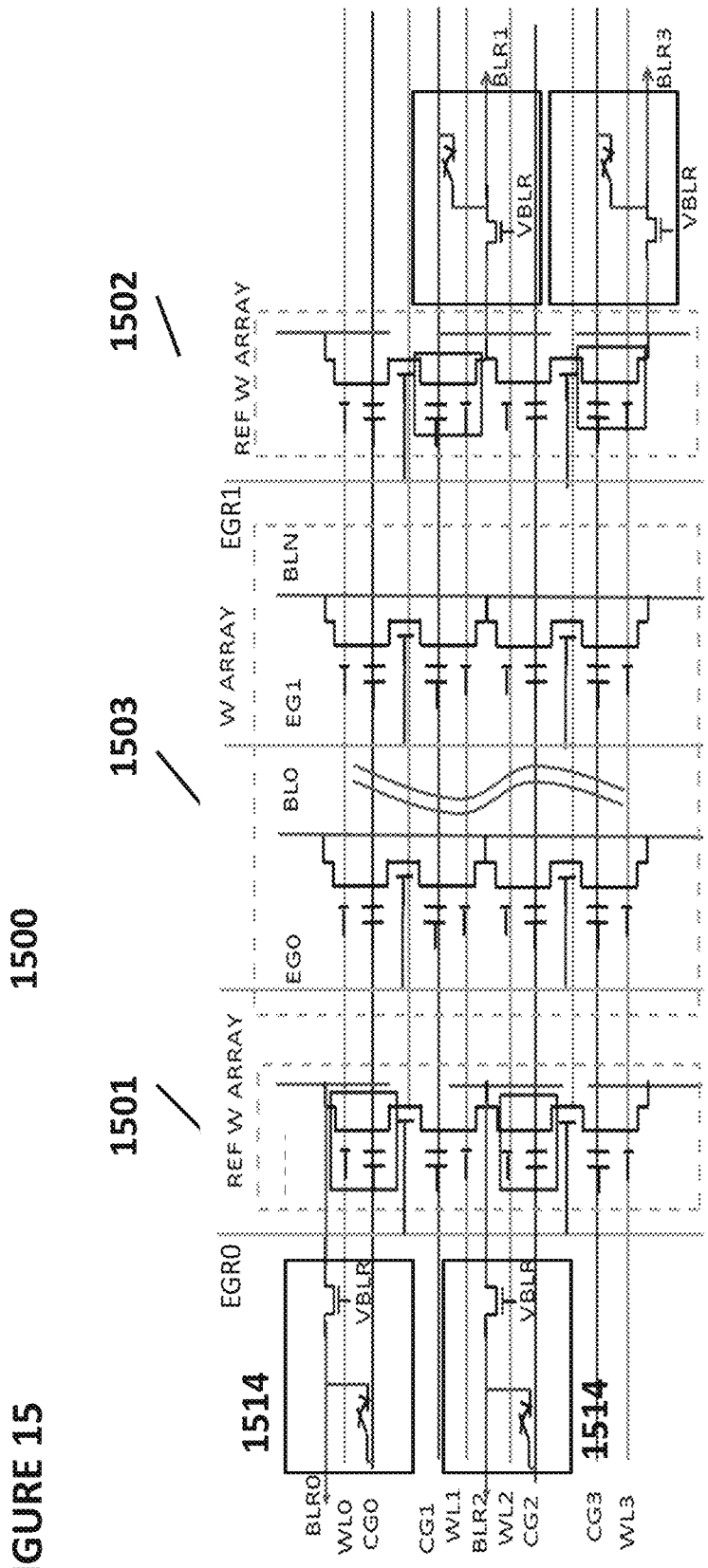
FIG. 15 depicts another embodiment of a vector-by-matrix multiplication system.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 or first non-volatile reference memory cells, and reference array 1502 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1500 is similar to VMM array 1400, except that VMM array 1500 implements bi-directional tuning, where each individual cell can be completely erased, partially programmed, and partially erased as needed to reach the desired amount of charge on the floating gate due to the use of separate EG lines. As shown, reference arrays 1501 and 1502 convert input current in the terminal BLR0, BLR1, BLR2, and BLR3 into control gate voltages CG0, CG1, CG2, and CG3 (through the action of diode-connected reference cells through multiplexors 1514) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

Operation of VMM Array 1400 of FIG. 14

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | -0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | -0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

TABLE NO. 8

Operation of VMM Array 1500 of FIG. 15

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 24:
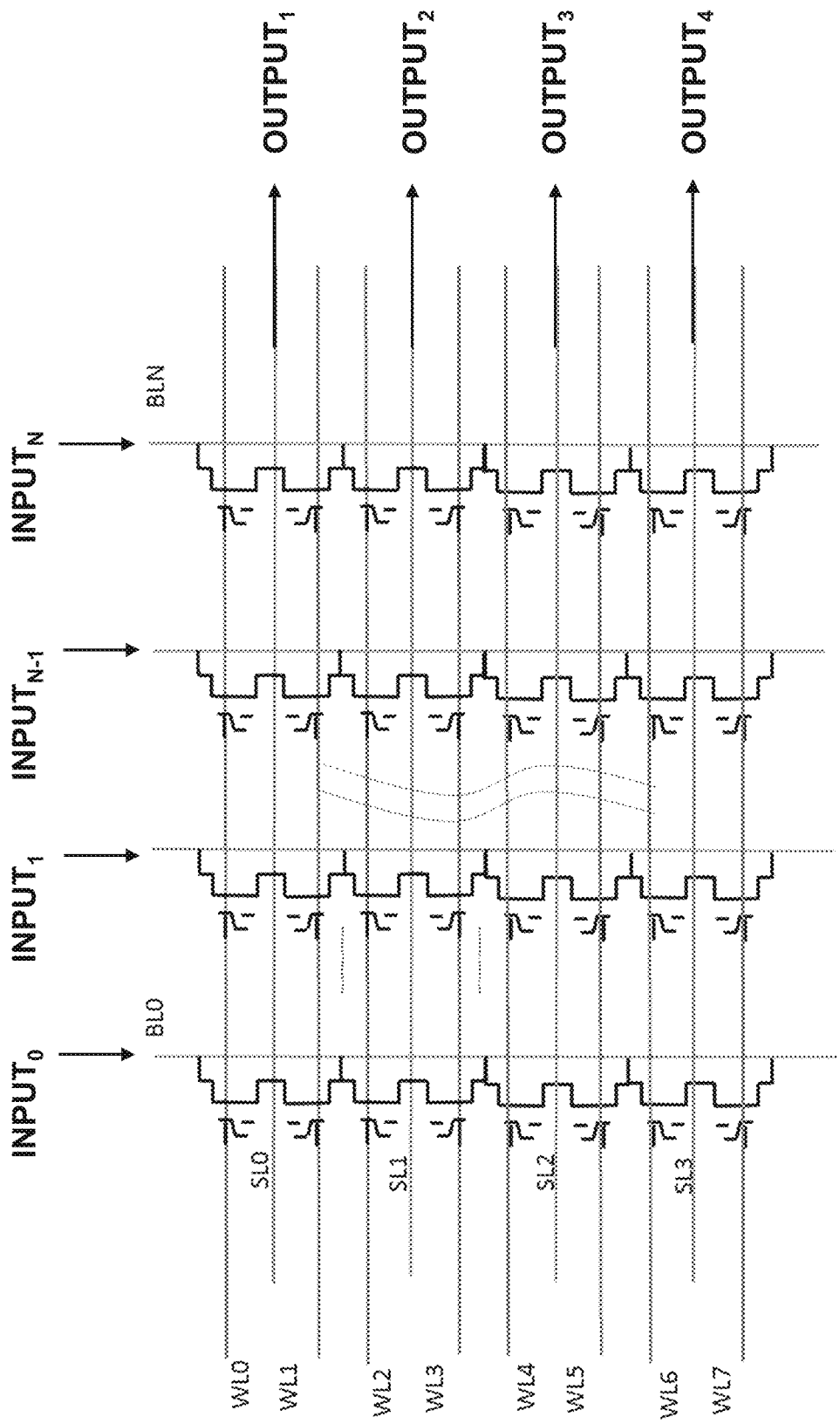
FIG. 24 depicts another embodiment of a vector-by-matrix multiplication system.

FIG. 24 depicts neuron VMM array 2400, which is particularly suited for memory cells 210 as shown in FIG. 2, and is utilized as the synapses and parts of neurons between an input layer and the next layer. In VMM array 2400, the inputs $INPUT_0, \ldots, INPUT_N$ are received on bit lines $BL_0, \ldots BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 25:
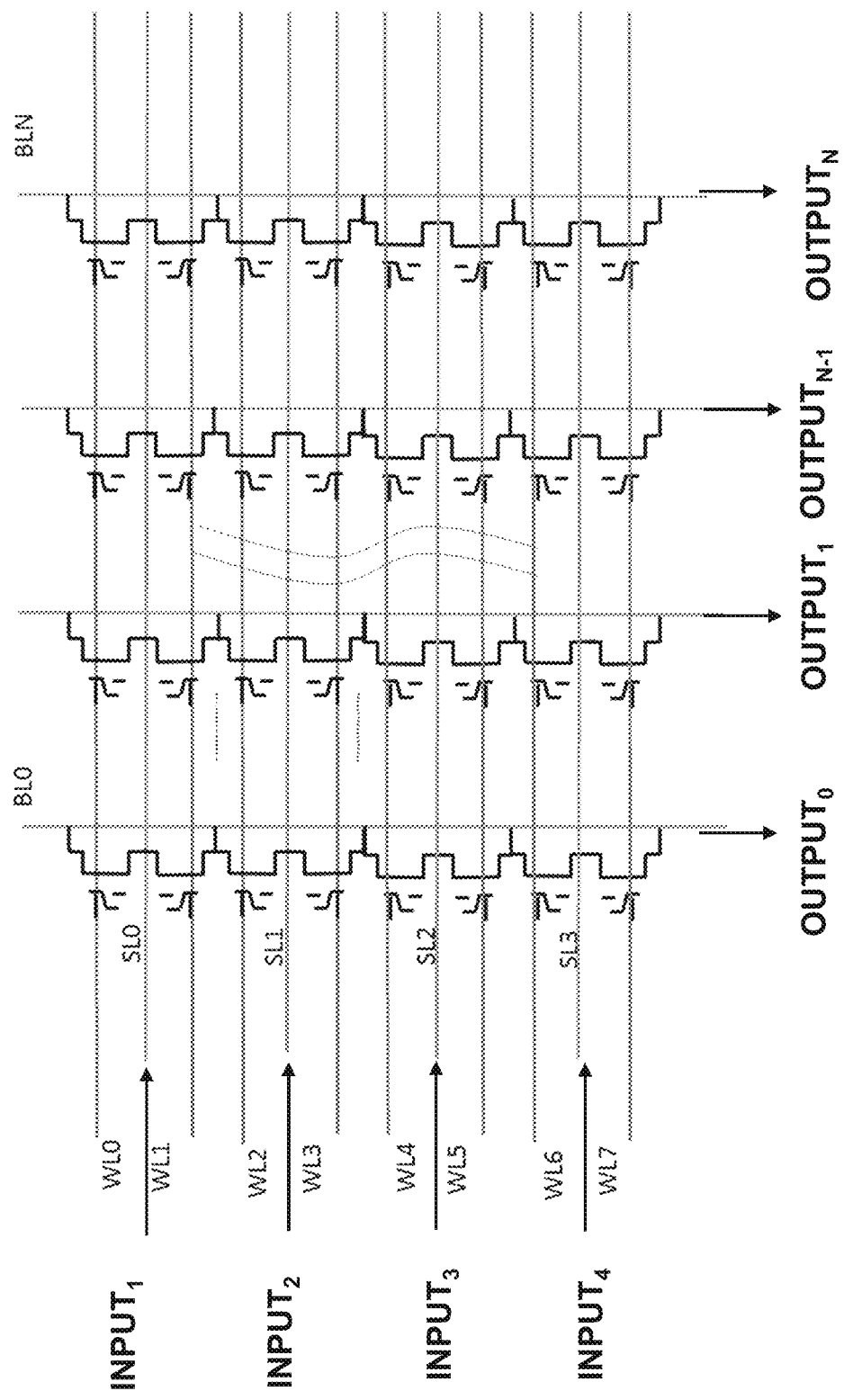
FIG. 25 depicts another embodiment of a vector-by-matrix multiplication system.

FIG. 25 depicts neuron VMM array 2500, which is particularly suited for memory cells 210 as shown in FIG. 2, and is utilized as the synapses and parts of neurons between an input layer and the next layer. In this example, the inputs $INPUT_0$, $INPUT_1$, $INPUT_2$, and INPUTS are received on source lines $SL_0$, $SL_1$, $SL_2$, and $SL_3$, respectively, and the outputs $OUTPUT_0, \ldots OUTPUT_N$ are generated on bit lines $BL_0, \ldots, BL_N$.

Figure 26:
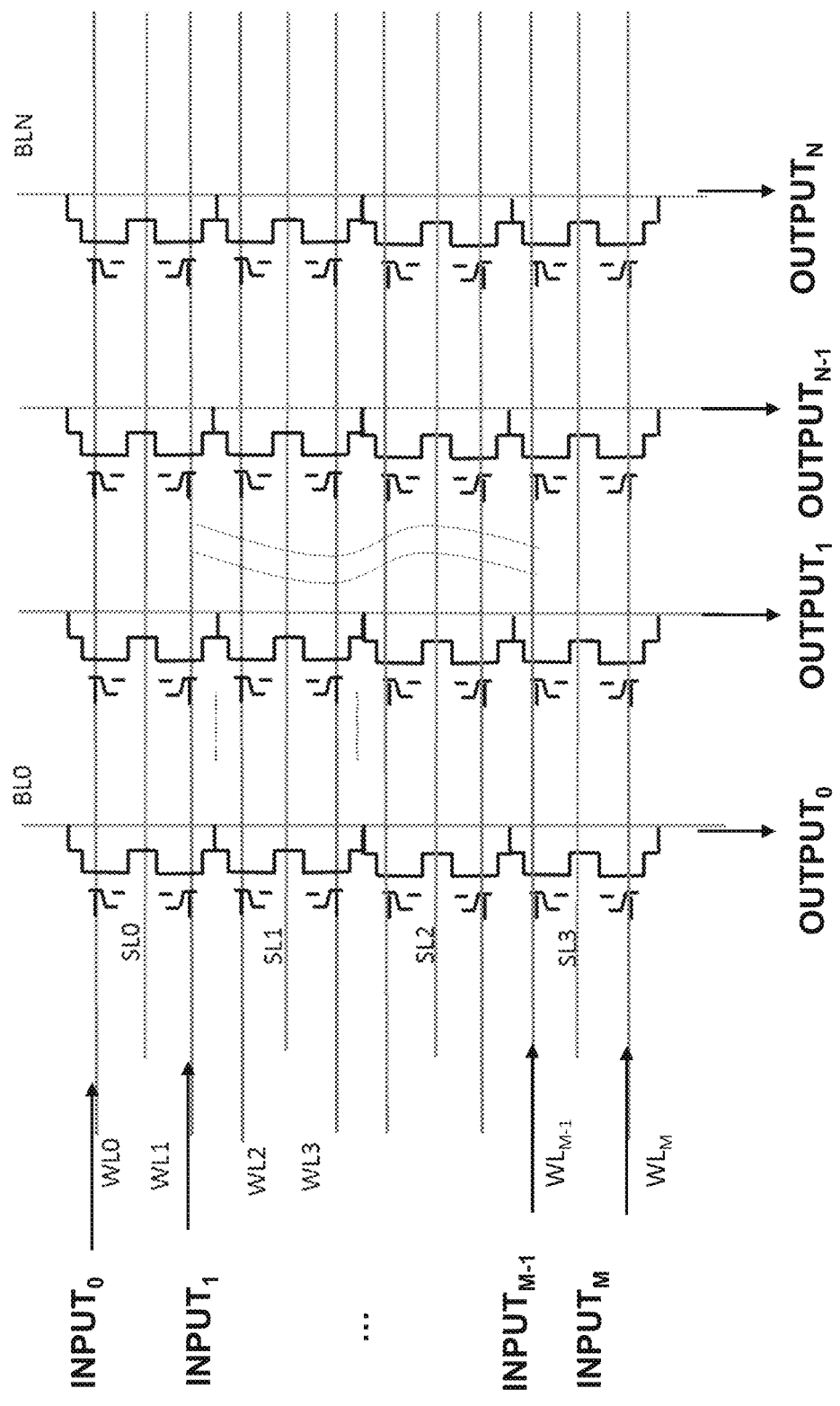
FIG. 26 depicts another embodiment of a vector-by-matrix multiplication system.

FIG. 26 depicts neuron VMM array 2600, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 27:
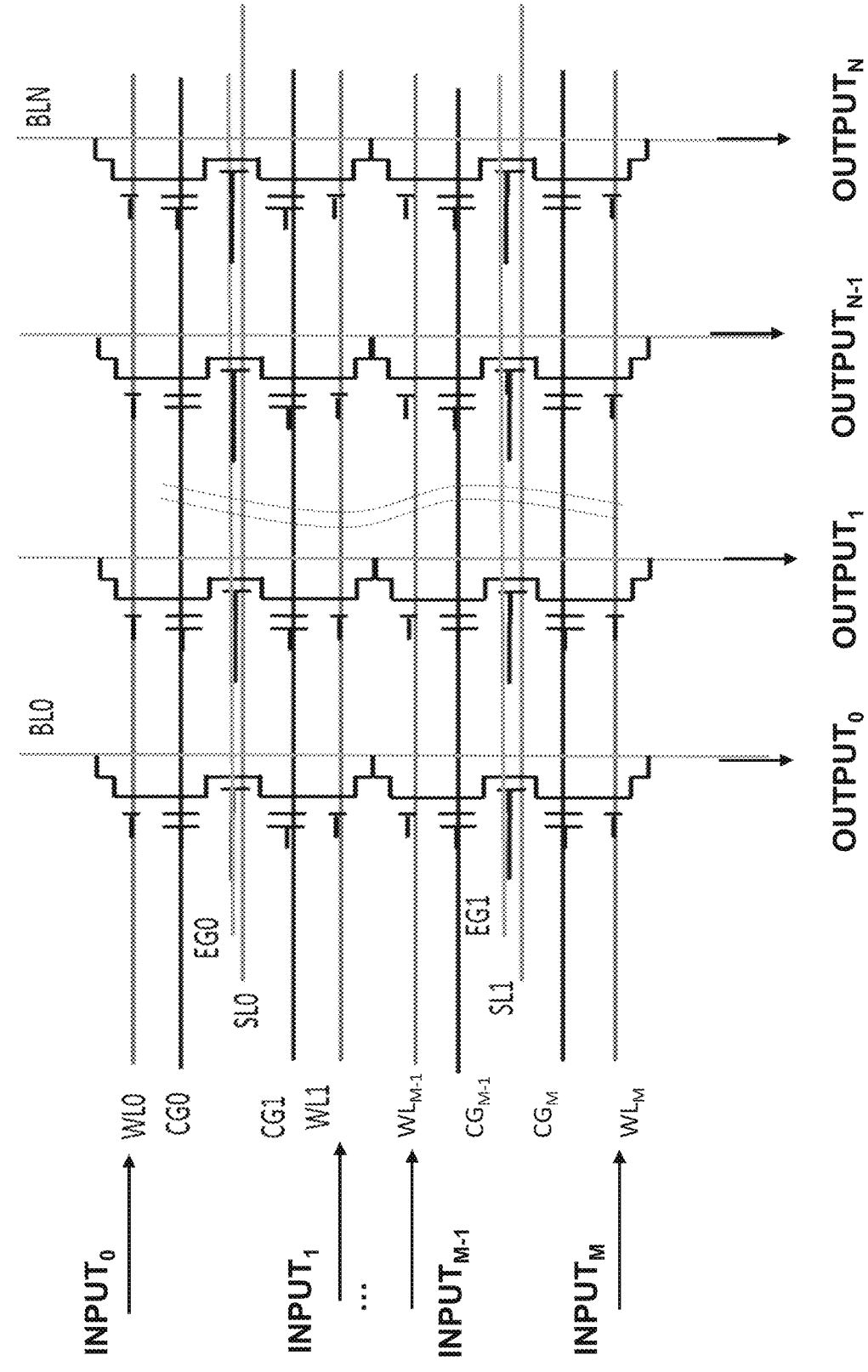
FIG. 27 depicts another embodiment of a vector-by-matrix multiplication system.

FIG. 27 depicts neuron VMM array 2700, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0, \ldots, WL_M$, respectively, and the outputs $OUTPUT_0, \ldots OUTPUT_N$ are generated on bit lines $BL_0, \ldots, BL_N$.

Figure 28:
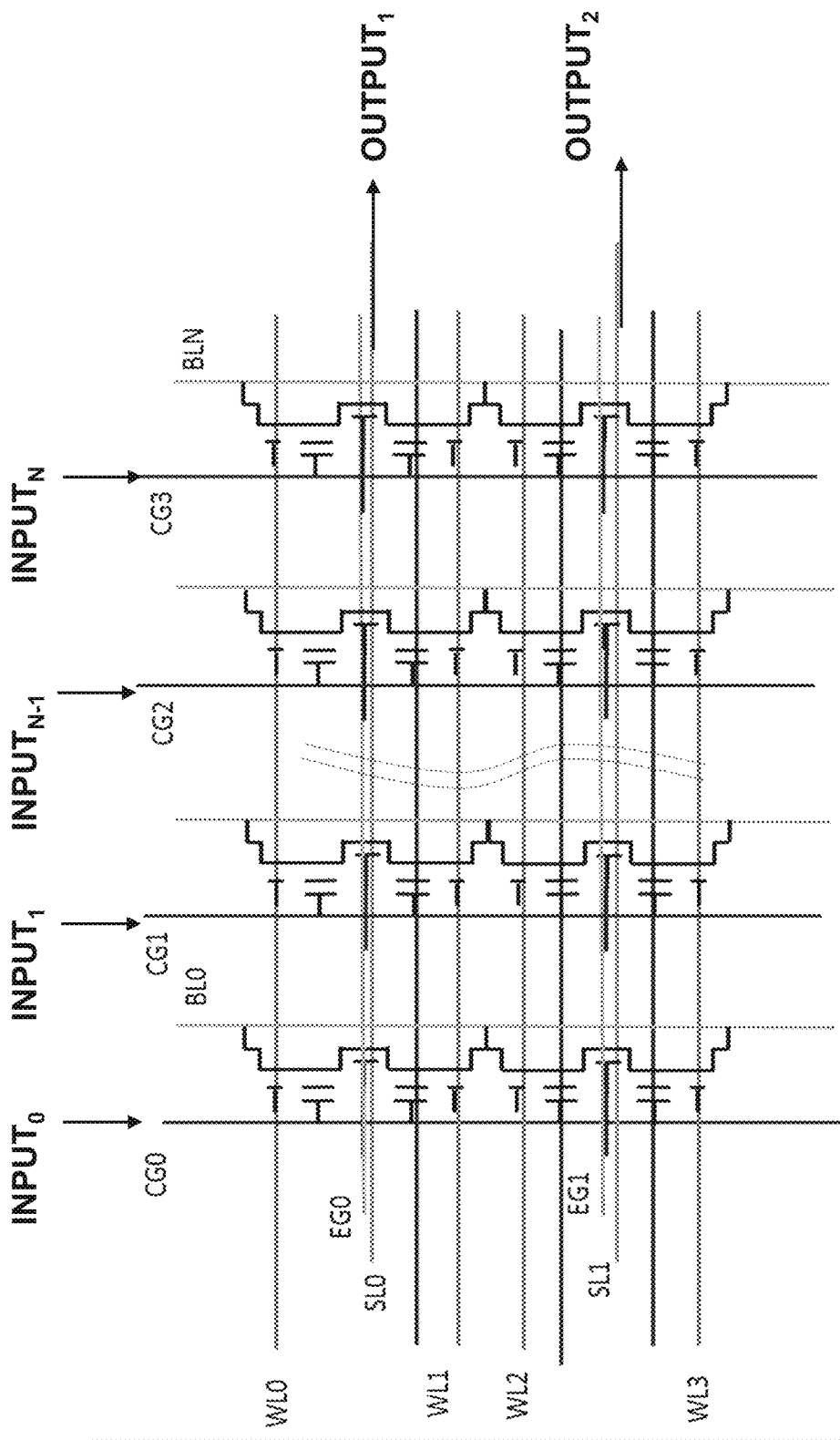
FIG. 28 depicts another embodiment of a vector-by-matrix multiplication system.

FIG. 28 depicts neuron VMM array 2800, which is particularly suited for memory cells 410 as shown in FIG. 4, and is utilized as the synapses and parts of neurons between an input layer and the next layer. In this example, the inputs $INPUT_0, \ldots, INPUT_n$ are received on bit lines $BL_0, \ldots, BL_N$, respectively, and the outputs OUTPUT) and $OUTPUT_2$ are generated on erase gate lines $EG_0$ and $EG_1$.

Figure 29:
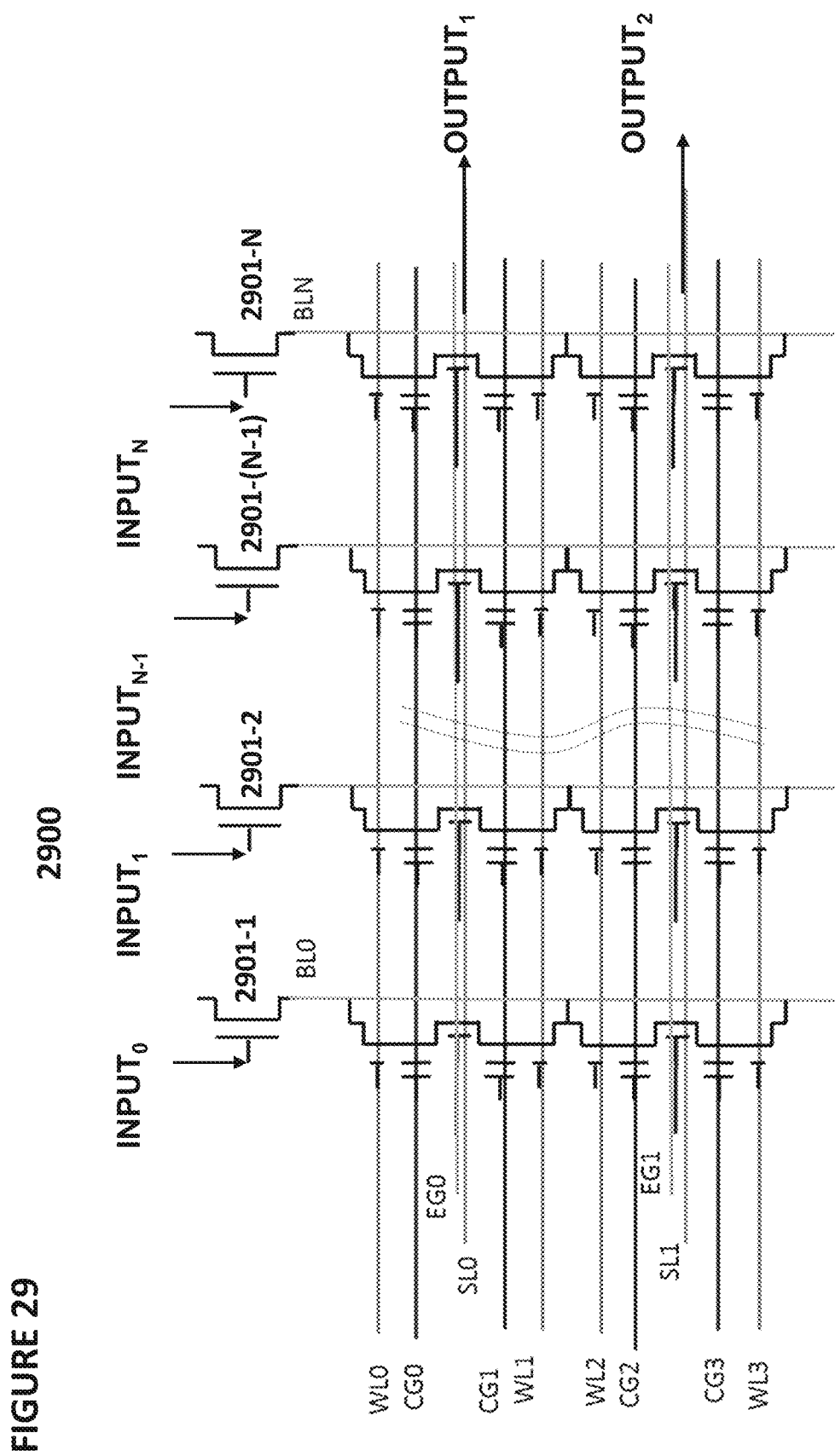
FIG. 29 depicts another embodiment of a vector-by-matrix multiplication system.

FIG. 29 depicts neuron VMM array 2900, which is particularly suited for memory cells 410 as shown in FIG. 4, and is utilized as the synapses and parts of neurons between an input layer and the next layer. In this example, the inputs INPUT®, . . . , $INPUT_N$ are received on the gates of bit line control gates 2901-1, 2901-2, . . . , 2901-(N−1), and 2901-N, respectively, which are coupled to bit lines $BL_0, \ldots, BL_N$, respectively. Exemplary outputs OUTPUT) and $OUTPUT_2$ are generated on erase gate lines $SL_0$ and SL).

Figure 30:
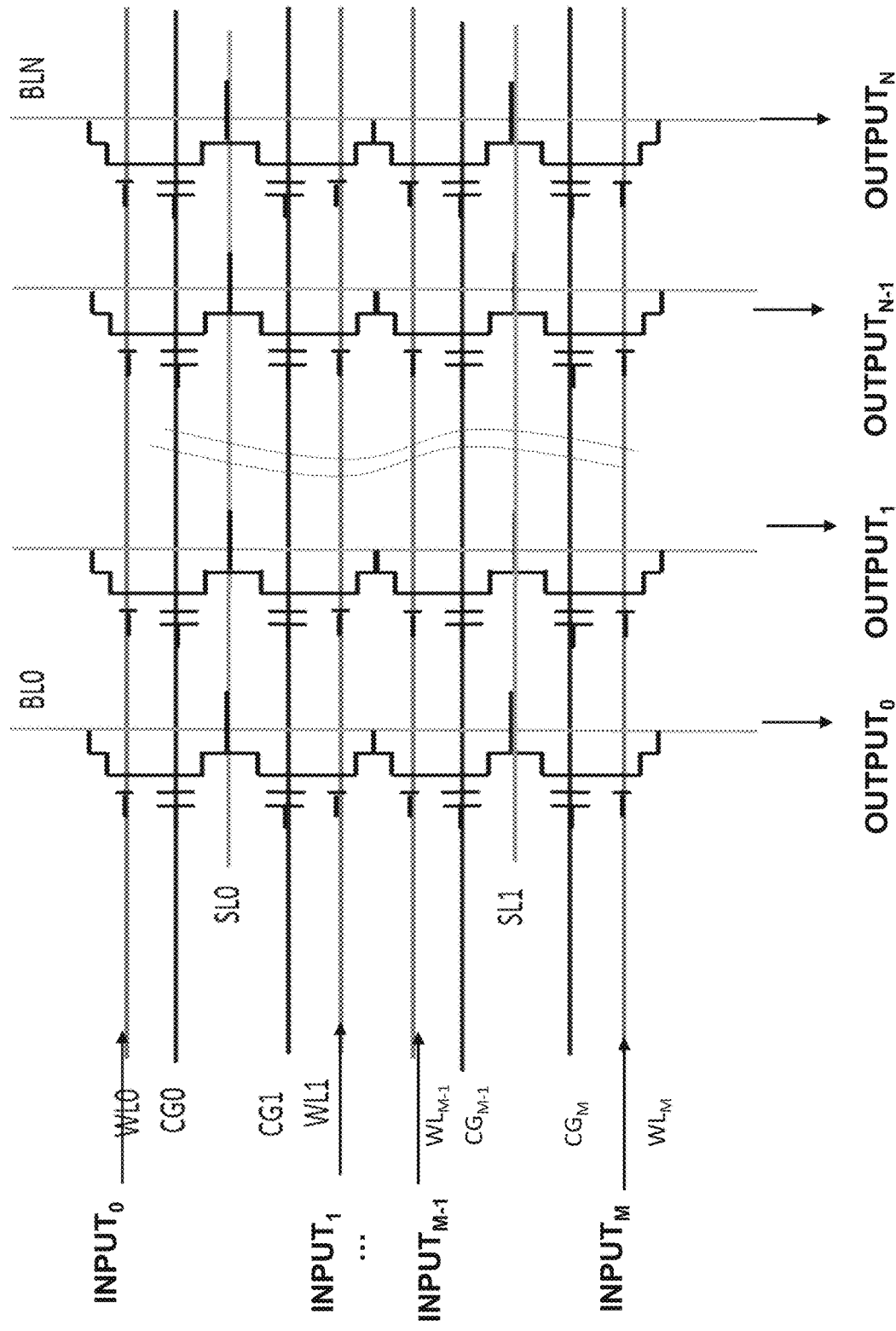
FIG. 30 depicts another embodiment of a vector-by-matrix multiplication system.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots, BL_N$, respectively.

Figure 31:
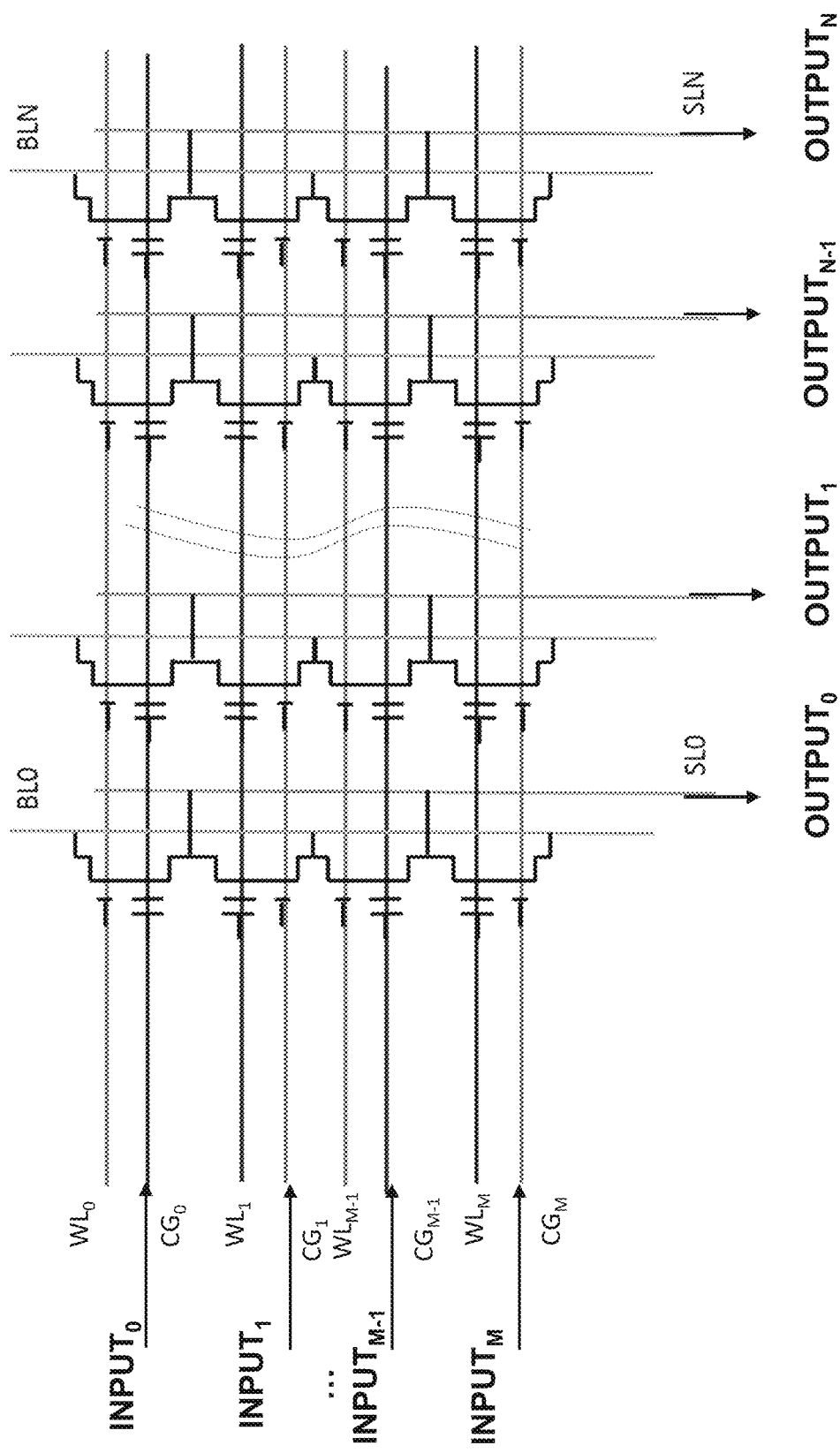
FIG. 31 depicts another embodiment of a vector-by-matrix multiplication system.

FIG. 31 depicts neuron VMM array 3100, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on source lines $SL_0, \ldots, SL_N$, respectively, where each source line $SL_i$ is coupled to the source line terminals of all memory cells in column i.

Figure 32:
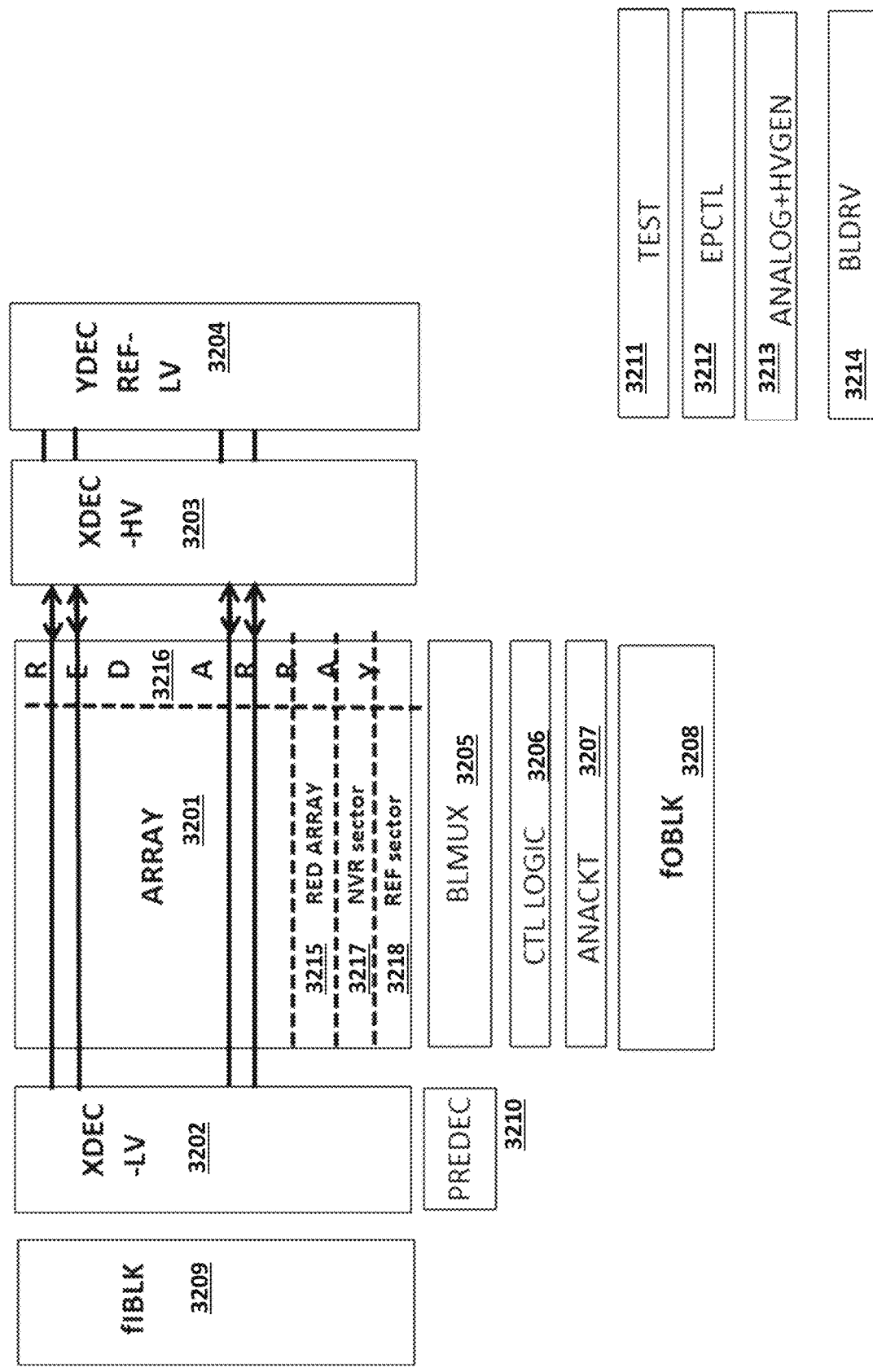
FIG. 32 depicts a VMM system.

FIG. 32 depicts VMM system 3200. VMM system 3200 comprises VMM array 3201 (which can be based on any of the VMM design discussed previously, such as VMM 900, 1000, 1100, 1200, and 1320, or other VMM designs), low voltage row decoder 3202, high voltage row decoder 3203, reference cell low voltage column decoder 3204 (shown in the column direction, meaning that it provides input to output conversion in the row direction), bit line multiplexor 3205, control logic 3206, analog circuitry 3207, neuron output block 3208, input VMM circuit block 3209, predecoders 3210, test circuit 3211, erase-program control logic EPCTL 3212, analog and high voltage generation circuitry 3213, bit line PE driver 3214, redundancy arrays 3215 and 3216, NVR sectors 3217, and reference sectors 3218. The input circuit block 3209 serves as interface from an external input to the input terminals of the memory array. The neuron output block 3208 serves as an interface from the memory array output to the external interface.

Low voltage row decoder 3202 provides a bias voltage for read and program operations and provides a decoding signal for high voltage row decoder 3203. High voltage row decoder 3203 provides a high voltage bias signal for program and erase operations. Reference cell low voltage column decoder 3204 provides a decoding function for the reference cells. Bit line PE driver 3214 provides a controlling function for bit lines during program, verify, and erase operations. Analog and high voltage generation circuitry 3213 is a shared bias block that provides the multiple voltages needed for the various program, erase, program verify, and read operations. Redundancy arrays 3215 and 3216 provide array redundancy for replacing a defective array portion. NVR (non-volatile register aka info sector) sectors 3217 are sectors that are array sectors used to store user info, device ID, password, security key, trimbits, configuration bits, manufacturing info, without limitation.

Figure 33:
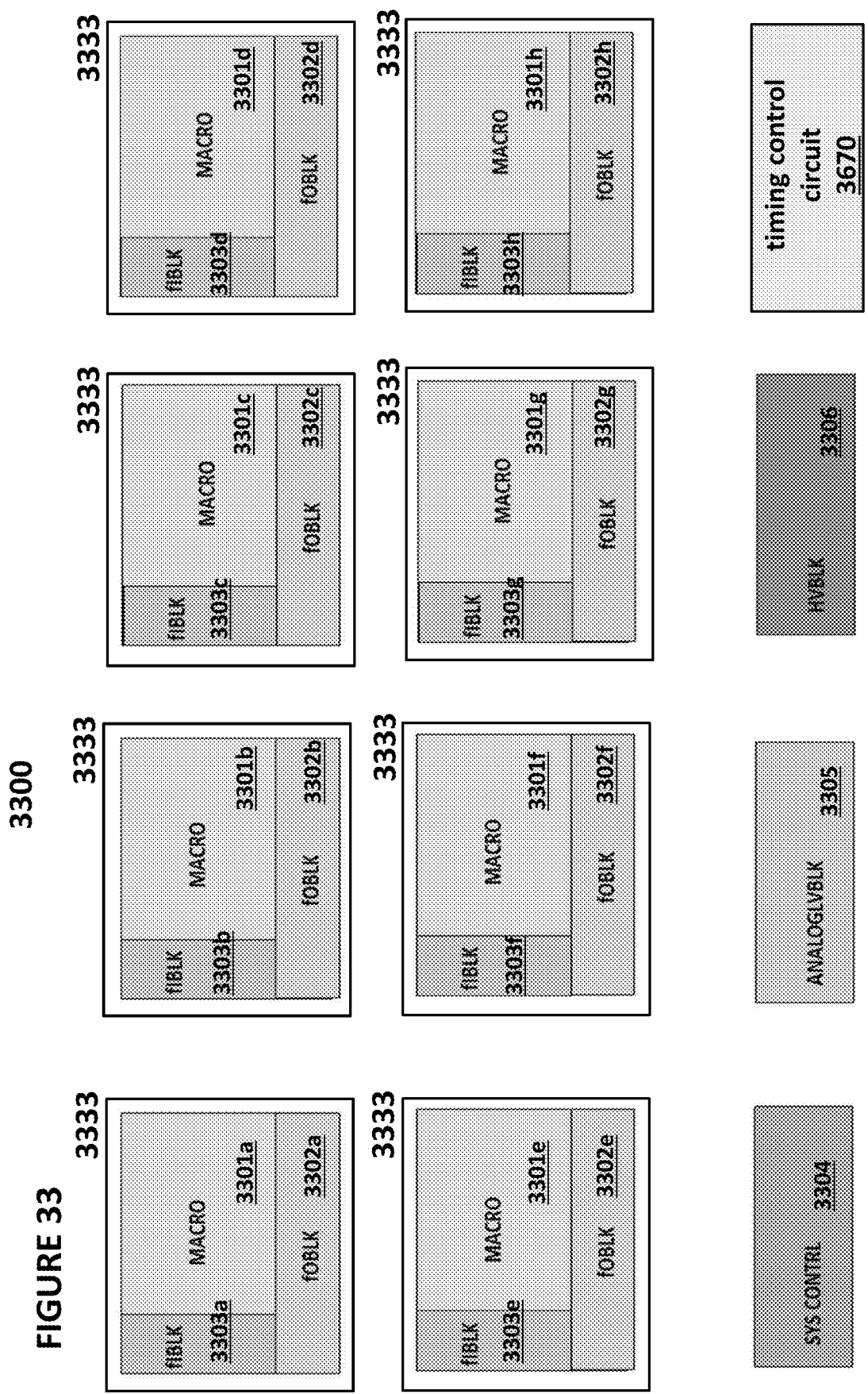
FIG. 33 depicts a flash analog neuro memory system.

FIG. 33 depicts analog neuro memory system 3300. Analog neuro memory system 3300 comprises macro blocks 3301a, 3301b, 3301c, 3301d, 3301e, 3301f, 3301g, and 3301h; neuron output (such as summer circuit and a sample and hold S/H circuit) blocks 3302a, 3302b, 3302c, 3302d, 3302e, 3302f, 3302g, and 3302h; and input circuit blocks 3303a, 3303b, 3303c, 3303d, 3303e, 3303f, 3303g, and 3304h. Each of macro blocks 3301a, 3301b, 3301c, 3301d, 3301e, and 3301f is a VMM sub-system containing a VMM array comprising rows and columns of non-volatile memory cells such as flash memory cells. Neuro memory sub-system 3333 comprises macro block 3301, input block 3303, and neuron output block 3302. Neuro memory sub-system 3333 may have its own digital control block.

Analog neuro memory system 3300 further comprises system control block 3304, analog low voltage block 3305, high voltage block 3306, and timing control circuit 3670, discussed in further detail below with respect to FIG. 36.

System control block 3304 may include one or more microcontroller cores such as ARM/MIPS/RISC_V cores to handle general control function and arithmetic operations. System control block 3304 also may include SIMD (single instruction multiple data) units to operate on multiple data with a single instruction. It may include DSP cores. It may include hardware or software for performing functions such as pooling, averaging, min, max, softmax, add, subtract, multiply, divide, log, anti-log, ReLu, sigmoid, tanh, and data compression, without limitation. It may include hardware or software to perform functions such as activation approximator/quantizer/normalizer. It may include the ability to perform functions such as input data approximator/quantizer/normalizer. It may include hardware or software to perform functions of an activation approximator/quantizer/normalizer. The control block of the neuro memory sub-system 3333 may include similar elements of the system control block 3304 such as microcontroller cores, SIMD cores, DSP cores, and other function units.

In one embodiment, neuron output blocks 3302a, 3302b, 3302c, 3302d, 3302e, 3302f, 3302g, and 3302h each includes a buffer (e.g., op amp) low impedance output type circuit that can drive a long, configurable interconnect. In one embodiment, input circuit blocks 3303a, 3303b, 3303c, 3303d, 3303e, 3303f, 3303g, and 3303h each provide summing, high impedance current outputs. In another embodiment, neuron output blocks 3302a, 3302b, 3302c, 3302d, 3302e, 3302f, 3302g, and 3302h each includes an activation circuit, in which case an additional low impedance buffer is needed to drive the outputs.

In another embodiment, the neuron output blocks 3302a, 3302b, 3302c, 3302d, 3302e, 3302f, 3302g, and 3302h each comprises an analog-to-digital conversion block that outputs digital bits instead of analog signals. In this embodiment, input circuit blocks 3303a, 3303b, 3303c, 3303d, 3303e, 3303f, 3303g, and 3303h each comprises a digital-to-analog conversion block that receives digital bits from the respective neuron output blocks and converts the digital bits into analog signals.

Thus, neuron output blocks 3302a, 3302b, 3302c, 3302d, 3302e, 3302f, 3302g, and 3302h receives output current from macro blocks 3301a, 3301b, 3301c, 3301d, 3301e, and 3301f and optionally converts that output current into an analog voltage, digital bits, or one or more digital pulses where the width of each pulse or the number of pulses varies in response to the value of the output current. Similarly, input circuit blocks 3303a, 3303b, 3303c, 3303d, 3303e, 3303f, 3303g, and 3303h optionally receives analog current, analog voltage, digital bits, or digital pulses where the width of each pulse or the number of pulses varies in response to the value of the output current and provides analog current to macro blocks 3301a, 3301b, 3301c, 3301d, 3301e, and 3301f. Input circuit blocks 3303a, 3303b, 3303c, 3303d, 3303e, 3303f, 3303g, and 3303h optionally comprises a voltage-to-current converter, an analog or digital counter for counting the number of digital pulses in an input signal or the length of the width of a digital pulse in an input signal, or a digital-to-analog converter.

Long Short-Term Memory

Figure 16:
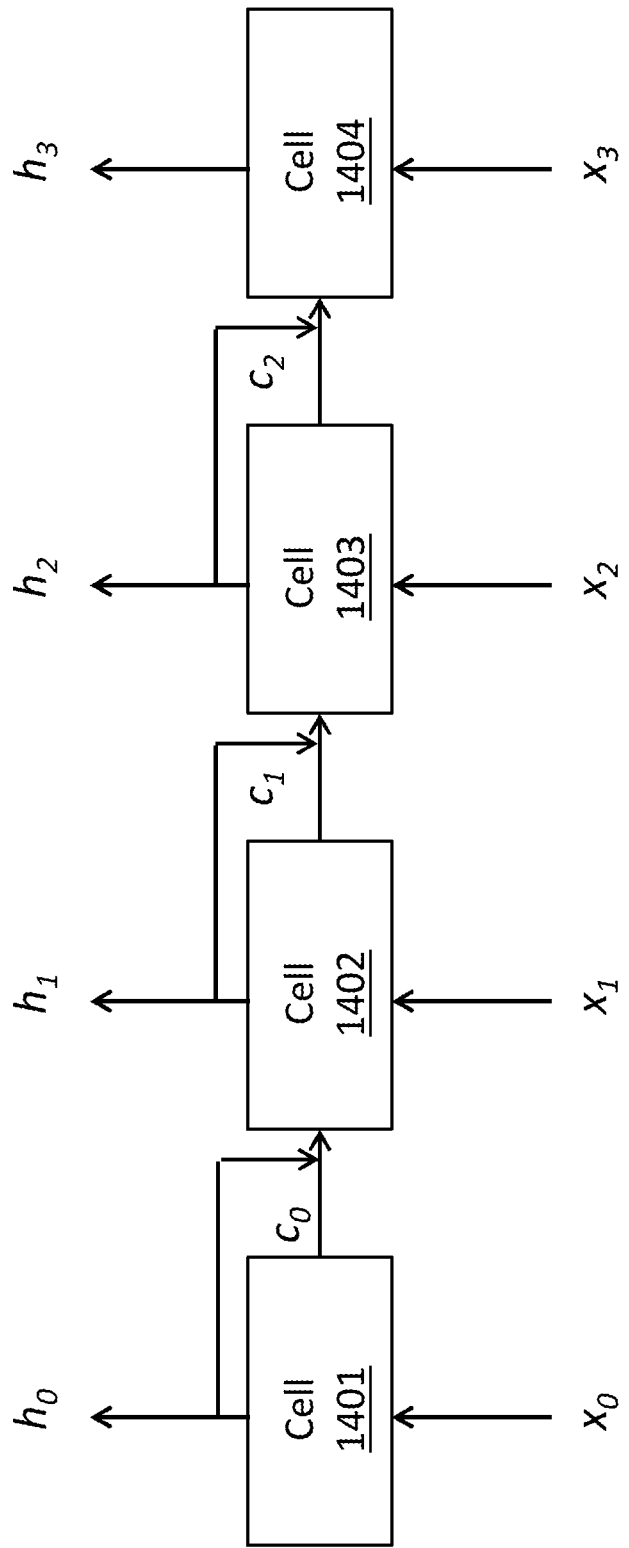
FIG. 16 depicts a prior art long short term memory system.

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM FIG. 16 depicts an exemplary LSTM 1600. LSTM 1600 in this example comprises cells 1601, 1602, 1603, and 1604. Cell 1601 receives input vector $x_0$ and generates output vector $h_0$ and cell state vector $c_0$. Cell 1602 receives input vector $x_1$, the output vector (hidden state) $h_0$ from cell 1601 and cell state $c_0$ from cell 1601 and generates output vector $h_1$ and cell state vector $c_1$. Cell 1603 receives input vector the output vector (hidden state) $h_1$ from cell 1602, and cell state $c_1$ from cell 1602 and generates output vector $h_2$ and cell state vector $c_2$. Cell 1604 receives input vector $x_3$, the output vector (hidden state) $h_2$ from cell 1603, and cell state $c_2$ from cell 1603 and generates output vector $h_3$. Additional cells can be used, and an LSTM with four cells is merely an example.

Figure 17:
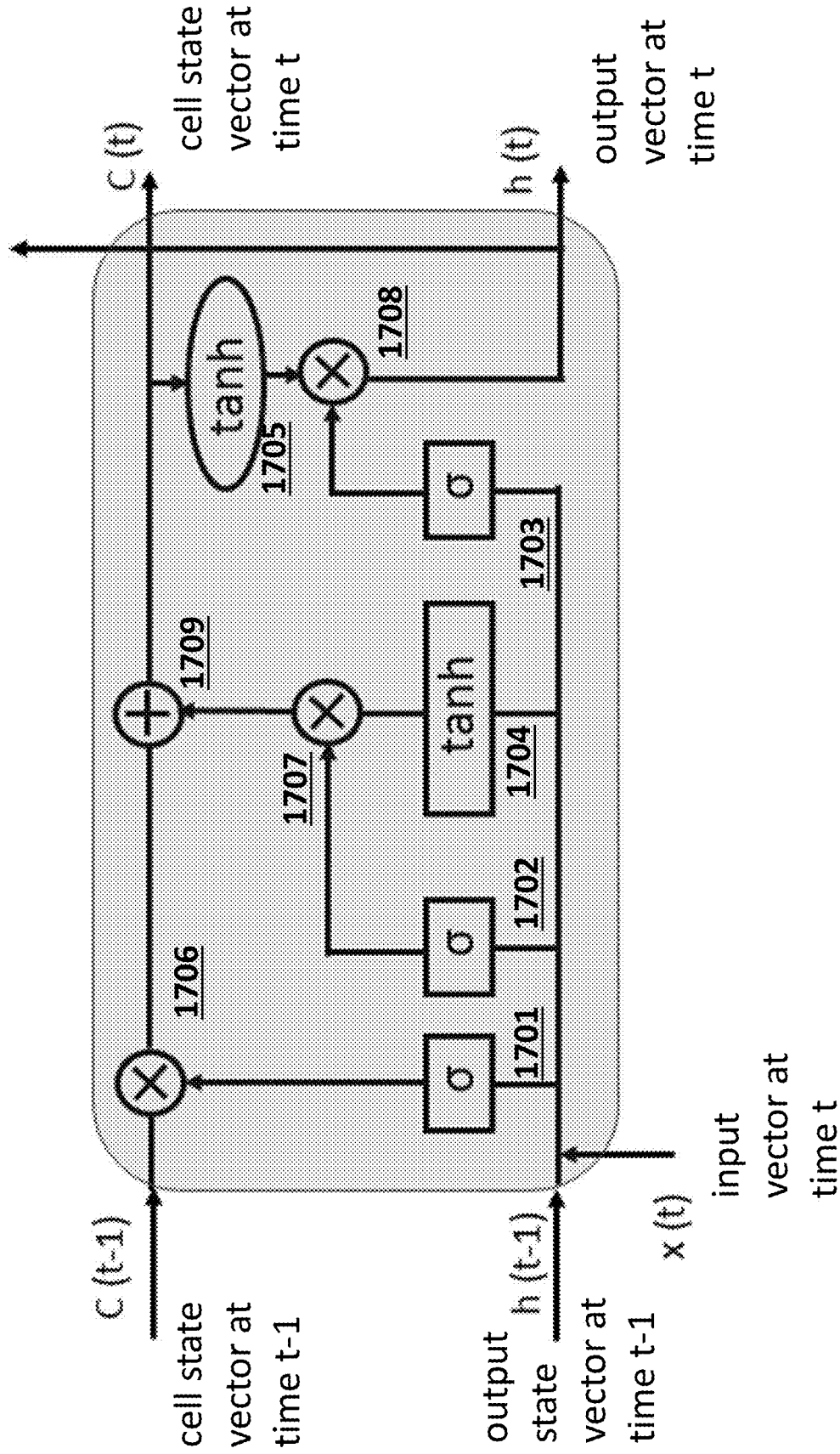
FIG. 17 depicts an exemplary cell for use in a long short term memory system.

FIG. 17 depicts an exemplary implementation of an LSTM cell 1700, which can be used for cells 1601, 1602, 1603, and 1604 in FIG. 16. LSTM cell 1700 receives input vector x(t), cell state vector c(t−1) from a preceding cell, and output vector h(t−1) from a preceding cell, and generates cell state vector c(t) and output vector h(t).

LSTM cell 1700 comprises sigmoid function devices 1701, 1702, and 1703, each of which applies a number between 0 and 1 to control how much of each component in the input vector is allowed through to the output vector. LSTM cell 1700 also comprises tanh devices 1704 and 1705 to apply a hyperbolic tangent function to an input vector, multiplier devices 1706, 1707, and 1708 to multiply two vectors together, and addition device 1709 to add two vectors together. Output vector h(t) can be provided to the next LSTM cell in the system, or it can be accessed for other purposes.

Figure 18:
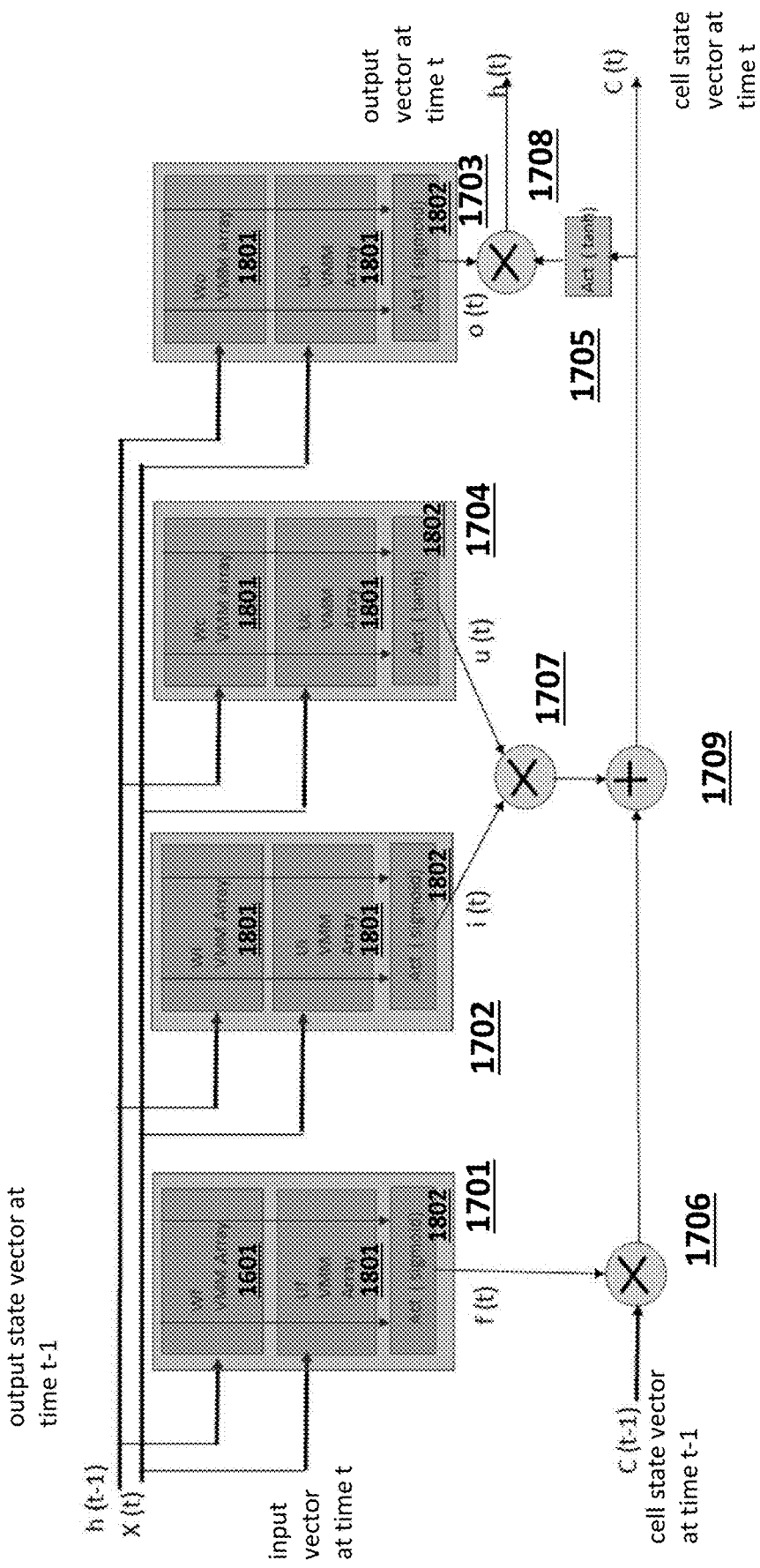
FIG. 18 depicts an embodiment of the exemplary cell of FIG. 17.

FIG. 18 depicts an LSTM cell 1800, which is an example of an implementation of LSTM cell 1700. For the reader's convenience, the same numbering from LSTM cell 1700 is used in LSTM cell 1800. Sigmoid function devices 1701, 1702, and 1703 and tanh device 1704 each comprise multiple VMM arrays 1801 and activation circuit blocks 1802. Thus, it can be seen that VMM arrays are particular useful in LSTM cells used in certain neural network systems. The multiplier devices 1706, 1707, and 1708 and the addition device 1709 are implemented in a digital manner or in an analog manner. The activation function blocks 1802 can be implemented in a digital manner or in an analog manner.

Figure 19:
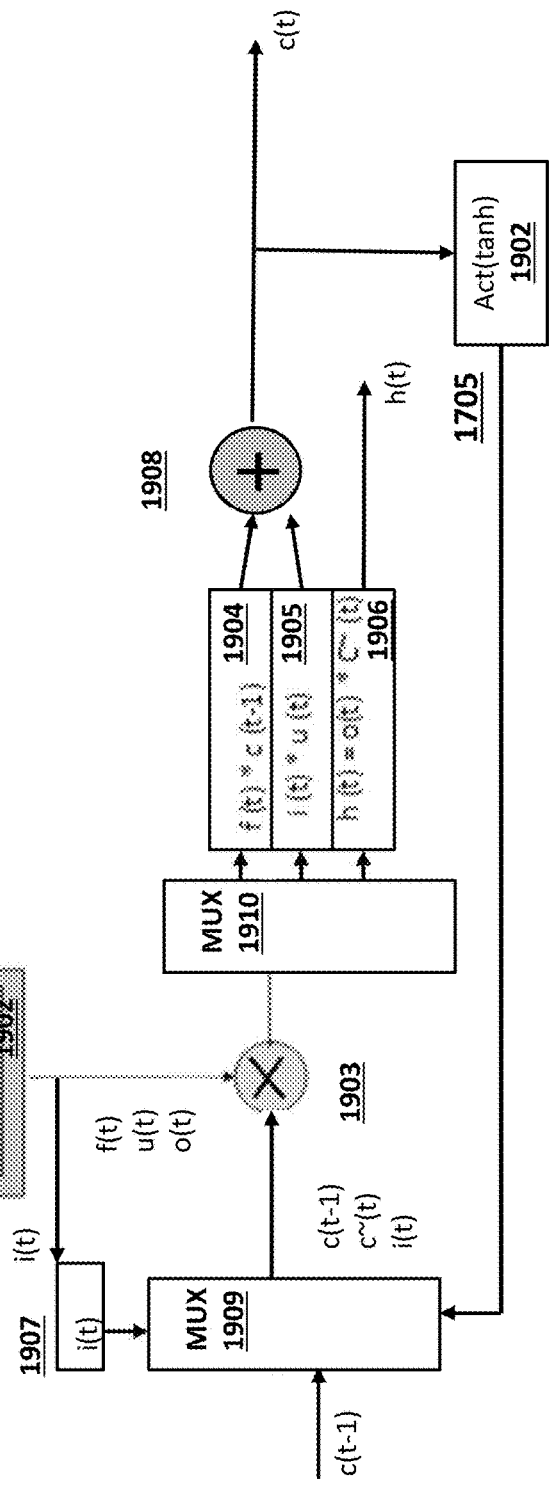
FIG. 19 depicts another embodiment of the exemplary cell of FIG. 17.

An alternative to LSTM cell 1800 (and another example of an implementation of LSTM cell 1700) is shown in FIG. 19. In FIG. 19, sigmoid function devices 1701, 1702, and 1703 and tanh device 1704 share the same physical hardware (VMM arrays 1901 and activation function block 1902) in a time-multiplexed fashion. LSTM cell 1900 also comprises multiplier device 1903 to multiply two vectors together, addition device 1908 to add two vectors together, tanh device 1705 (which comprises activation circuit block 1902), register 1907 to store the value i(t) when i(t) is output from sigmoid function block 1902, register 1904 to store the value f(t)*c(t−1) when that value is output from multiplier device 1903 through multiplexor 1910, register 1905 to store the value i(t) u(t) when that value is output from multiplier device 1903 through multiplexor 1910, and register 1906 to store the value o(t)*c~(t) when that value is output from multiplier device 1903 through multiplexor 1910, and multiplexor 1909.

Whereas LSTM cell 1800 contains multiple sets of VMM arrays 1801 and respective activation function blocks 1802, LSTM cell 1900 contains only one set of VMM arrays 1901 and activation function block 1902, which are used to represent multiple layers in the embodiment of LSTM cell 1900. LSTM cell 1900 will require less space than LSTM 1800, as LSTM 1900 will require ¼ as much space for VMMs and activation function blocks compared to LSTM cell 1800.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 20:
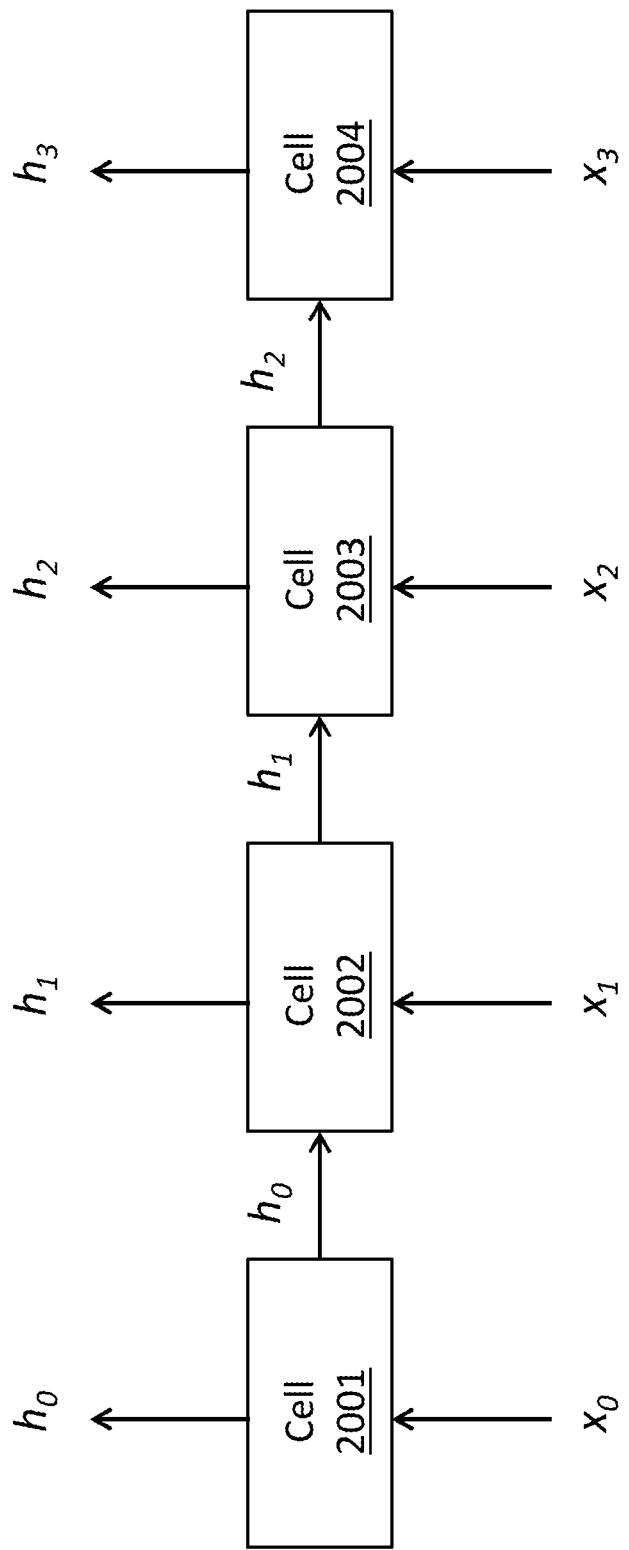
FIG. 20 depicts a prior art gated recurrent unit system.

FIG. 20 depicts an exemplary GRU 2000. GRU 2000 in this example comprises cells 2001, 2002, 2003, and 2004. Cell 2001 receives input vector $x_0$ and generates output vector $h_0$. Cell 2002 receives input vector $x_1$, the output vector $h_0$ from cell 2001 and generates output vector $h_1$. Cell 2003 receives input vector x and the output vector (hidden state) $h_1$ from cell 2002 and generates output vector $h_2$. Cell 2004 receives input vector $x_3$ and the output vector (hidden state) $h_2$ from cell 2003 and generates output vector $h_3$. Additional cells can be used, and an GRU with four cells is merely an example.

Figure 21:
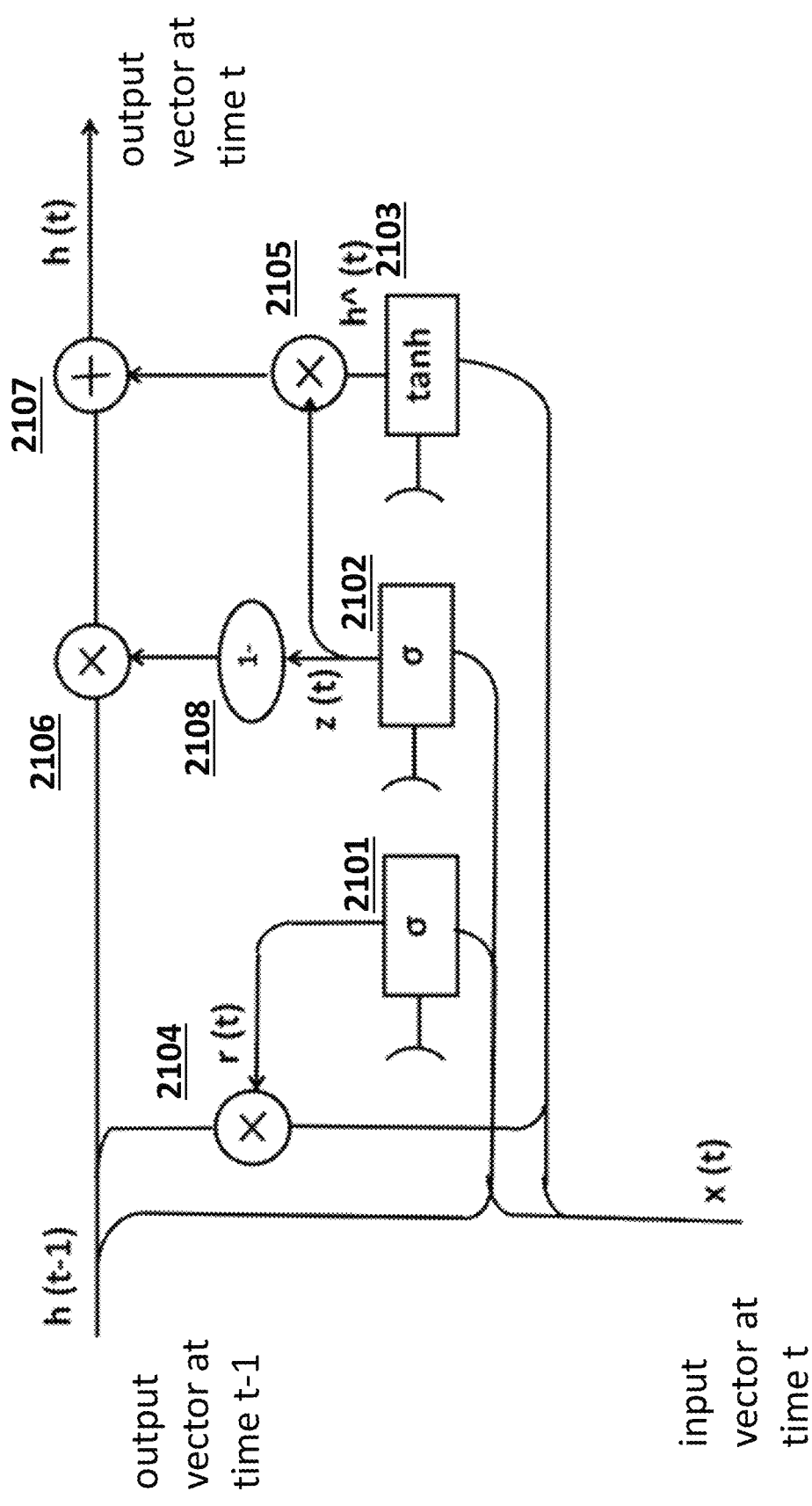
FIG. 21 depicts an exemplary cell for use in a gated recurrent unit system.

FIG. 21 depicts an exemplary implementation of a GRU cell 2100, which can be used for cells 2001, 2002, 2003, and 2004 of FIG. 20. GRU cell 2100 receives input vector x(t) and output vector h(t-1) from a preceding GRU cell and generates output vector h(t). GRU cell 2100 comprises sigmoid function devices 2101 and 2102, each of which applies a number between 0 and 1 to components from output vector h(t-1) and input vector x(t). GRU cell 2100 also comprises a tanh device 2103 to apply a hyperbolic tangent function to an input vector, a plurality of multiplier devices 2104, 2105, and 2106 to multiply two vectors together, an addition device 2107 to add two vectors together, and a complementary device 2108 to subtract an input from 1 to generate an output.

Figure 22:
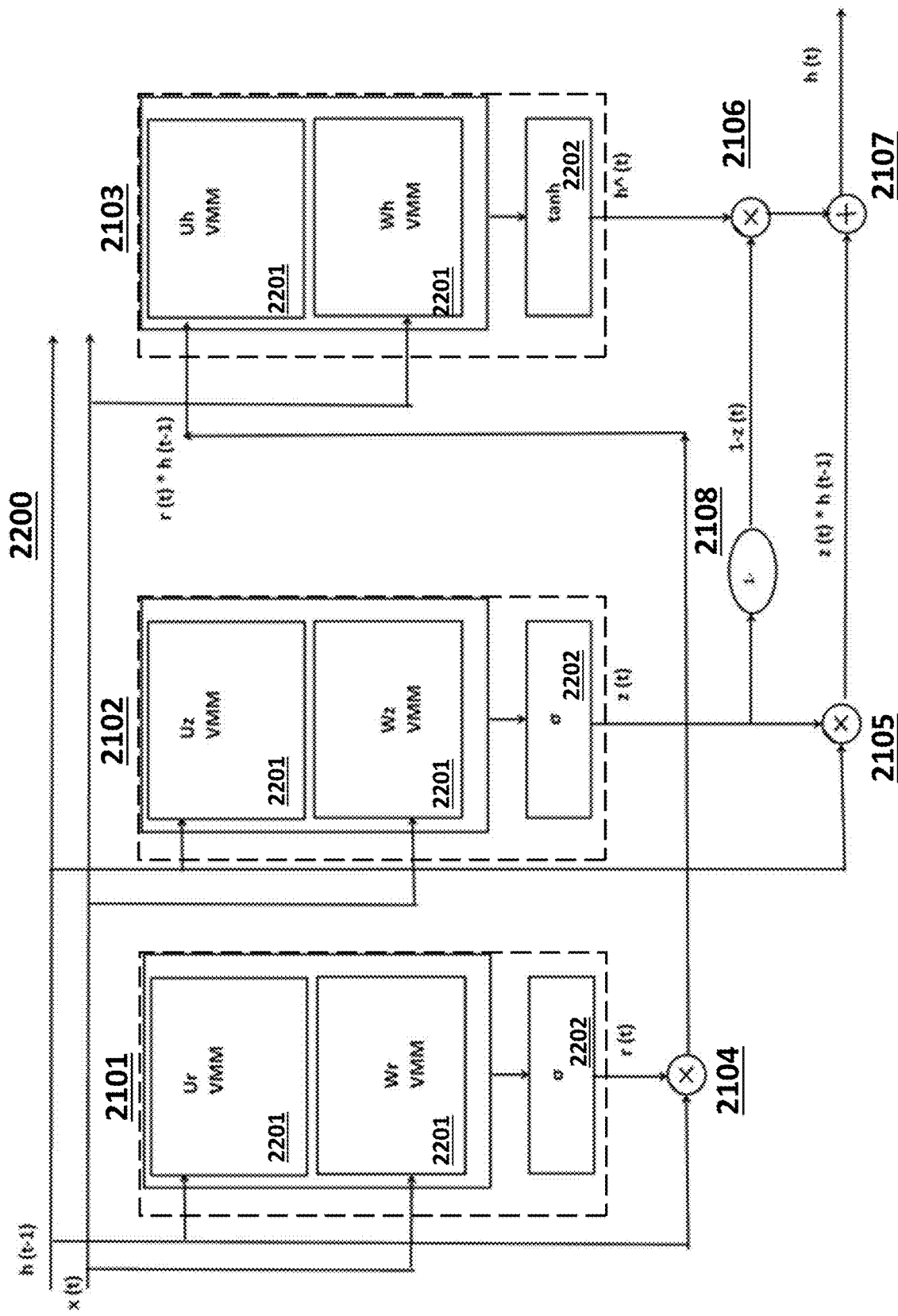
FIG. 22 depicts an embodiment of the exemplary cell of FIG. 21.

FIG. 22 depicts a GRU cell 2200, which is an example of an implementation of GRU cell 2100. For the reader's convenience, the same numbering from GRU cell 2100 is used in GRU cell 2200, As can be seen in FIG. 22, sigmoid function devices 2101 and 2102, and tanh device 2103 each comprise multiple VMM arrays 2201 and activation function blocks 2202, Thus, it can be seen that VMM arrays are of particular use in GRU cells used in certain neural network systems. The multiplier devices 2104, 2105, 2106, the addition device 2107, and the complementary device 2108 are implemented in a digital manner or in an analog manner. The activation function blocks 2202 can be implemented in a digital manner or in an analog manner.

Figure 23:
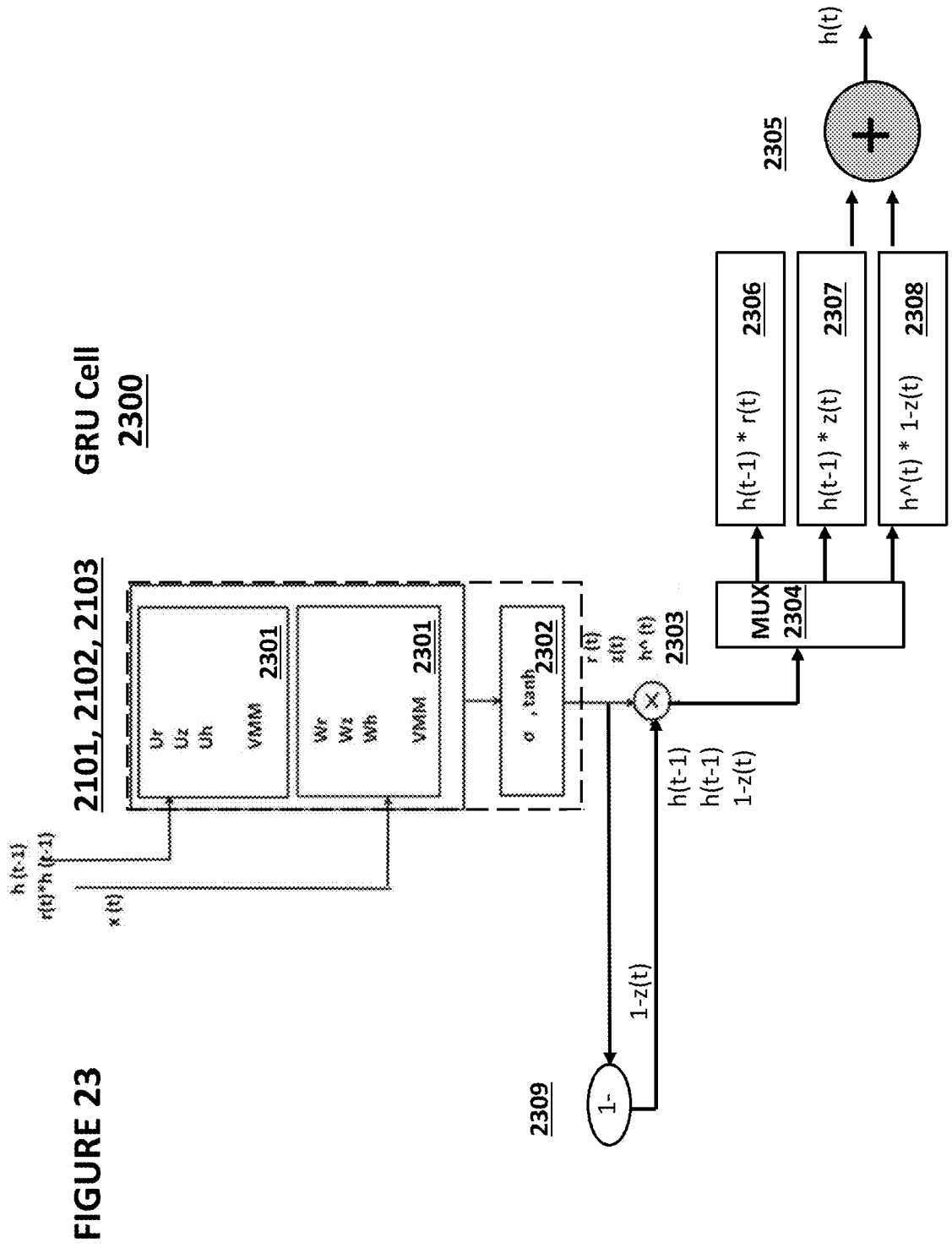
FIG. 23 depicts another embodiment of the exemplary cell of FIG. 21.

An alternative to GRU cell 2200 (and another example of an implementation of GRU cell 2300) is shown in FIG. 23. In FIG. 23, GRU cell 2300 utilizes VMM arrays 2301 and activation function block 2302, which when configured as a sigmoid function applies a number between 0 and 1 to control how much of each component in the input vector is allowed through to the output vector. In FIG. 23, sigmoid function devices 2101 and 2102 and tanh device 2103 share the same physical hardware (VMM arrays 2301 and activation function block 2302) in a time-multiplexed fashion, GRU cell 2300 also comprises multiplier device 2303 to multiply two vectors together, addition device 2305 to add two vectors together, complementary device 2309 to subtract an input from 1 to generate an output, multiplexor 2304, register 2306 to hold the value h(t-1)*r(t) when that value is output from multiplier device 2303 through multiplexor 2304, register 2307 to hold the value h(t-1)*z(t) when that value is output from multiplier device 2303 through multiplexor 2304, and register 2308 to hold the value h^(t)*(1-z(t)) when that value is output from multiplier device 2303 through multiplexor 2304.

Whereas GRU cell 2200 contains multiple sets of VMM arrays 2201 and activation function blocks 2202, GRU cell 2300 contains only one set of VMM arrays 2301 and activation function block 2302, which are used to represent multiple layers in the embodiment of GRU cell 2300. GRU cell 2300 will require less space than GRU cell 2200, as GRU cell 2300 will require ⅓ as much space for VMMs and activation function blocks compared to GRU cell 2200.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

Output Circuitry

FIG. 34A depicts integrating dual-mixed slope analog-to-digital converter (ADC) 3400 applied to an output neuron, $I_{NEU}$ 3406, to convert the output neuron current into digital pulses or digital output bits.

In one embodiment, ADC 3400 converts an analog output current in a neuron output block (such as neuron output blocks 3302a, 3302b. 3302c, 3302d, 3302e, 3302f, 3302g, and 3302h in FIG. 32) into a digital pulse whose width varies in proportion to the magnitude of the analog output current in the neuron output block. An integrator comprising integrating op-amp 3401 and integrating capacitor 3402 integrates a memory array current $I_{NEU}$ 3406 (which is the output neuron current) versus a reference current IREF 3407.

Optionally, IREF 3407 can comprise a bandgap filter with a temperature coefficient of 0 or with a temperature coefficient that tracks the neuron current, $I_{NEU}$ 3406. The latter optionally can be obtained from a reference array containing values determined during a testing phase.

Figure 34B:
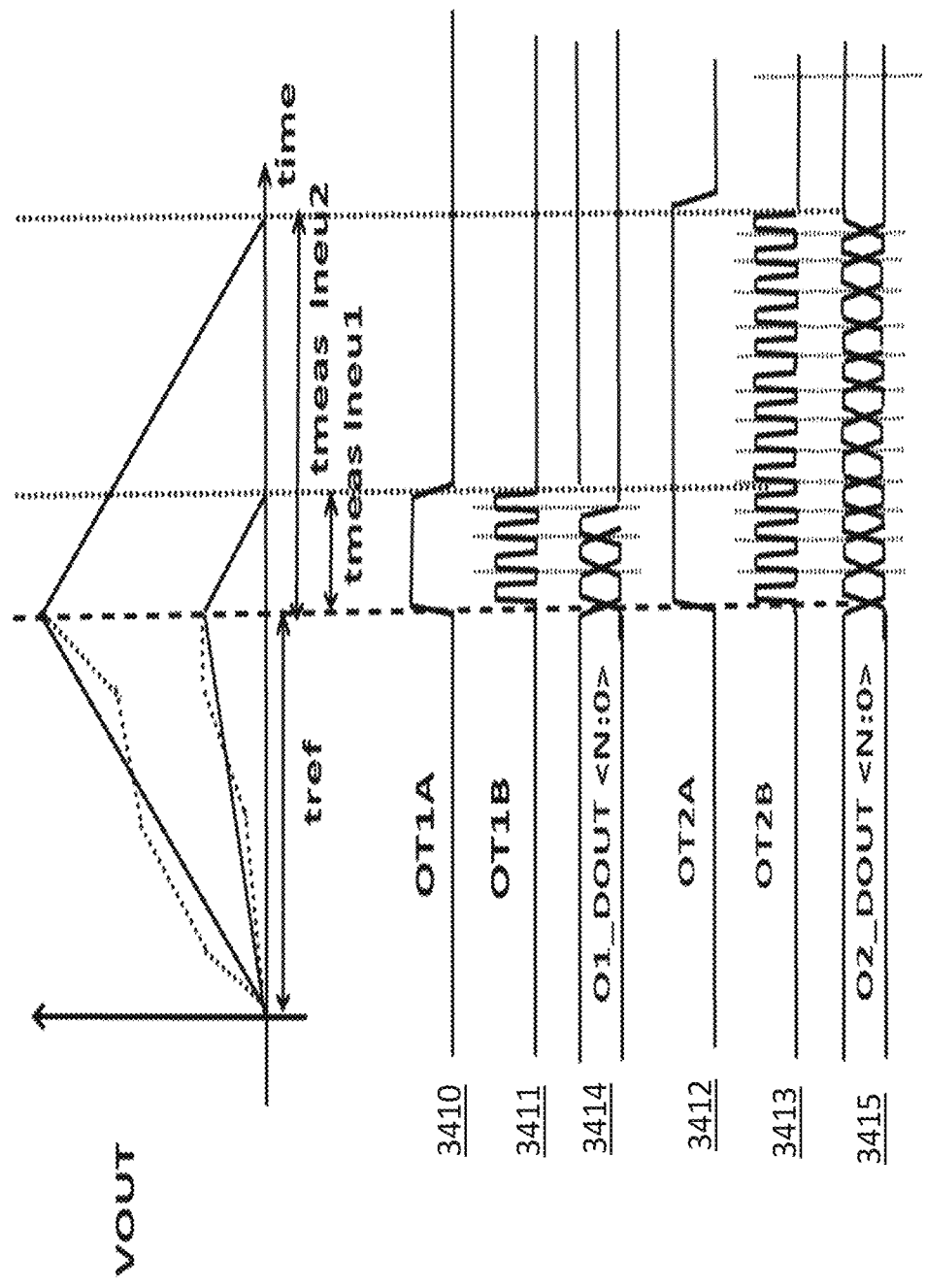
FIG. 34B depicts voltage characteristics of the integrating analog-to-digital converter of FIG. 34A.
Figure 35A:
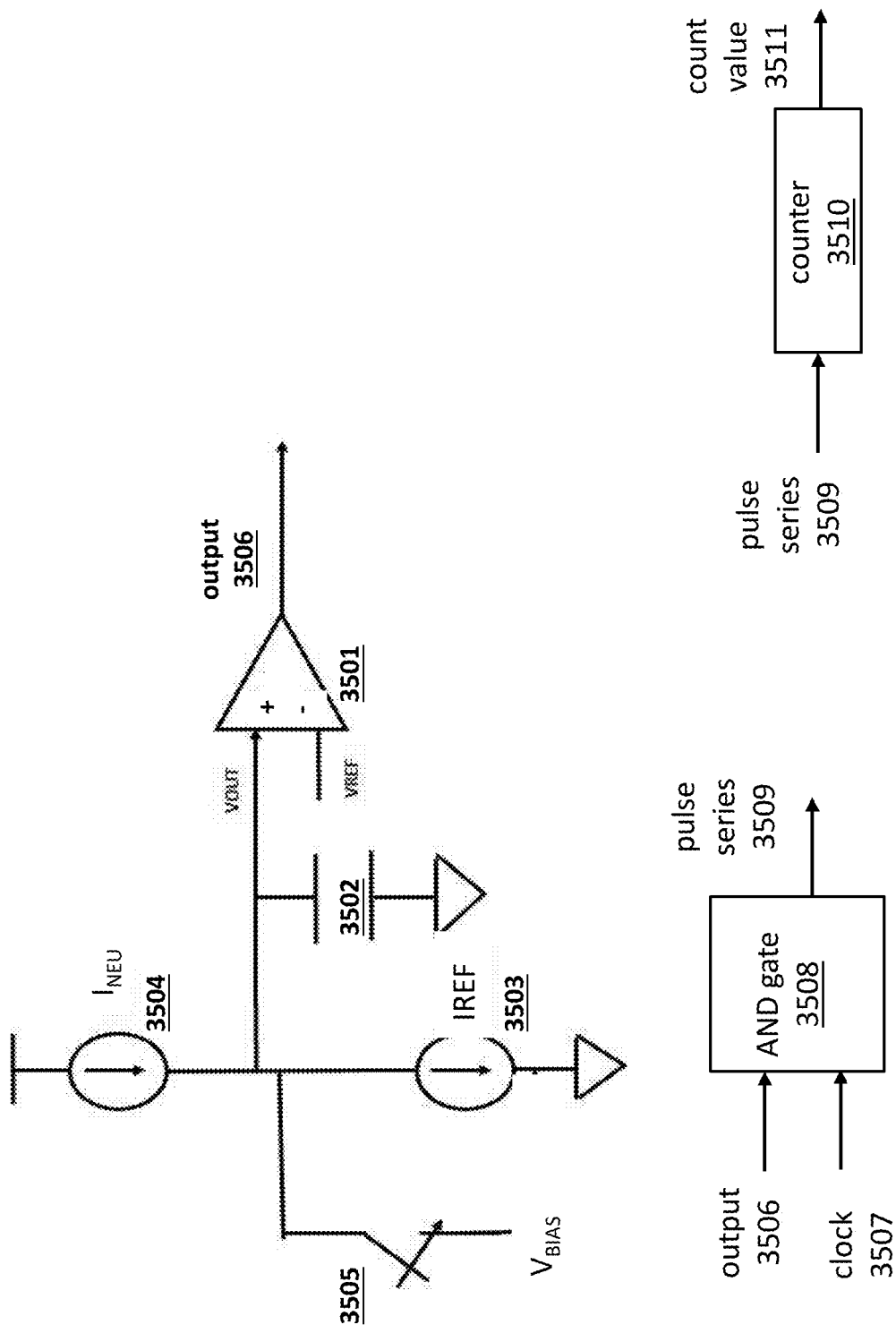
FIG. 35A depicts an integrating analog-to-digital converter.
Figure 35B:
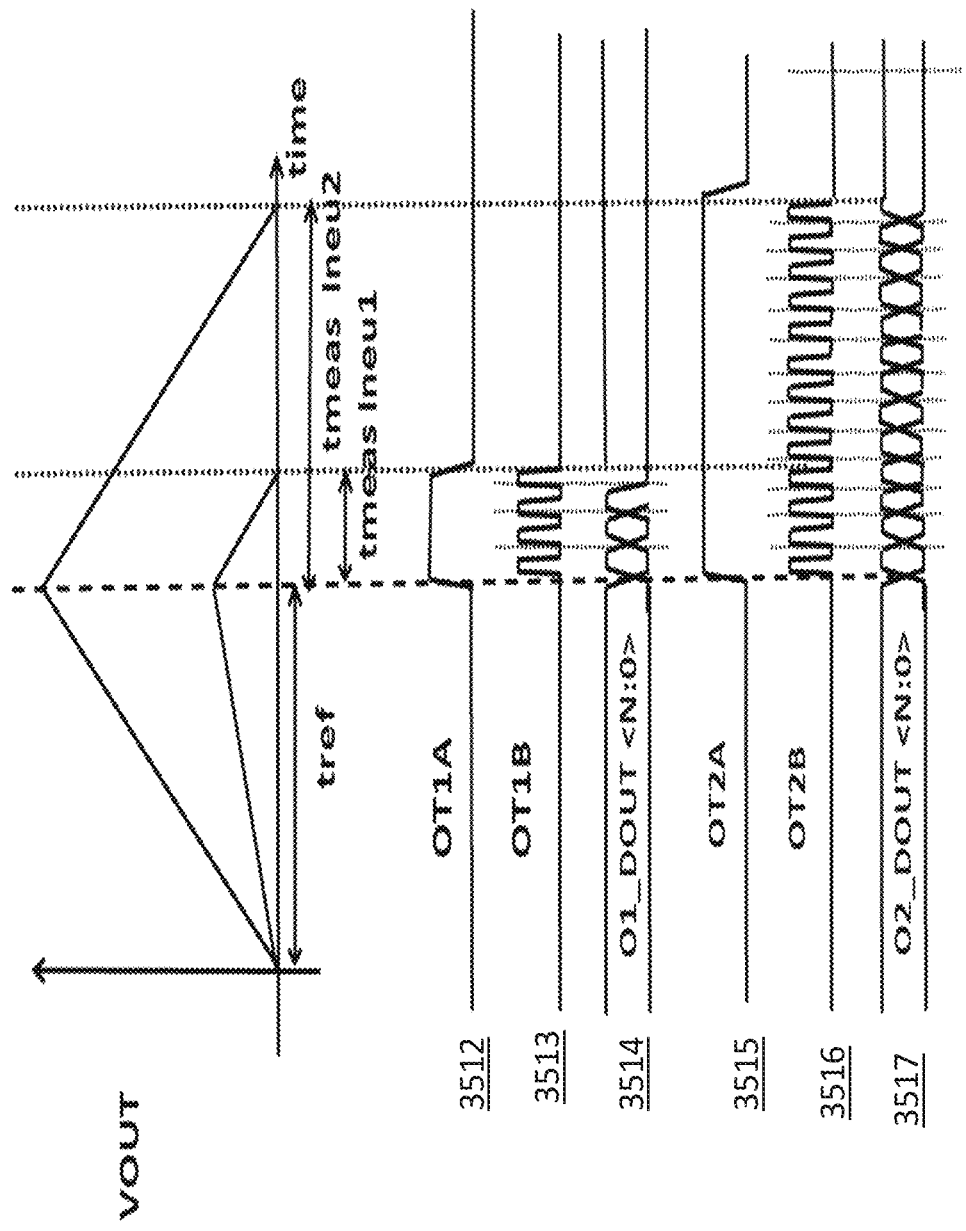
FIG. 35B depicts voltage characteristics of the integrating analog-to-digital converter of FIG. 35A.

Optionally, a calibration step can be performed while the circuit is at or above operating temperature to offset any leakage current that is present within the array or a control circuit, and that offset value thereafter can be subtracted from Ineu in FIG. 34B or FIG. 35B During an initialization phase, switch 3408 is closed. Vout 3403 and the input to the negative terminal of operational amplifier 3401 then will become VREF. Thereafter, as shown in FIG. 34B, switch 33408 is opened and during a fixed time period tref, the neuron current $I_{NEU}$ 3406 is up-integrated. During the fixed time period tref, Vout rises, and its slope changes as neuron current changes. Thereafter, during a period tmeas, a constant reference current IREF is down integrated for a time period tmeas (during which period Vout falls), where tmeas is the time required to down integrate Vout to VREF.

Output EC 3405 will be high when VOUT>VREFV and will be low otherwise. EC3405 therefore generates a pulse whose width reflects the period tmeas, which in turn is proportional to the current $I_{NEU}$ 3406. In FIG. 34B, EC3405 is shown as waveform 3410 in the example where tmeas=Ineu1, and waveform 3412 in the example where tmeas=Ineu2. Thus, the output neuron current $I_{NEU}$ 3406 is converted into a digital pulse EC 3405, where the width of digital pulse EC 3405 varies in proportion to the magnitude of output neuron current $I_{NEU}$ 3406.

The current $I_{NEU}$ 3406 is =tmeas/tref*IREF. For example, for a desired output bit resolution of 10 bits, tref is a time period equal to 1024 clock cycles. The period tmeas varies from a period equal to 0 to 1024 clock cycles depending on the value of $I_{NEU}$ 3406 and the value of Iref. FIG. 34B shows examples of two different values for $I_{NEU}$ 3406, one where $I_{NEU}$ 3406=Ineu1 and one with $I_{NEU}$ 3406=Ineu2. Thus, the neuron current $I_{NEU}$ 3406 affects the rate and slope of charging.

Optionally, the output pulse EC 3405 can be converted into a series of pulses of uniform period for transmission to the next stage of circuitry, such as the input block of another VMM array. At the beginning of period tmeas, output EC 3405 is input into AND gate 3440 with reference clock 3441. The output will be pulse series 3442 (where the frequency of the pulses in pulse series 3442 is the same as the frequency of clock 3441) during the period when VOUT>VREF. The number of pulses is proportional to the period tmeas, which is proportional to the current $I_{NEU}$ 3406.

Optionally, pulse series 3443 can be input to counter 3420, which will count the number of pulses in pulse series 3442 and will generate count value 3421, which is a digital count of the number of pulses in pulse series 3442, which is directly proportional to neuron current $I_{NEU}$ 3406. Count value 3421 comprises a set of digital bits In another embodiment, integrating dual-slope ADC 3400 can convert neuron current $I_{NEU}$ 3407 into a pulse where the width of the pulse is inversely proportionally to the magnitude of neuron current $I_{NEU}$ 3407. This inversion can be done in a digital or analog manner, and converted into a series of pulses, or digital bits for output to follow on circuitry FIG. 35A shows integrating dual-mixed slope ADC 3500 applied to an output neuron, $I_{NEU}$ 3504, to convert the cell current into a digital pulse of varying width or into a series of digital output bits. For example, ADC 3500 can be used to convert an analog output current in a neuron output block (such as neuron output blocks 3302a, 3302b. 3302c, 3302d, 3302e, 3302f, 3302g, and 3302h in FIG. 32) into a set of digital output bits. An integrator comprising integrating op-amp 3501 and integrating capacitor 3502 integrates a neuron current $I_{NEU}$ 3504 versus a reference current IREF 3503. Switch 3505 can be closed to reset the VOUT.

During an initialization phase, switch 3505 is closed, and VOUT is charged to a voltage $V_{BIAS}$.

Thereafter, as shown in FIG. 35B, switch 3505 is opened, and during a fixed time tref, the cell current $I_{NEU}$ 3504 is up integrated. Thereafter, reference current IREF 3503 is down integrated for a time tmeas until Vout falls to ground. The current $I_{NEU}$ 3504=tmeas Ineu/tref*IREF. For example, for a desired output bit resolution of 10 bits, tref is a time period equal to 1024 clock cycles. The period tmeas varies from a period equal to 0 to 1024 clock cycles depending on the value of $I_{NEU}$ 3504 and Iref. FIG. 35B shows examples of two different Ineu values, one with current Ineu1 and one with current Ineu2. Thus, the neuron current $I_{NEU}$ 3504 affects the rate and slope of charge and discharge.

Output 3506 will be high when VOUT>VREF and will be low otherwise. Output 3506 therefore generates a pulse whose width reflects the period tmeas, which in turn is proportional to the current $I_{NEU}$ 3404. In FIG. 35B, output 3506 is shown as waveform 3512 in the example where tmeas=Ineu1, and waveform 3515 in the example where tmeas=Ineu2. Thus, the output neuron current $I_{NEU}$ 3504 is converted into a pulse, output 3506, where the width of the pulse varies in proportion to the magnitude of output neuron current $I_{NEU}$ 3504.

Optionally, output 3506 can be converted into a series of pulses of a uniform period for transmission to the next stage of circuitry, such as an input block of another VMM array. At the beginning of period tmeas, output 3506 is input into AND gate 3508 with reference clock 3507. The output will be pulse series 3509 (where the frequency of the pulses in pulse series 3509 is the same as the frequency of reference clock 3507) during the period when VOUT>VREF. The number of pulses is proportional to the period tmeas, which is proportional to the current $I_{NEU}$ 3504.

Optionally, pulse series 3509 can be input to counter 3510, which will count the number of pulses in pulse series 3509 and will generate count value 3511, which is a digital count of the number of pulses in pulse series 3509, which is directly proportional to neuron current $I_{NEU}$ 3504 as illustrated by waveforms 3514, 3517. Count value 3511 comprises a set of digital bits.

In another embodiment, integrating dual-slope ADC 3500 can convert neuron current $I_{NEU}$ 3504 into a pulse where the width of the pulse is inversely proportionally to the magnitude of neuron current $I_{NEU}$ 3504. This inversion can be done in a digital or analog manner, and converted into one or more pulses, or digital bits for output to follow on circuitry.

FIG. 35B depicts count value 3511 (digital bits) for two neuron current values Ineu1 and Ineu2, respectively, for $I_{NEU}$ 3504.

Figures 36A, 36B:
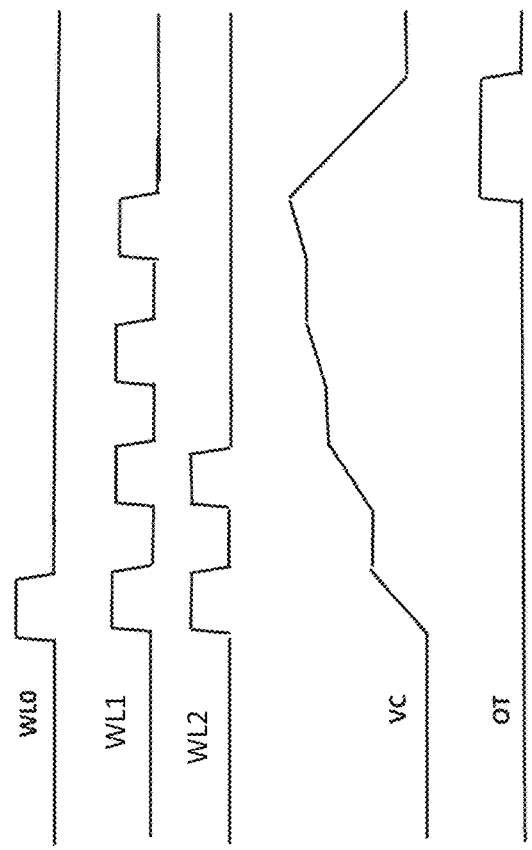
FIGS. 36A and 36B depict waveforms for examples of operation of the analog-to-digital converters of FIGS. 34A and 35A.

FIGS. 36A and 36B depict waveforms associated with exemplary methods 3600 and 3650 performed in a VMM during operation. In each method 3600 and 3650, word lines WL0, WL1, and WL2 receive a variety of different inputs, which optionally can be converted into analog voltage waveforms to apply to the word lines. In these examples, the voltages VC represents the voltage on integrating capacitor 3402 or 3502 in FIGS. 34A and 35A, respectively, in ADC 3400 or 3500 in an output block of a first VMM, and OT pulse (='1') represents the period in which the output of the neuron (that is proportional to value of the neuron) is captured using integrating dual-slope ADC 3400 or 3500. As described with reference to FIGS. 34 and 35, the output of the output block can be a pulse of width that varies in proportion to the output neuron current of the first VMM, or it can be a series of pulses of uniform width where the number of pulses varies in proportion to the neuron current of the first VMM. Those pulses then can be applied as inputs to a second VMM.

During method 3600, the series of pulses (such as pulse series 3442 or pulse series 3509), or an analog voltage derived from the series of pulses, are applied into the wordlines of the second VMM array. Alternatively, the series of pulses, or an analog voltage derived from the series of pulses, can be applied to the control gates of cells within the second VMM array. The number of pulses (or clock cycles) directly correspond to the magnitude of the input. In this particular example, the magnitude of the input on WL1 is 4× vs. that of WL0 (4 pulses vs. 1 pulse).

During method 3650, single pulses of varying width (such as EC 3405 or output 3506), or an analog voltage derives from the single pulses, are applied into the wordlines of the second VMM array, but the pulses have a variable pulse width. Alternatively, the pulses, or an analog voltage derives from the pulses, can be applied to the control gates. The width of a single pulse directly corresponds to the magnitude of the input. For example, the magnitude of the input on WL1 is 4× vs. that of WL0 (WL1 pulse width is 4× vs. that of WL0).

Figure 36C:
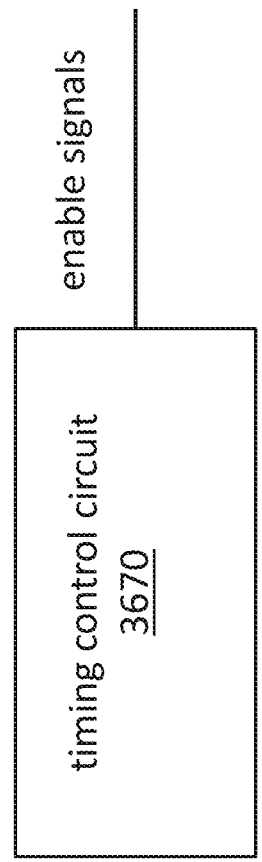
FIG. 36C depicts a timing control circuit.
Figure 56:
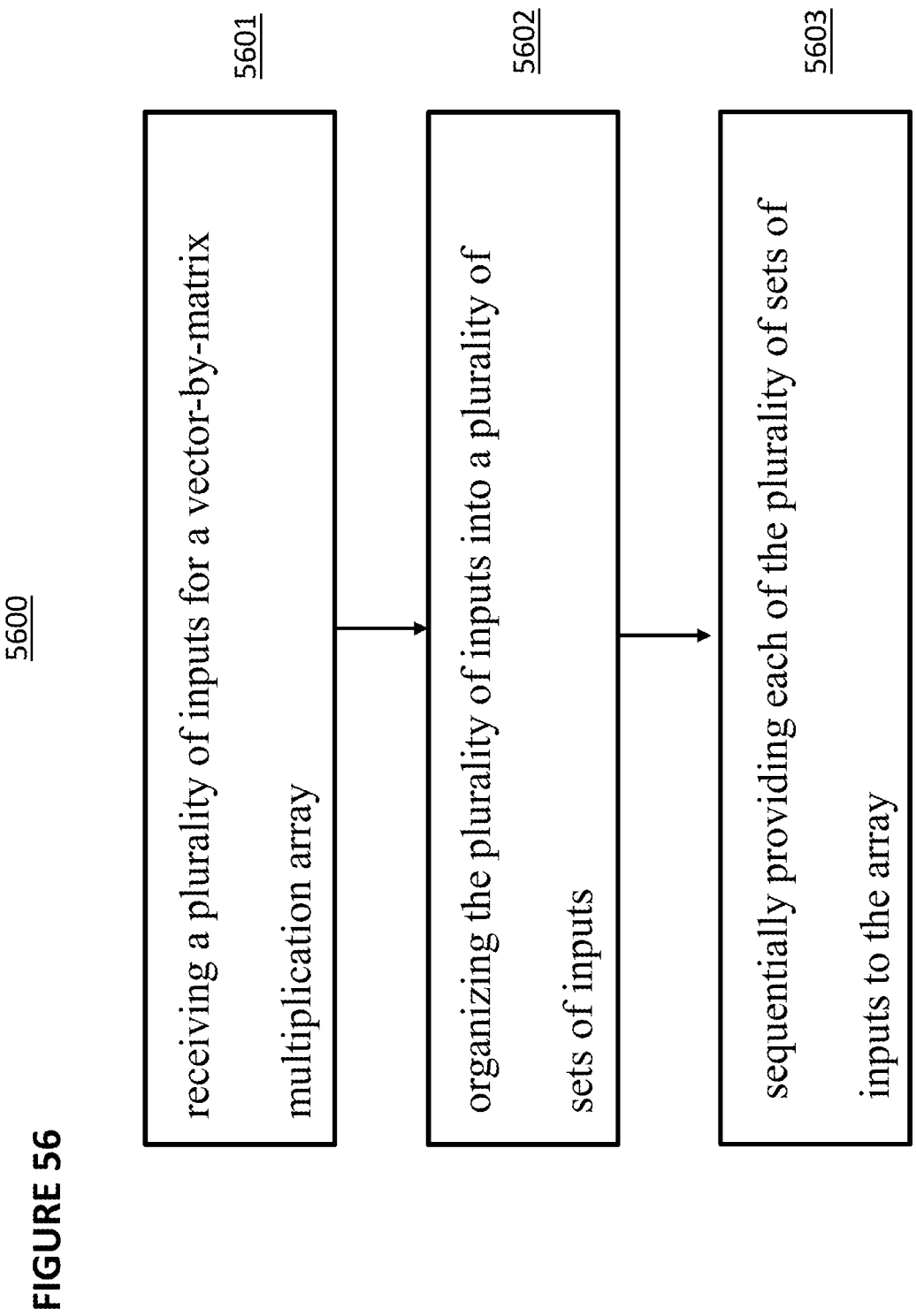
FIG. 56 depicts a power management method.

Furthermore, with reference to FIG. 36C, timing control circuit 3670 can be used to manage the power of the VMM systems by managing the output and input interfaces of the VMM array and sequentially splitting the conversion of various outputs or various inputs. FIG. 56 depicts power management method 5600. The first step is receiving a plurality of inputs for a vector-by-matrix multiplication array (step S601). The second step is organizing the plurality of inputs into a plurality of sets of inputs (step S602). The third step is sequentially providing each of the plurality of sets of inputs to the array (step S603).

An embodiment of power management method 5600 is the following. The inputs to the VMM systems (such as wordlines or control gates of VMM arrays) can be applied sequentially over time. For instance, for a VMM array with 512 wordline inputs, the wordline inputs can be divided into 4 groups, WL0-127, WL128-255, WL256-383, and WL383-511. Each group can be enabled at different times and an output read operation can be performed (converting neuron current into digital bits) for the group corresponding to one of the four groups of word lines, such as by the output integrating circuits in FIGS. 34-36. The output digital bit results are then combined together after each of the four groups are read in sequence. This operation can be controlled by timing control circuit 3670.

In another embodiment, timing control circuit 3670 performs power management in a vector-by-matrix multiplication system, such as analog neuro memory system 3300 in FIG. 33. Timing control circuit 3670 can cause inputs to be applied to VMM sub-systems 3333 sequentially over time, such as by enabling input circuit blocks 3303a, 3303b. 3303c, 3303d, 3303e, 3303f, 3303g, and 3303h at different times. Similarly, timing control circuit 3670 can cause outputs from VMM sub-systems 333 to be read sequentially over time, such as by enabling neuron output blocks 3302a, 3302b. 3302c, 3302d, 3302e, 3302f, 3302g, and 3302h at different times.

Figure 57:
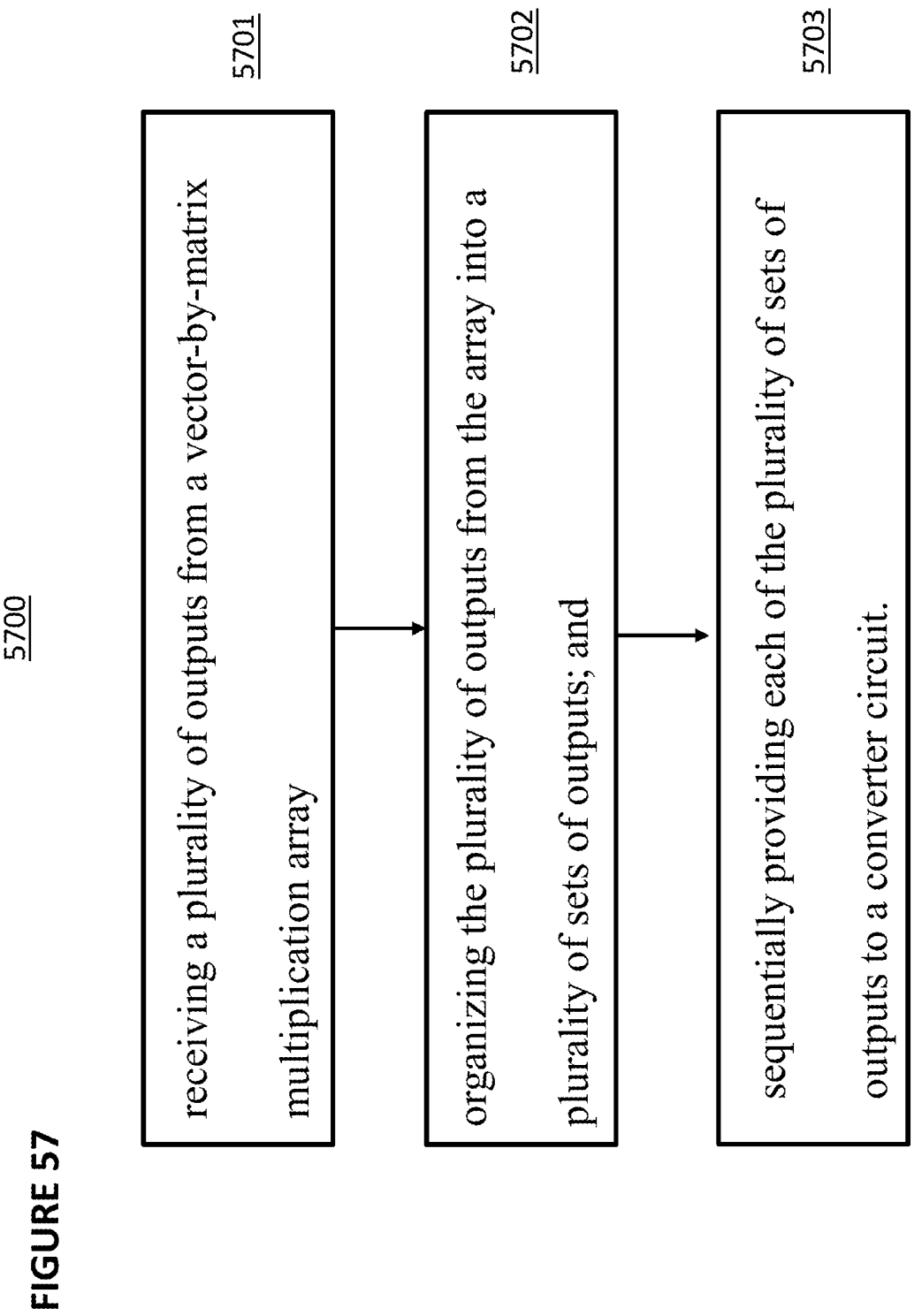
FIG. 57 depicts another power management method.

FIG. 57 depicts power management method 5700. The first step is receiving a plurality of outputs from a vector-by-matrix multiplication array (step S701). The next step is organizing the plurality of outputs from the array into a plurality of sets of outputs (step S702). The next step is sequentially providing each of the plurality of sets of outputs to a converter circuit (step S703).

An embodiment of power management method 5700 is the following. Power management can be implemented by timing control circuit 3670 by sequential reading groups of neuron outputs at different times, that is, by multiplexing the output circuits (such as the output ADC circuits) across multiple neuron outputs (bitlines). The bitlines can be placed into different groups, and the output circuit operates on one group at a time in sequential fashion, under control of timing control circuit 3670.

Figure 58:
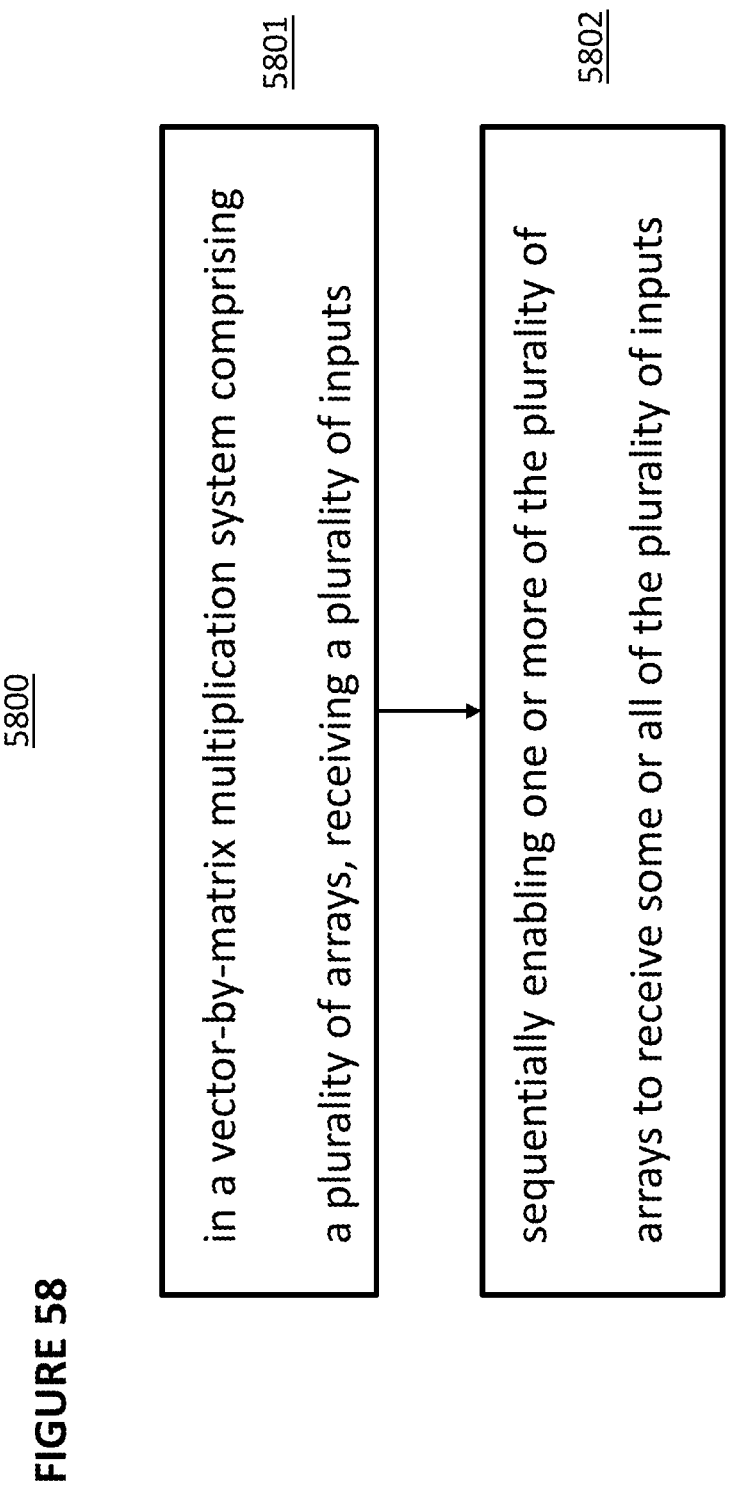
FIG. 58 depicts another power management method.

FIG. 58 depicts power management method 5800. In a vector-by-matrix multiplication system comprising a plurality of arrays, the first step is receiving a plurality of inputs. The next step is sequentially enabling one or more of the plurality of arrays to receive some or all of the plurality of inputs (step S802).

An embodiment of power management method 5800 is the following. Timing control circuit 3670 can operate on one neural network layer at a time. For example, if one neural network layer is represented in a first VMM array and a second neural network layer is represented in a second VMM array, the output read operations (such as where the neuron output is converted into digital bits) can be performed sequentially on one VMM array at a time, thereby managing the power of the VMM system.

In another embodiment, timing control circuit 3670 can operate by enabling sequentially a plurality of the neuro memory sub-systems 3333 or a plurality of macros 3301 as shown in FIG. 33.

In another embodiment, timing control circuit 3670 can operate by enabling sequentially a plurality of the neuro memory sub-systems 3333 or a plurality of macros 3301 as shown in FIG. 33 without discharging the array biases (e.g., biases on wordline WLs and/or bitline BLs for control gate CGs as inputs and bitltine BLs as outputs, or biases on control gates CGs and/or bitline BLs for wordlines WLs as inputs and bitlines BLs as outputs) during the inactive period (meaning time off period between the on and off sequential enabling). This is to save power from unnecessary discharging and charging up again the array biases that are to be used multiple times during one or more read operations (e.g., during inference or classification operations).

FIGS. 37-44 depicts various circuits that can be used in a VMM input block, such as input circuit blocks 3303a, 3303b. 3303c, 3303d, 3303e, 3303f, 3303g, and 3303h in FIG. 33 or neuron output block, such as neuron output blocks 3302a, 3302b. 3302c, 3302d, 3302e, 3302f, 3302g, and 3302h in FIG. 33.

Figure 37:
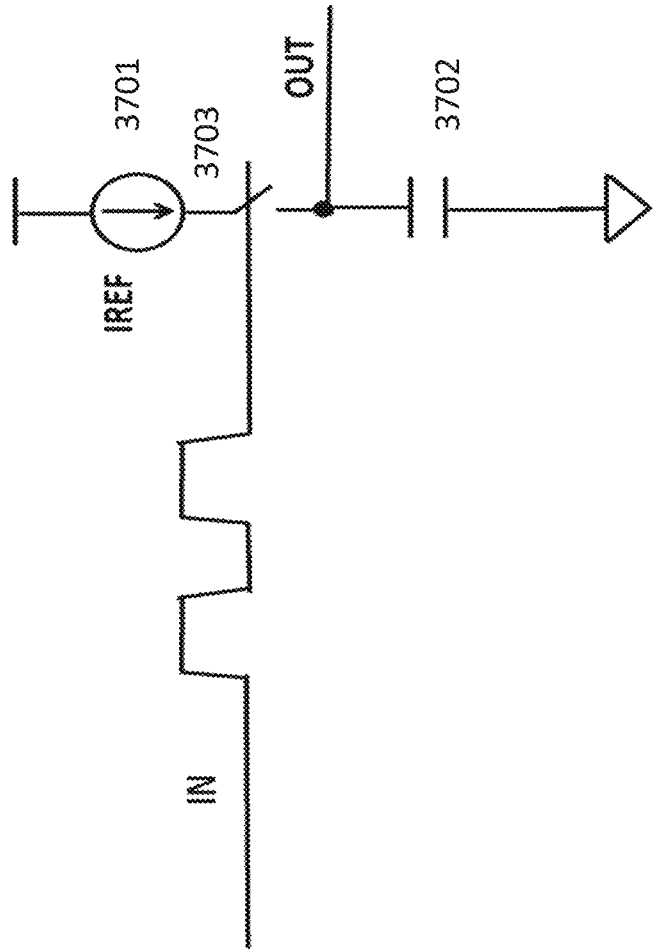
FIG. 37 depicts a pulse-to-voltage converter.

FIG. 37 depicts pulse-to-voltage converter 3700, which optionally can be used to convert the digital pulses generated by integrating dual-slope ADC 3400 or 3500 into a voltage, which, for example, can be applied as an input (for example, on a WL or CG line) of the VMM memory array. Pulse-to-voltage converter 3700 comprises reference current generator 3701 that generates reference current IREF, capacitor 3702, and switch 3703. The input is used to control switch 3703. When a pulse is received on the input, the switch is closed, and charge accumulates on capacitor 3702, such that the voltage of capacitor 3702 after the input signal is complete will be indicative of the number of pulses received. The capacitor optionally can be a wordline or control gate capacitance.

Figure 38:
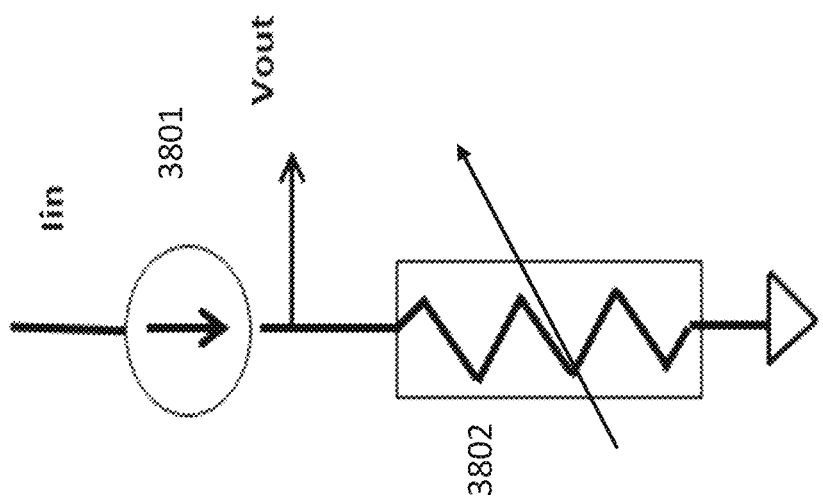
FIG. 38 depicts a current-to-voltage converter.

FIG. 38 depicts current-to-voltage converter 3800, which optionally can be used to convert a neuron output current into a voltage, which, for example, can be applied as an input (for example, on a WL or CG line) of the VMM memory array. Current-to-voltage converter 3800 comprises current generator 3801 that here represents the neuron current received, ineu (or Iin), and variable resistor 3802. The output, Vout, will increase in size as the neuron current increases. Variable resistor 3802 can be adjusted to increase or decrease the maximum range of Vout as desirable.

Figure 39:
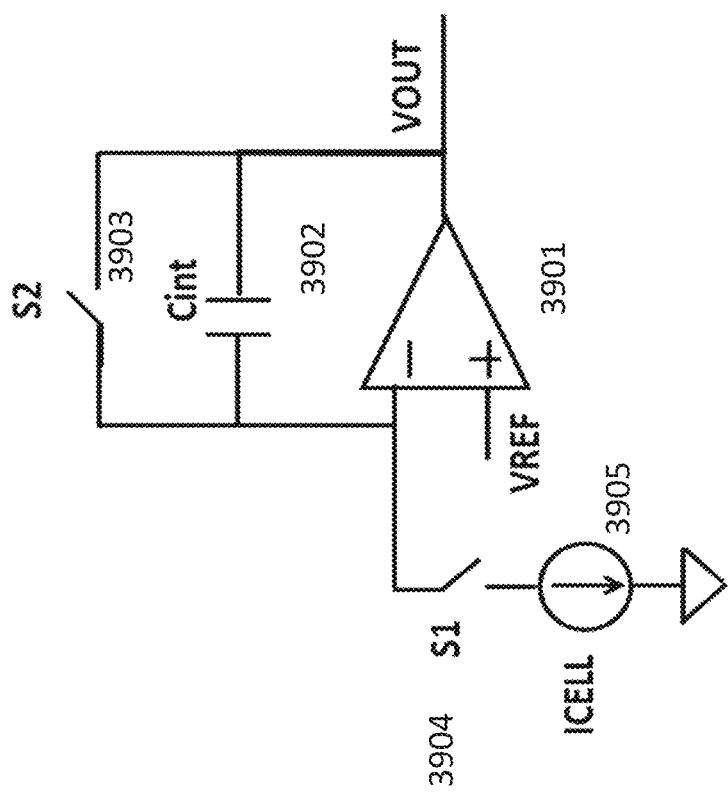
FIG. 39 depicts a current-to-voltage converter.

FIG. 39 depicts current-to-voltage converter 3900, which optionally can be used to convert a neuron output current into a voltage, that for example, can be applied as an input (for example, on a WL or a CG line) of the VMM memory array. Current-to-voltage converter 3900 comprises op amp 3901, capacitor 3902, switch 3903, switch 3904, and current source 3905 that here represents the neuron current ICELL. During operation, switch 3903 will be open, and switch 3904 will be closed. The output, Vout, will increase in amplitude in proportion to the magnitude of the neuron current ICELL 3905.

Figure 40:
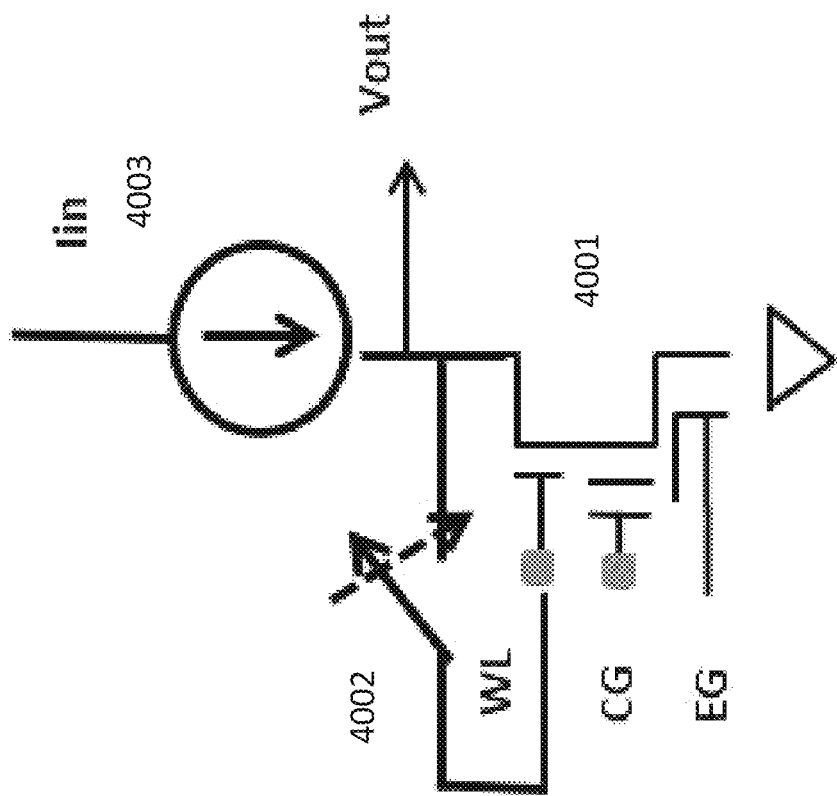
FIG. 40 depicts a current-to-logarithmic voltage converter.

FIG. 40 depicts current-to-logarithmic voltage converter 4000, which optionally can be used to convert a neuron output current into a logarithmic voltage, that for example, can be applied as an input (for example, on a WL or a CG line) of the VMM memory array. Current-to-logarithmic voltage converter 4000 comprises memory cell 4001, switch 4002 (which selectively connects the word line terminal of memory cell 4001 to the node generating Vout), and current source 4003 that here represents the neuron current IiN. During operation, switch 4002 will be closed, and the output, Vout, will increase in amplitude in proportion to the magnitude of the neuron current iIN.

Figure 41:
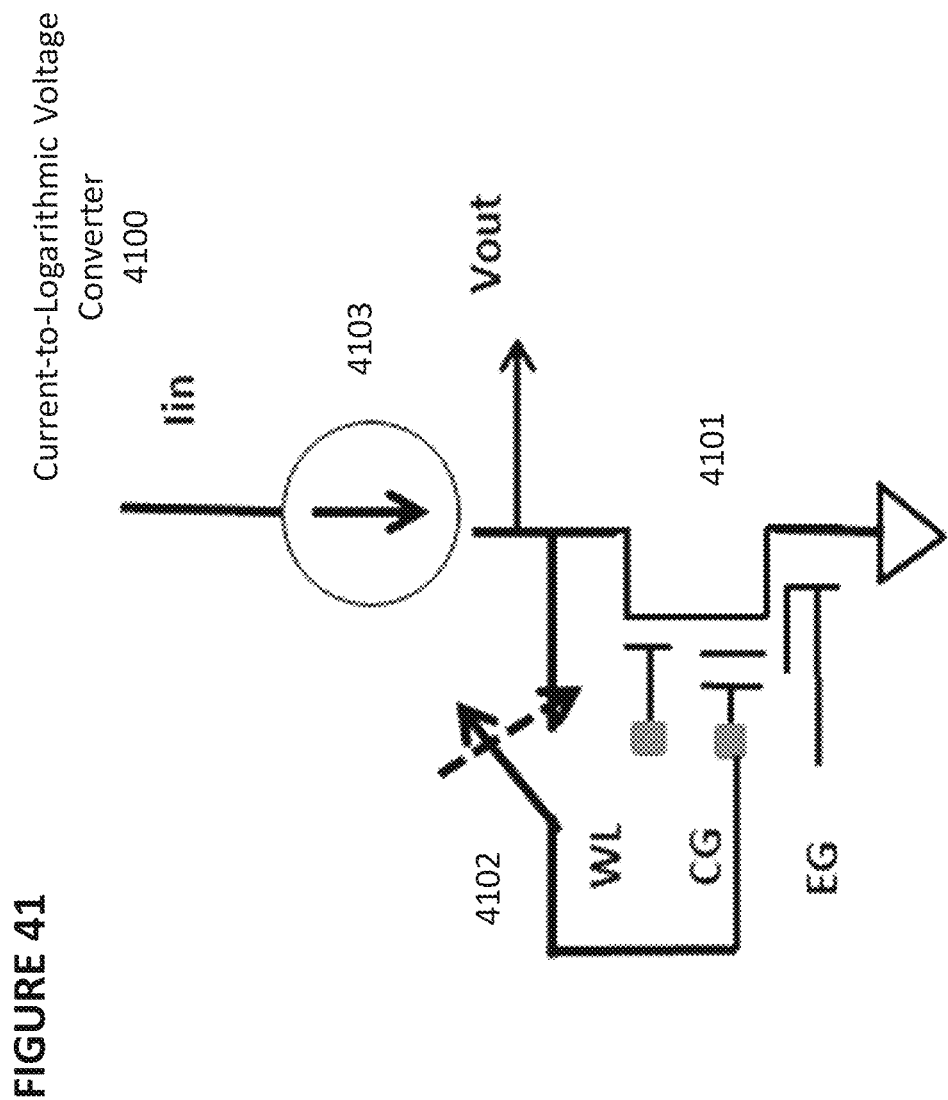
FIG. 41 depicts a current-to-logarithmic voltage converter.

FIG. 41 depicts current-to-logarithmic voltage converter 4100, which optionally can be used to convert a neuron output current into a logarithmic voltage, which, for example, can be applied as an input (for example, on a WL or a CG line) of the VMM memory array. Current-to-logarithmic voltage converter 4100 comprises memory cell 4101, switch 4102 (which selectively connects the control gate terminal of memory cell 4101 to the node generating Vout), and current source 4103 that here represents the neuron current IiN. During operation, switch 4102 will be closed, and the output, Vout, will increase in amplitude in proportion to the magnitude of neuron current IiN.

Figure 42:
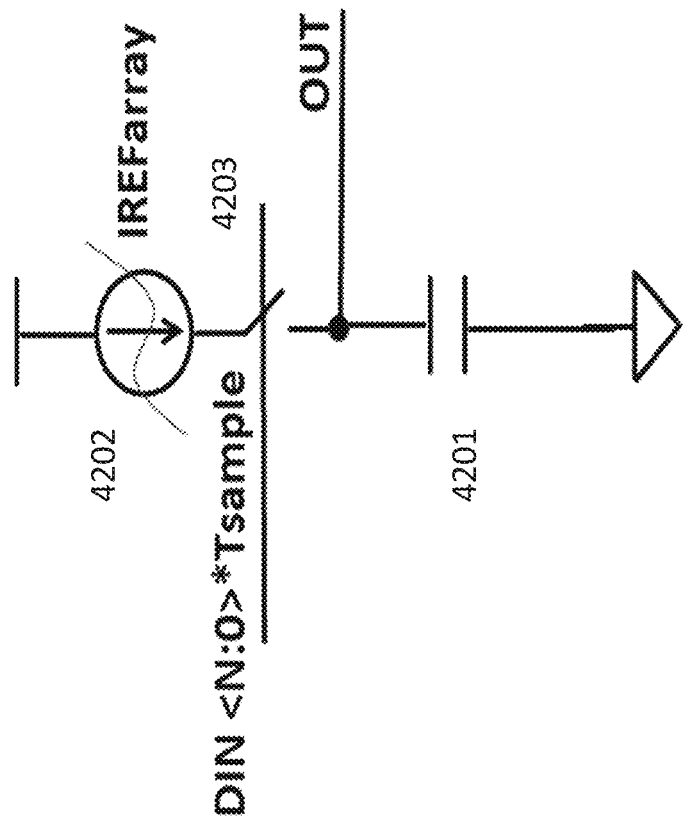
FIG. 42 depicts a digital data to voltage converter.

FIG. 42 depicts digital data to voltage converter 4200, which optionally can be used to convert digital data (i.e., of 0s and 1s) into a voltage, that for example, can be applied as an input (for example, on a WL or CG line) of the VMM memory array. Digital data to voltage converter 4200 comprises capacitor 4201, adjustable current source 4202 (which here is current from a reference array of memory cells), and switch 4203. The digital data controls switch 4203. For example, switch 4203 can close when the digital data is a "1" and open when the digital data is a "0". The voltage accumulated on capacitor 4201 will be the output OUT and will correspond to the value of the digital data. Optionally, the capacitor can be wordline or control gate capacitance.

Figure 43:
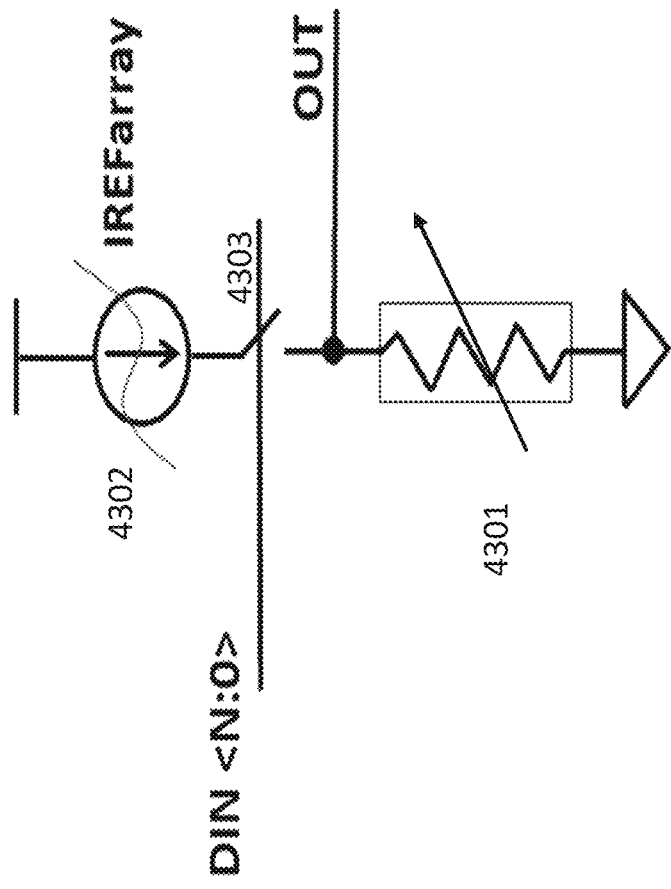
FIG. 43 depicts a digital data to voltage converter.

FIG. 43 depicts digital data to voltage converter 4300, which optionally can be used to convert digital data (i.e., of 0s and 1s) into a voltage, that for example, can be applied as an input (for example, on a WL or CG line) of the VMM memory array. Digital data to voltage converter 4300 comprises variable resistor 4301, adjustable current source 4302 (which here is current from a reference array of memory cells), and switch 4303. The digital data controls switch 4303. For example, switch 4303 can close when the digital data is a "1" and open when the digital data is a "0". The output voltage will correspond to the value of the digital data.

Figure 44:
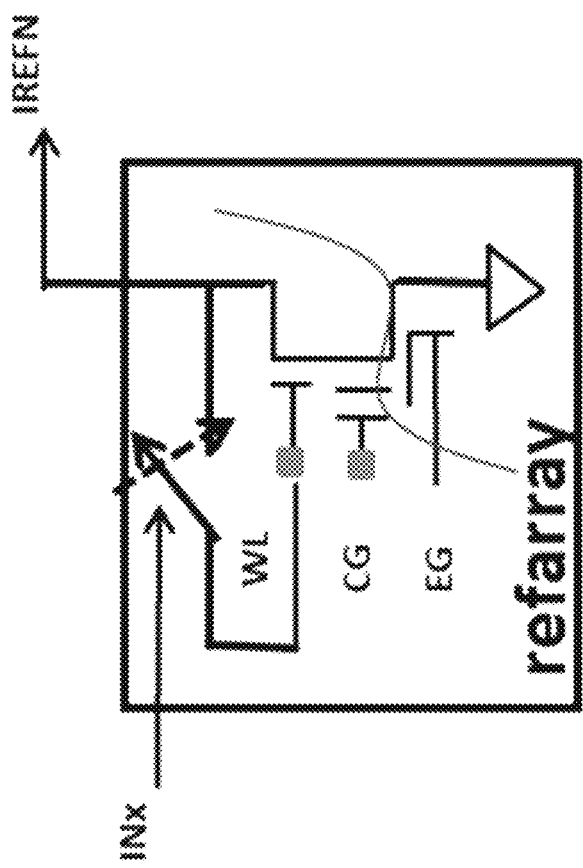
FIG. 44 depicts a reference array.

FIG. 44 depicts reference array 4400 that can be used to provide the reference current of adjustable current sources 4202 and 4302 in FIGS. 42 and 43.

Figure 45:
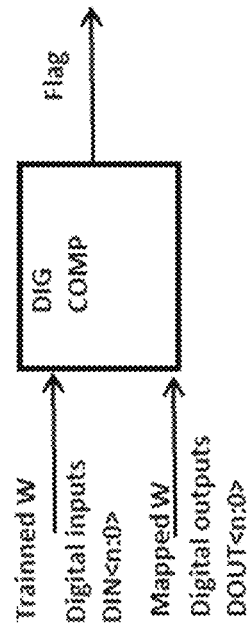
FIG. 45 depicts a digital comparator.
Figure 46:
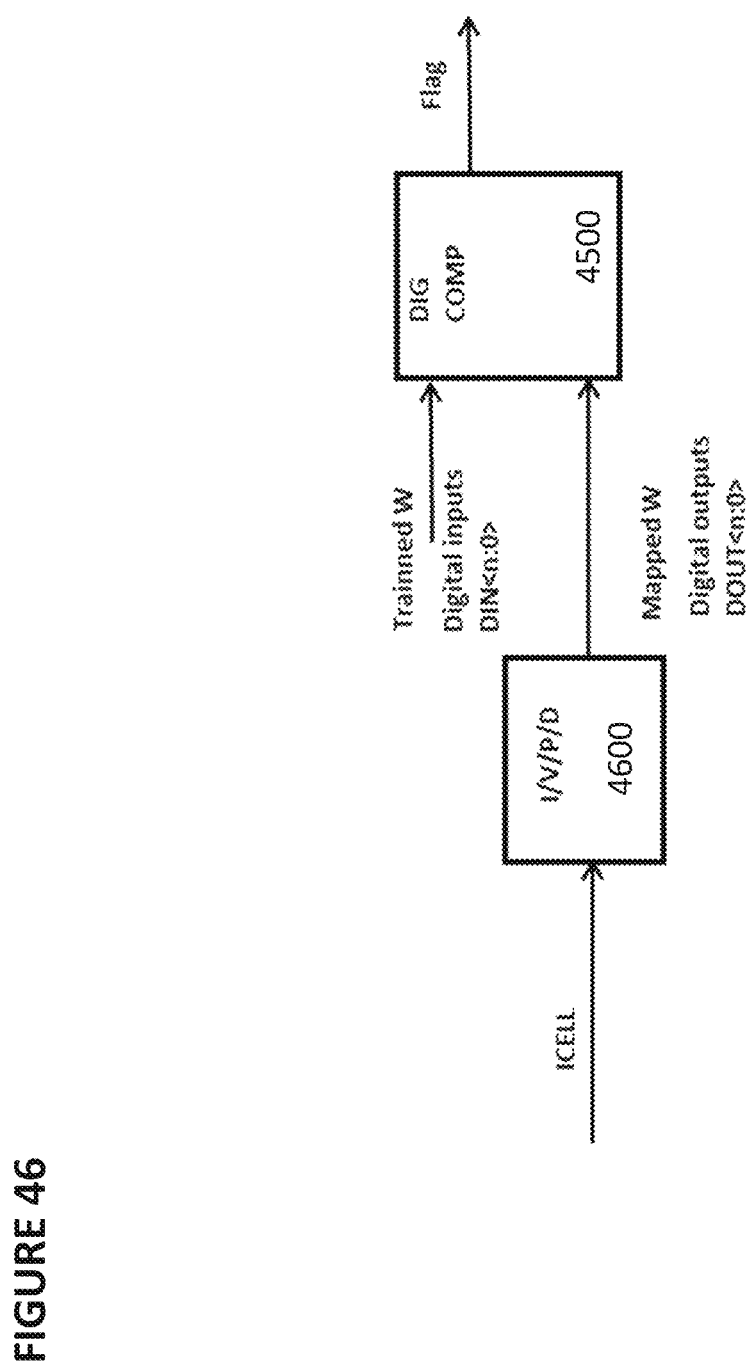
FIG. 46 depicts a converter and digital comparator.
Figure 47:
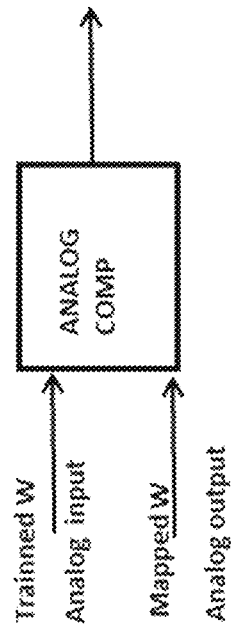
FIG. 47 depicts an analog comparator.

FIGS. 45-47 depicts components for verifying, after a programming operation, that a flash memory cell in a VMM contains the appropriate charge corresponding to the W value that is intended to be stored in that flash memory cell.

FIG. 45 depicts digital comparator 4500, which receives a reference set of W values as digital inputs and the sensed W digital values from a number of programmed flash memory cells. Digital comparator 4500 generates a flag if there is a mismatch, which would indicate that one or more flash memory cells has not been programmed with the correct value.

FIG. 46 depicts digital comparator 4500 from FIG. 45 in cooperation with a converter 4600. The sensed W values are provided by multiple instantiations of converter 4600. Converter 4600 receives a cell current, ICELL, from a flash memory cell and converts the cell current into digital data that can be provided to digital comparator 4500 using one or more of the converters described previously, such as ADC 3400 or 3500).

FIG. 47 depicts analog comparator 4700, which receives a reference set of W values as analog inputs and the sensed W analog values from a number of programmed flash memory cells. Analog comparator 4700 generates a flag if there is a mismatch, which would indicate that one or more flash memory cells has not been programmed with the correct value.

Figure 48:
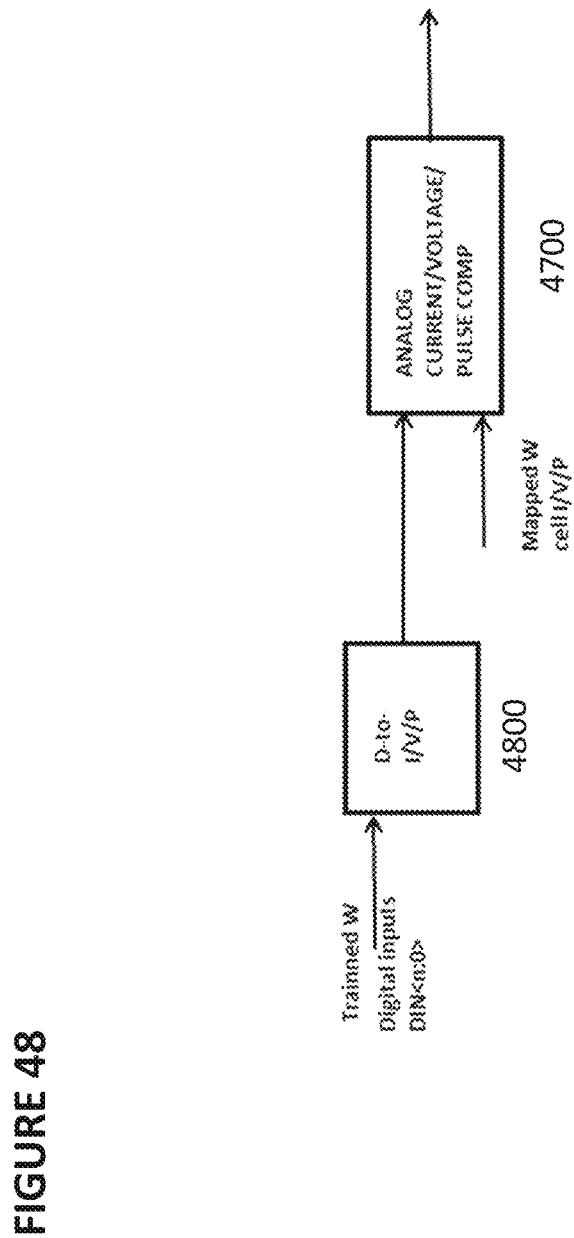
FIG. 48 depicts a converter and analog comparator.

FIG. 48 depicts analog comparator 4700 from FIG. 47 in cooperation with a converter 4800. The sensed W values are provided by converter 4800. Converter 4800 receives digital values of sensed W values and converts them into an analog signal that can be provided to analog comparator 4700 using one or more of the converters described previously (such as pulse-to-voltage converter 3700, digital data to voltage converter 4200, or digital data to voltage converter 4300).

Figure 49:
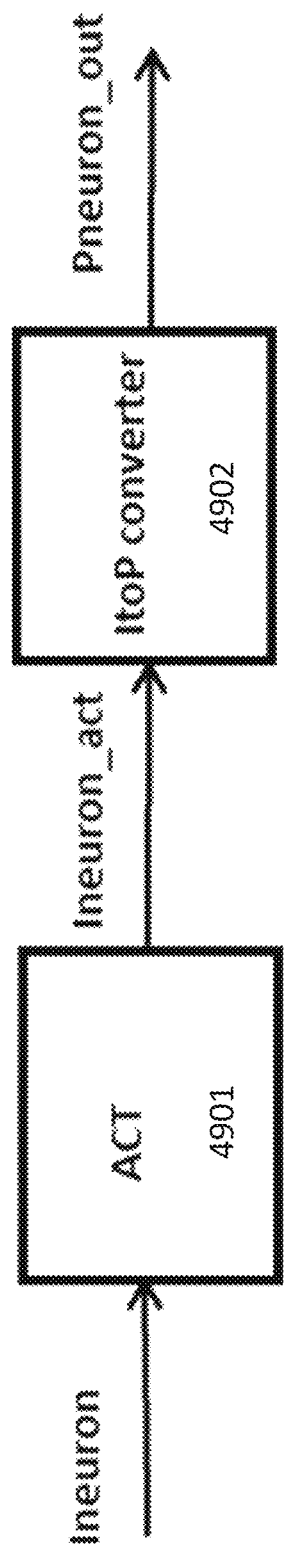
FIG. 49 depicts an output circuit.

FIG. 49 depicts output circuit 4900. It can be appreciated that if the output of a neuron is digitized (such as by using integrating dual-slope ADC 3400 or 3500, described previously), then one still may need to perform an activation function to the neuron output. FIG. 49 depicts an embodiment where activation occurs before the neuron output is converted into a pulse of variable width or a pulse series. Output circuit 4900 comprises activation circuit 4901 and current-to-pulse converter 4902. Activation circuit receives Ineuron values from various flash memory cells and generates Ineuron_act, which is a summation of the received Ineuron values. Current-to-pulse converter 4902 then converts Ineuron_act into a series of digital pulses and/or digital data that represents a count of a series of digital pulses. Other converters described previously (such integrating dual-slope ADC 3400 or 3500) can be used instead of the 4902 converter.

Figure 50:
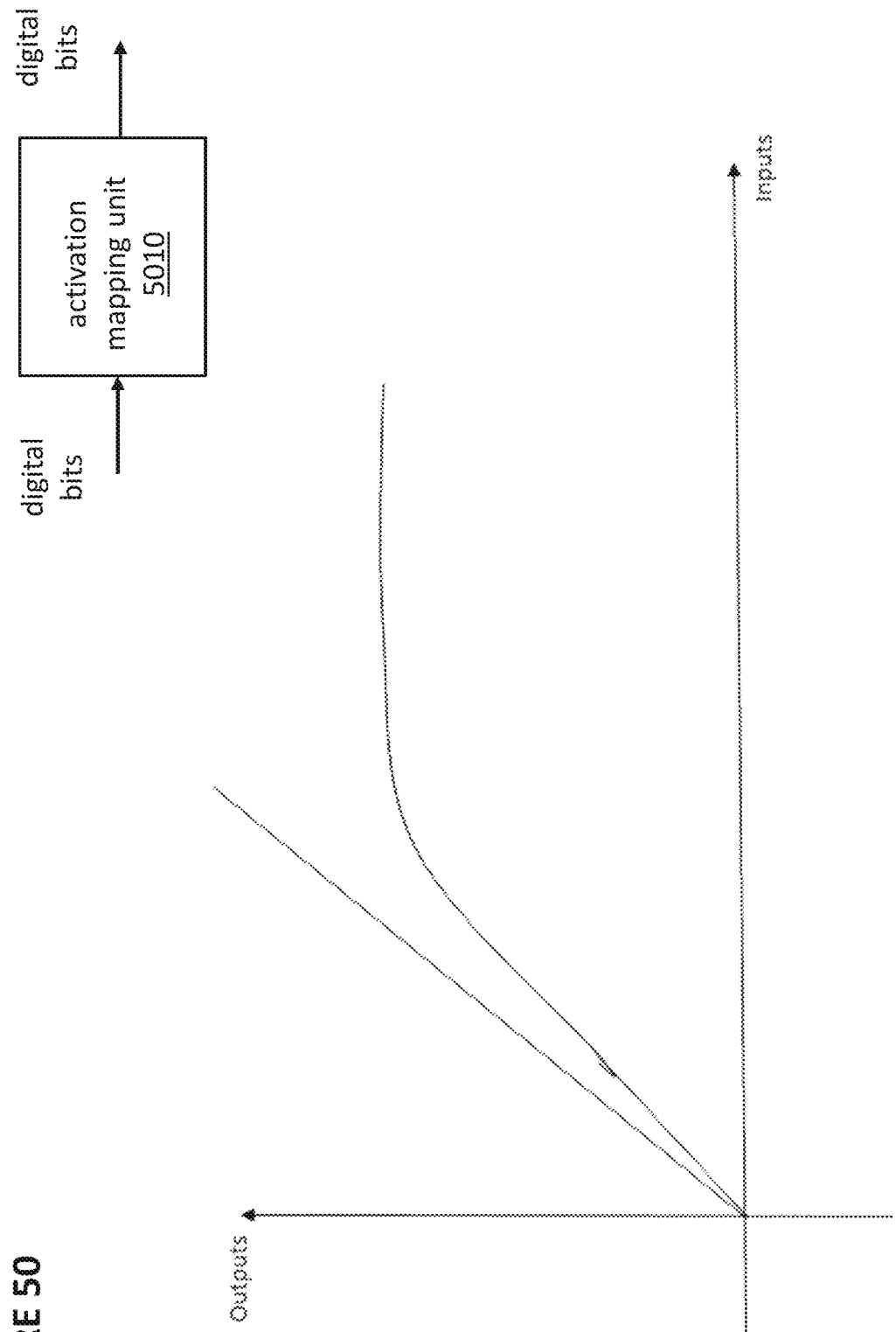
FIG. 50 depicts an aspect of an output that is activated after digitization.
Figure 51:
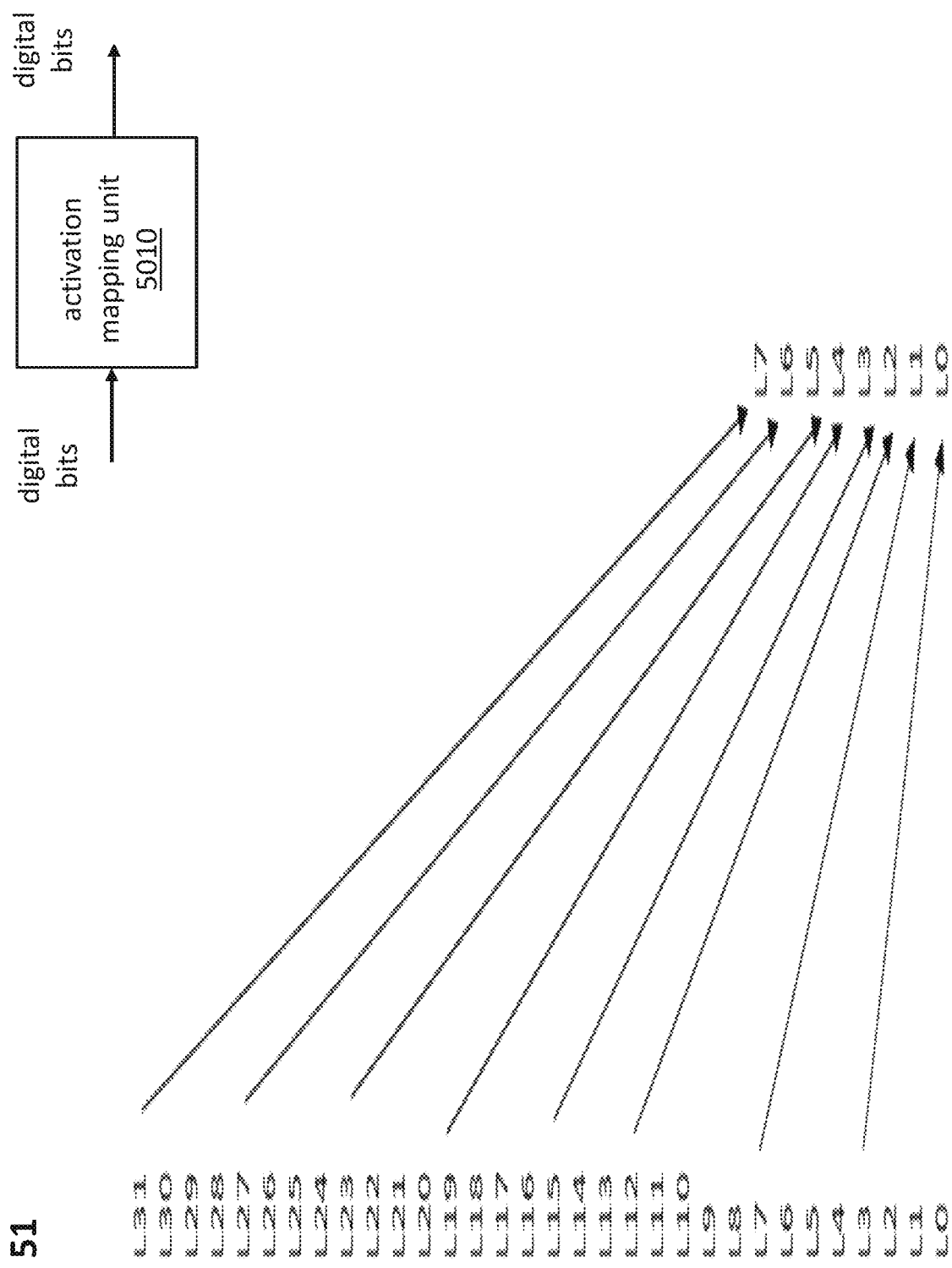
FIG. 51 depicts an aspect of an output that is activated after digitization.

In another embodiment, the activation can occur after the digital pulses are generated. In that embodiment, the digital output bits are mapped to a new set of digital bits using an activation mapping table or function implemented by activation mapping unit 5010. Examples of such a mapping are shown graphically in FIGS. 50 and 51. The activation digital mapping can simulate the sigmoid, tanh, ReLu, or any activation function. Further, the activation digital mapping can quantize the output neuron.

Figure 52:
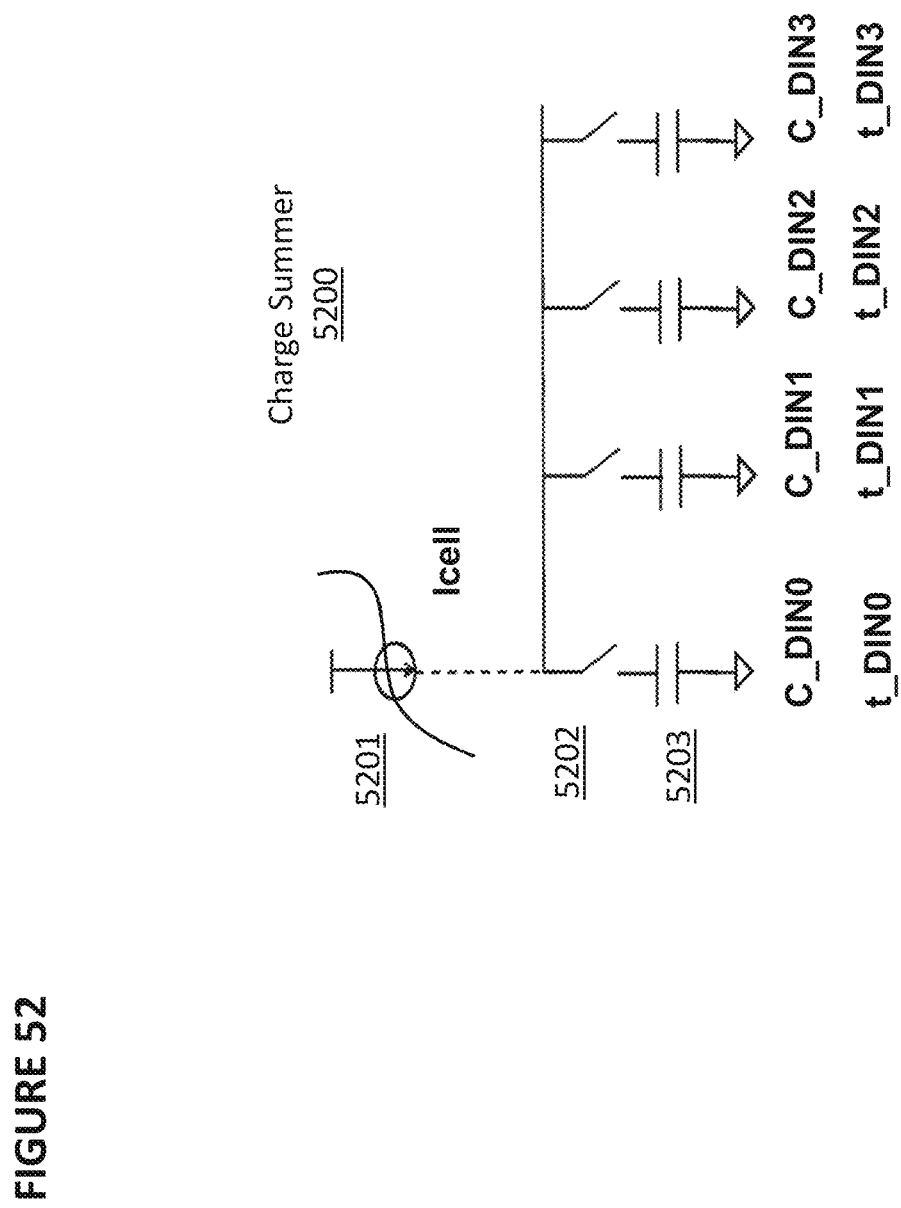
FIG. 52 depicts a charge summer circuit.

FIG. 52 depicts an example of charge summer 5200 that can be used to sum the output of a VMM during a verifying operation after a programming operation, to obtain a single analog value that represents the output, and that can optionally be then converted into digital bit values. Charge summer 5200 comprises current source 5201 and a sample-and-hold circuit comprising switch 5202 and sample-and-hold (S/H) capacitor 5203. As shown for an example of a 4-bit digital value, there are 4 S/H circuits to hold the value from 4 evaluation pulses, where the values are summed up at the end of the process. S/H capacitors 5203 are selected with ratios that are associated with the 2^n*DINn bit position for that S/H capacitor; for example C_DIN3=x8 Cu, C_DIN2=x4 Cu, C_DIN1=x2 Cu, DIN0=x1 Cu. The current source 5201 is also ratioed accordingly.

Figure 53:
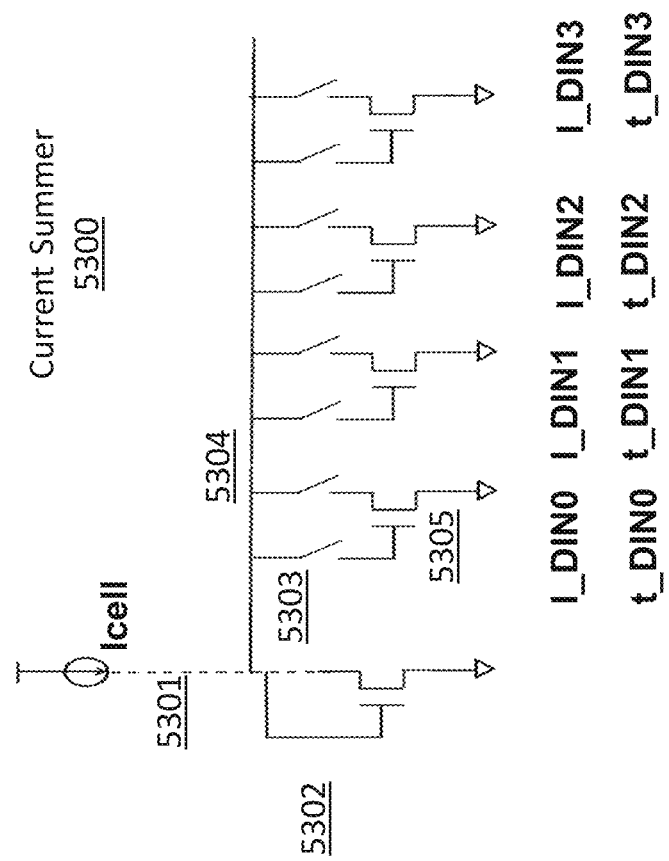
FIG. 53 depicts a current summer circuit.

FIG. 53 depicts current summer 5300 that can be used to sum the output of a VMM during a verifying operation after a programming operation. Current summer 5300 comprises current source 5301, switch 5302, switches 5303 and 5304, and switch 5305. As shown for an example of a 4-bit digital value, there are current source circuits to hold the value from 4 evaluation pulses, where the values are summed up at the end of the process. The current source is ratioed based on the 2^n*DINn bit position; for example, I_DIN3=x8 Icell unit, I_DIN2=x4 Icell unit, I_DIN1=x2 Icell unit, I_DIN0=x1 Icell unit.

Figure 54:
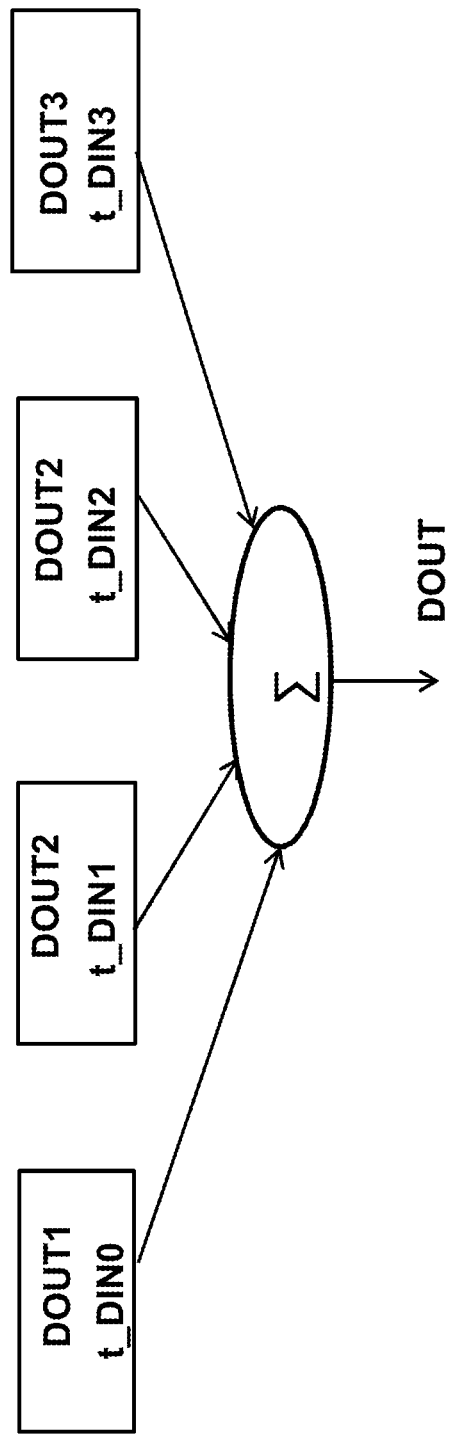
FIG. 54 depicts a digital summer circuit.

FIG. 54 depicts digital summer 5400, which receives a plurality of digital values, sums them together and generates an output DOUT representing the sum of the inputs. Digital summer 5400 can be used during a verifying operation after a programming operation. As shown for an example of a 4-bit digital value, there are digital output bits to hold the value from 4 evaluation pulses, where the values are summed up at the end of the process. The digital outputs are digitally scaled based on the 2^n*DINn bit position; for example, DOUT3=x8 DOUT0, I_DOUT2=x4 DOUT1, I_DOUT1=x2 DOUT0, I_DOUT0=DOUT0.

Figure 55A:
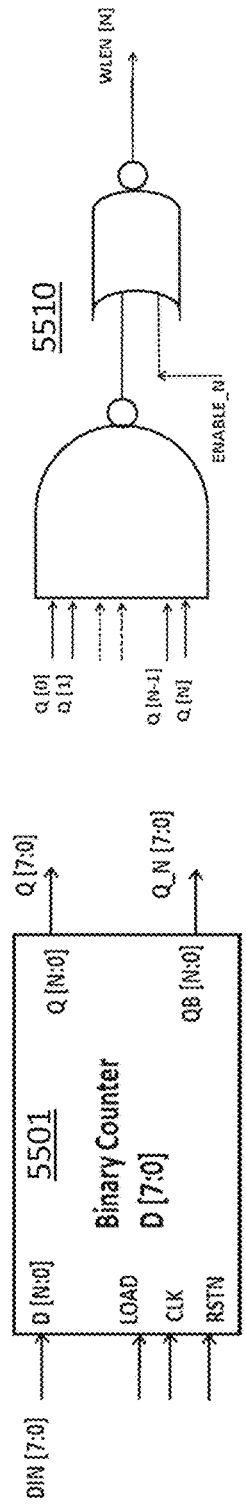
FIGS. 55A and 55B depict a digital bit-to-pulse row converter and waveform, respectively.
Figure 55B:
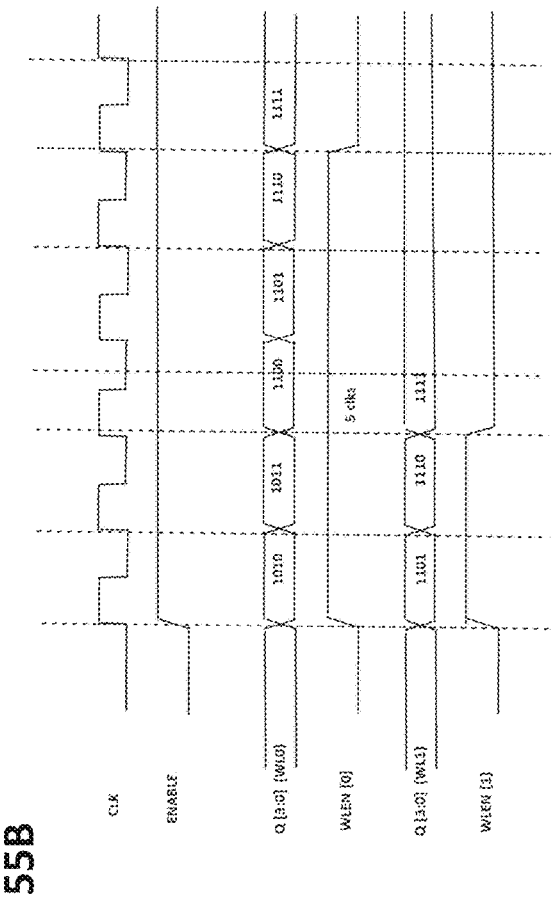

FIGS. 55A and 55B depict digital bits-to-pulse width converter 5500 to be used within an input block, row decoder, or output block. The pulse width output from digital bits-to-pulse width converter 5500 is proportional to its value as described above in relation to FIG. 36B. Digital bits-to-pulse width converter comprises binary counter 5501. The state Q [N:0] of binary counter 5501 can be loaded by serial or parallel data in a loading sequence. Row control logic 5510 outputs a voltage pulse with a pulse-width that is proportional to the value of the digital data inputs provided from blocks such as integrating ADC in FIGS. 34 and 35.

FIG. 55B shows the waveform for the output pulse width which has the width proportional to its digital bit values. First, the data in the received digital bits is inverted, and the inverted digit bits are loaded either serially or in parallel into counter 5501. Then the row pulse-width is generated by the row control logic 5510 as shown in the waveform 5520 by counting in a binary manner until it reaches the maximum counter value.

Optionally, a pulse series-to-pulse converter can be used to convert the output comprising a pulse series (such as signals 3411 or 3413 in FIG. 34B and signals 3513 or 3516 in FIG. 35B into a single pulse whose width varies in proportion to the number of pulses in the pulse series (such as signals WL0, WL1, and WLe in FIG. 36B) to be used as an input to a VMM array that will be applied to wordline or control gates within the VMM array. An example of a pulse series-to-pulse converter is a binary counter with control logic.

An example is as shown in the Table 9 for 4-bit digital inputs:

TABLE NO. 9

Digital Input Bits to Output Pulse Width

| DIN <3:0> | counts | inverted DIN<3:0> loaded into the counter | output pulse width = # clks |
|---|---|---|---|
| 0000 | 0 | 1111 | 0 |
| 0001 | 1 | 1110 | 1 |
| 0010 | 2 | 1101 | 2 |
| 0011 | 3 | 1100 | 3 |
| 0100 | 4 | 1011 | 4 |
| 0101 | 5 | 1010 | 5 |
| 0110 | 6 | 1001 | 6 |
| 0111 | 7 | 1000 | 7 |
| 1000 | 8 | 0111 | 8 |
| 1001 | 9 | 0110 | 9 |
| 1010 | 10 | 0101 | 10 |
| 1011 | 11 | 0100 | 11 |
| 1100 | 12 | 0011 | 12 |
| 1101 | 13 | 0010 | 13 |
| 1110 | 14 | 0001 | 14 |
| 1111 | 15 | 0000 | 15 |

Another embodiment is using a up binary counter and a digital comparison logic. Namely the output pulse width is generated by counting a up binary counter until the digital outputs of the binary counter is same as the digital input bits.

Another embodiment is using a down binary counter. First the down binary counter is loaded serially or in parallel with the digital data input pattern. Then the output pulse width is generated by counting down the down binary counter until the digital outputs of the binary counter reaches minimum value, namely '0' logic state.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of performing power management in vector-by- matrix multiplication system comprising an array of non-volatile memory cells arranged into rows and columns, an input circuit, and an output integrating circuit, the method comprising:
   receiving, by the input circuit, a plurality of inputs during a read operation;
   organizing, by the input circuit, the plurality of inputs into a first set of inputs and a second set of inputs;

applying the first set of inputs, by the input circuit, to a first set of rows in the array to generate a first set of outputs;

applying the second set of inputs, by the input circuit, to a second set of rows in the array to generate a second set of outputs; and combining, by the output integrating circuit, the first set of outputs and the second set of outputs to generate an output for the read operation.

2. The method of claim 1, wherein the first set of inputs is applied to word lines of the first set of rows and the second set of inputs is applied to word lines of the second set of rows.

3. The method of claim 1, wherein the first set of inputs is applied to control gate lines of the first set of rows and the second set of inputs is applied to control gate lines of the second set of rows.

4. The method of claim 1, wherein each of the plurality of inputs comprises one or more pulses.

5. The method of claim 1, wherein the array comprises groups of neurons.

6. The method of claim 1, wherein the non-volatile memory cells are split-gate flash memory cells.

7. The method of claim 1, wherein the non-volatile memory cells are stacked-gate flash memory cells.

8. A method of performing power management in a vector-by-matrix multiplication system comprising a first array and a second array coupled to a timing control circuit and an input circuit, each of the first array and the second array comprising non- volatile memory cells arranged into rows and columns, the method comprising:

receiving, by the input circuit, a plurality of inputs;

sequentially enabling, by the timing control circuit, the first array to receive a first set of the plurality of inputs from the input circuit during a first read operation and the second array to receive a second set of the plurality of inputs from the input circuit during a second read operation.

9. The method of claim 8, wherein the vector-by-matrix multiplication system further comprises output circuits to process a plurality of outputs from the first array and the second array.

10. The method of claim 9, wherein the output circuits comprise analog- to-digital converters.

11. The method of claim 8, wherein the input circuit comprises digital bits to pulse converters.

12. The method of claim 8, wherein the input circuit comprises digital-to-analog converters.

13. The method of claim 8, wherein the first array and the second array do not discharge array bias voltages when not enabled.

* * * * *